United States Patent [19]
Nakahata et al.

[11] Patent Number: 5,838,090
[45] Date of Patent: Nov. 17, 1998

[54] SURFACE ACOUSTIC WAVE DEVICE

[75] Inventors: Hideaki Nakahata; Kenjiro Higaki; Satoshi Fujii; Hiroyuki Kitabayashi; Shin-ichi Shikata, all of Itami, Japan

[73] Assignee: Sumitomo Electric Industries, ltd., Japan

[21] Appl. No.: 972,162

[22] Filed: Nov. 17, 1997

Related U.S. Application Data

[63] Continuation of Ser. No. 581,972, Jan. 2, 1996, abandoned.

[30] Foreign Application Priority Data

Feb. 9, 1995 [JP] Japan .................................. 7-021598

[51] Int. Cl.$^6$ .................................................. H03H 9/00
[52] U.S. Cl. .......................................................... 310/313 A
[58] Field of Search ........................................ 310/313 A

[56] References Cited

U.S. PATENT DOCUMENTS

| | | | |
|---|---|---|---|
| 4,037,176 | 7/1977 | Ono et al. | 310/313 A |
| 4,501,987 | 2/1985 | Mitsuya et al. | 310/313 A |
| 5,446,329 | 8/1995 | Nakahata et al. | 310/313 A |
| 5,576,589 | 11/1996 | Dreifus et al. | 310/313 A |

FOREIGN PATENT DOCUMENTS

| | | | |
|---|---|---|---|
| 588 261 | 3/1994 | European Pat. Off. | H03H 9/02 |
| 4341005 | 11/1992 | Japan | 310/313 A |

*Primary Examiner*—Thomas M. Dougherty
*Attorney, Agent, or Firm*—Pennie & Edmonds LLP

[57] ABSTRACT

An object of the present invention is to improve an SAW propagation velocity V, an electromechanical coupling coefficient ($K^2$), and a delay time temperature coefficient (TCD) to achieve a high-frequency SAW device and power saving and size reduction of the device. An SAW device according to the present invention includes at least diamond as a substrate material, a c-axis oriented polycrystalline $LiNbO_3$ layer, arranged on the diamond, an $SiO_2$ layer arranged on the $LiNbO_3$ layer, and an interdigital transducer and uses an SAW in an nth mode (n=0, 1, 2: wavelength: $\lambda$ $\mu$m). When the thickness of the $LiNbO_3$ layer is $t_1$ ($\mu$m), and the thickness of the $SiO_2$ layer is $t_2$ ($\mu$m), $kh_1 = 2\pi(t_1/\lambda)$ and $kh_2 = 2\pi(t_2/\lambda)$ fall within predetermined ranges. In addition, the mode of the SAW is selected. With this arrangement, an SAW device having a propagation velocity (V) of 7,000 m/s or more, an electromechanical coupling coefficient ($K^2$) of 2% or more, and a coefficient TCD of ±10 ppm/°C. or less, which is the stability of the device frequency with respect to the temperature, can be provided.

21 Claims, 59 Drawing Sheets

(LAYER STRUCTURE I)

(LAYER STRUCTURE 1)

(LAYER STRUCTURE 2)

ELECTRODE ARRANGEMENT A

ELECTRODE ARRANGEMENT B

ELECTRODE ARRANGEMENT C

ELECTRODE ARRANGEMENT D

ELECTRODE ARRANGEMENT E

ELECTRODE ARRANGEMENT F

ELECTRODE ARRANGEMENT G

US 5,838,090

SURFACE ACOUSTIC WAVE DEVICE

This is a continuation, of application Ser. No. 08/581,972, filed Jan. 2, 1996, now abandoned.

BACKGROUND OF THE INVENTION

1. Field of the Invention

The present invention relates to a surface acoustic wave device which improves the propagation velocity (V), the electropmechanical coupling coefficient ($K^2$), and delay time temperature coefficient (TCD) of a surface acoustic wave.

2. Related Background Art

Surface acoustic wave devices using a surface acoustic wave (to be referred to as an "SAW" hereinafter) propagating on a solid surface are popularly used as frequency filters, resonators, delay devices, signal processing devices, convolvers, optoelectronic function devices, or the like. The SAW devices also have various characteristic features such as a relatively good temperature stability, a long service life, and excellent phase characteristics. For this reason, along with a recent tendency in multichannel or higher-frequency arrangements in a communication field including satellite communication and mobile communication, the development of devices usable in a higher frequency band (e.g., GHz band) has been desired.

An SAW is normally excited by applying an AC field to a piezoelectric element through an interdigital transducer. As a piezoelectric material, a bulk single crystal such as $LiNbO_3$ and $LiTaO_3$ or a thin ZnO film formed on a substrate by vapor deposition is used.

An operating frequency f of an SAW device is generally determined by f=V/λ (V is the propagation velocity of an SAW, λ is the wavelength of the SAW). Therefore, to raise the operating frequency, the wavelength λ must be decreased, or the propagation velocity V must be increased.

As will be described later, the wavelength λ depends on the period of an interdigital transducer shown in FIG. 1 or 2. In the interdigital transducer shown in FIG. 1, a pair of electrodes with electrode segments each having a width d and integrally formed at an interval 3d are arranged to oppose each other. Electrodes at two polarities are alternately arranged, i.e., adjacent electrodes are at different polarities. This is the most popular interdigital transducer. In this case, the wavelength λ is 4d. As for the interdigital transducer shown in FIG. 2, pairs of electrode segments each having the width d and the interval d therebetween are arranged at an interval corresponding to 5d. In this case, the wavelength λ is 8d. In this case, the width d depends on the limitation of micropatterning technique. The period size of an interdigital transducer formed in such a device has a lower limit. Therefore, it is difficult to excessively decrease the wavelength λ of an SAW. With the conventional photolithography technique, the wavelength λ is about 1 μm. Patterning on the submicron order is enabled using the electron beam exposure technique. However, as the line width becomes smaller, the yield decreases. That is, the wavelength λ cannot be largely decreased because of the limitation of patterning technique.

To raise the operating frequency f of an SAW device, the propagation velocity V must be increased. However, the propagation velocity V is limited by material characteristics. Therefore, a material whose propagation velocity V is high is preferably used. More specifically, the value of propagation velocity V depends on a piezoelectric material or a substrate material on which a piezoelectric material is arranged. When a thin piezoelectric film deposited on a substrate consisting of appropriate one of the above materials is applied to an SAW, and the sound velocity of the substrate material is higher than that of the piezoelectric material, a plurality of SAWs with different propagation velocities V are excited (0th mode, 1st mode, 2nd mode, . . . in an order from a low propagation velocity V). In this case, the propagation velocity V also depends on the mode of the SAW.

The propagation velocity of an SAW has a nature different from the sound velocity of the above substrate material. However, when a thin piezoelectric film is formed on the substrate, an SAW propagating on the piezoelectric film is largely influenced by the elasticity of the substrate. For this reason, when the sound velocity of the substrate material is high, the propagation velocity of the SAW also increases. Therefore, a substance with a high sound velocity is used as a substrate material. For example, by using sapphire or diamond (which has the highest sound velocity of all substances, velocity of transverse wave =13,000 m/s, velocity of longitudinal wave =16,000 m/s) is used as a substrate material, the propagation velocity V of about 10,000 m/s can be realized.

In the communication field including satellite communication and mobile communication, further power saving and size reduction of an entire device are required mainly from the viewpoint of mounting of an SAW device. Therefore, in addition to the above-described higher frequency, an improvement in an electromechanical coupling coefficient ($K^2$) serving as an index of conversion efficiency from an electrical energy to a mechanical energy is required.

The dependence of the velocity or delay time of an SAW on the temperature is a factor to which special attention should be given in designing a device meeting the object. For this reason, the delay time temperature coefficient is regarded as an important parameter for evaluating an SAW material. The conventional $LiNbO_3$ crystal and the like have either characteristic problem, and consideration for solving this problem has been made.

From the above viewpoint, an SAW device having a multilayered structure is known in which diamond is used as a substrate material, and an $LiNbO_3$ layer is formed thereon (Japanese Patent Laid-Open Nos. 6-210113 and 6-115538). More specifically, in an SAW device having a diamond/$LiNbO_3$-layer structure with an appropriate interdigital transducer, an improvement in propagation velocity V and coefficient $K^2$ has been examined by combining the thickness of the c-axis oriented polycrystalline $LiNbO_3$ layer with the mode of an excited SAW within a specific range.

To increase the stability of device frequency with respect to the temperature, an examination has been made to achieve an object of, e.g., decreasing the coefficient TCD, in which an SiO layer is further formed on the diamond/$LiNbO_3$-layer structure (Japanese Patent Laid-Open No. 6-115538).

SUMMARY OF THE INVENTION

It is an object of the present invention to provide an SAW device which increases the propagation velocity V and the electro-mechanical coupling coefficient ($K^2$) of an SAW, as described above, and also increases the stability of device frequency with respect to the temperature (TCD).

More specifically, in order to achieve the above object of the present invention, there is provided an SAW device meeting a recent requirement for an SAW device which should be widely and preferably used, which has an SAW propagation velocity (V) of 7,000 m/s or more, an electromechanical coupling coefficient ($K^2$) of 2% or more, and stability of device frequency with respect to the temperature, i.e., a coefficient TCD of ±10 ppm/°C. or less.

As a result of extensive studies, the present inventors found the following facts. In an SAW device with a basic device structure (FIG. 3A) having diamond as a substrate material of the SAW device, and a c-axis oriented polycrystalline $LiNbO_3$ layer and an $SiO_2$ layer formed thereon, an appropriate interdigital transducer and, as needed, an appropriate short-circuit B electrode are arranged at appropriate positions. In such an SAW device, the above object can be achieved by designating the thicknesses of the $LiNbO_3$ and $SiO_2$ layers and an appropriate mode of an excited SAW.

In an SAW device with a structure (FIG. 3B) in which the diamond substrate material is formed on an appropriate substrate material (e.g., a silicon wafer) as well, the above object can be achieved by designating the thicknesses of the $LiNbO_3$ and $SiO_2$ layers and an appropriate mode of an excited SAW.

In the present invention, the actual thicknesses of the diamond substrate material layer and the $LiNbO_3$ layer are represented as follows. That is, on the basis of the findings of the present inventors such that the ratio of an SAW to a wavelength influences the propagation velocity, the electromechanical coupling coefficient, and the like, the thickness of the $LiNbO_3$ layer is represented not as an actual thickness $t_1$ (μm) but as a nondimensional parameter $kh_1 = 2\pi(t_1/\lambda)$ as a conversion result. In addition, the thickness of the $SiO_2$ layer is represented not as an actual thickness $t_2$ (μm) but as a nondimensional parameter $kh_2 = 2\pi(t_2/\lambda)$ as a conversion result. Conditions are classified on the basis of these parameters.

FIGS. 4 to 10 are sectional views of SAW devices according to the present invention. For the descriptive convenience, these structures are referred to as electrode arrangements A to G. In each of these structures, a silicon substrate or the like may be arranged under the diamond substrate material to, e.g., increase the strength of the device (FIG. 3B) because such an arrangement does not substantially influence the present invention. Therefore, the following description includes a structure with an appropriate substrate arranged under the diamond substrate material.

FIG. 4 is a sectional view of the electrode arrangement A. This SAW device includes at least diamond 1, a c-axis oriented polycrystalline $LiNbO_3$ layer 2 arranged on the diamond, an interdigital transducer 4 arranged on the $LiNbO_3$ layer, and an $SiO_2$ layer 3 arranged on the interdigital transducer. When the thickness of the $LiNbO_3$ layer is represented as $t_1$ (μm), the parameter $kh_1 = 2\pi(t_1/\lambda)$ is within a range of $0.25 \leq kh_1 \leq 1.0$. When the thickness of the $SiO_2$ layer is represented as $t_2$ (μm), the parameter $kh_2 = 2\pi(t_2/\lambda)$ is within a range of $0.1 \leq kh_2 \leq 0.8$. In addition, an SAW (wavelength: λ μm) in the 0th, 1st, or 2nd mode is appropriately used.

More specifically, SAW devices of the following types (1) to (7) are obtained.

(1) An SAW device which uses a 0th mode of an SAW excited with a structure satisfying conditions such that $kh_1 = 2\pi(t_1/\lambda)$ is within a range of $0.25 \leq kh_1 \leq 0.45$, and $kh_2 = 2\pi(t_2/\lambda)$ is within a range of $0.1 \leq kh_2 \leq 0.45$.

(2) An SAW device which uses a 0th mode of an SAW excited with a structure satisfying conditions such that $kh_1 = 2\pi(t_1/\lambda)$ is within a range of $0.45 \leq kh_1 35\ 0.55$, and $kh_2 = 2\pi(t_2/\lambda)$ is within a range of $0.2 \leq kh_2 \leq 0.47$.

(3) An SAW device uses a 1st mode of an SAW excited with a structure satisfying conditions such that $kh_1 = 2\pi(t_1/\lambda)$ is within a range of $0.35 \leq kh_1 \leq 0.45$, and $kh_2 = 2\pi(t_2/\lambda)$ is within a range of $0.3 \leq kh_2 \leq 0.5$.

(4) An SAW device uses a 1st mode of an SAW excited with a structure satisfying conditions such that $kh_1 = 2\pi(t_1/\lambda)$ is within a range of $0.45 \pm kh_1 \pm 0.55$, and $kh_2 = 2\pi(t_2/\lambda)$ is within a range of $0.35 \leq kh_2 \leq 0.6$.

(5) An SAW device uses a 1st mode of an SAW excited with a structure satisfying conditions such that $kh_1 = 2\pi(t_1/\lambda)$ is within a range of $0.55 \leq kh_1 35\ 0.65$, and $kh_2 = 2\pi(t_2/\lambda)$ is within a range of $0.47 \pm kh_2 \leq 0.73$.

(6) An SAW device uses a 1st mode of an SAW excited with a structure satisfying conditions such that $kh_1 = 2\pi(t_1/\pi)$ is within a range of $0.65 \pm kh_1 \pm 0.8$, and $kh_2 = 2\pi(t_2/\lambda)$ is within a range of $0.7 \pm kh_2 \pm 0.8$.

(7) An SAW device uses a 2nd mode of an SAW excited with a structure satisfying conditions such that $kh_1 = 2\pi(t_1/\lambda)$ is within a range of $0.8 \pm kh_1 \pm 1.0$, and $kh_2 = 2\pi(t_2/\lambda)$ is within a range of $0.35 \pm kh_2 \pm 0.55$.

FIG. 5 is a sectional view of the electrode arrangement B. This SAW device includes at least diamond 1, a short circuit electrode 5 on the diamond, a c-axis oriented polycrystalline $LiNbO_3$ layer 2 arranged on the short circuit electrode, an interdigital transducer 4 arranged on the $LiNbO_3$ layer, and an $SiO_2$ layer 3 arranged on the interdigital transducer. When the thickness of the $LiNbO_3$ layer is represented as $t_1$ (μm), the parameter $kh_1 = 2\pi(t_1/\lambda)$ is within a range of $0.35 \leq kh_1 \leq 1.0$. When the thickness of the $SiO_2$ layer is represented as $t_2$ (μm), the parameter $kh_2 = 2\pi(t_2/\lambda)$ is within a range of $0.3 \leq kh_2 \pm 0.8$. In addition, an SAW (wavelength: λ μm) in the 0th, 1st, or 2nd mode is appropriately used More specifically, SAW devices of the following types (8) to (12) are obtained.

(8) An SAW device which uses a 1st mode of an SAW excited with a structure satisfying conditions such that $kh_1 = 2\pi(t_1/\lambda)$ is within a range of $0.35 \leq kh_1 \leq 0.45$, and $kh_2 = 2\pi(t_2/\lambda)$ is within a range of $0.3 \pm kh_2 \leq 0.5$.

(9) An SAW device which uses a 1st mode of an SAW excited with a structure satisfying conditions such that $kh_1 = 2\pi(t_1/\lambda)$ is within a range of $0.45 \leq kh_1 \leq 0.55$, and $kh_2 = 2\pi(t_2/\lambda)$ is within a range of $0.35 \leq kh_2 \leq 0.6$

(10) An SAW device which uses a 1st mode of an SAW excited with a structure satisfying conditions such that $kh_1 = 2\pi(t_1/\lambda)$ is within a range of $0.55 \leq kh_1 \leq 0.65$, and $kh_2 = 2\pi(t_2/\lambda)$ is within a range of $0.47 \leq kh_2 \leq 0.73$

(11) An SAW device which uses a 1st mode of an SAW excited with a structure satisfying conditions such that $kh_1 = 2\pi(t_1/\lambda)$ is within a range of $0.65 \leq kh_1 \leq 0.8$, and $kh_2 = 2\pi(t_2/\lambda)$ is within a range of $0.7 \leq kh_2 \leq 0.8$

(12) An SAW device which uses a 2nd mode of an SAW excited with a structure satisfying conditions such that $kh_1 = 2\pi(t_1/\lambda)$ is within a range of $0.8 \leq kh_1 \leq 1.0$, and $kh_2 = 2\pi(t_2/\lambda)$ is within a range of $0.35 \leq kh_2 \leq 0.55$ FIG. 6 is a sectional view of the electrode arrangement C. This SAW device includes at least diamond 1, a c-axis oriented polycrystalline $LiNbO_3$ layer 2 arranged on the diamond, an interdigital transducer 4 arranged on the LiNbO, layer, an $SiO_2$ layer 3 arranged on the interdigital transducer, and a short circuit electrode 5 on the $SiO_2$ layer. When the thickness of the $LiNbO_3$ layer is represented as $t_1$ (μm), the parameter $kh_1 = 2\pi(t_1/\lambda)$ is within a range of $0.25 \leq kh_1 23\ 1.0$. When the thickness of the $SiO_2$ layer is represented as $t_2$ (μm), the parameter $kh_2 = 2\pi(t_2/\lambda)$ is within a range of $0.1 \leq kh_2 \leq 0.8$. In addition, an SAW (wavelength: λ μm) in the 0th, 1st, or 2nd mode is appropriately used More specifically, SAW devices of the following types (13) to (20) are obtained

(13) An SAW device which uses a 0th mode of an SAW excited with a structure satisfying conditions such that $kh_1=2\pi(t_1/\lambda)$ is within a range of $0.25 \leq kh_1 \leq 0.35$, and $kh_2=2\pi(t_2/\lambda)$ is within a range of $0.2 \leq kh_2 \leq 0.45$

(14) An SAW device which uses a 0th mode of an SAW excited with a structure satisfying conditions such that $kh_1=2\pi(t_1/\lambda)$ is within a range of $0.35 \leq kh_1 23\ 0.45$, and $kh_2=2\pi(t_2/\lambda)$ is within a range of $0.1 \leq kh_2 \leq 0.45$

(15) An SAW device which uses a 0th mode of an SAW excited with a structure satisfying conditions such that $kh_1=2\pi(t_1/\lambda)$ is within a range of $0.45 \leq kh_{1 \leq 0.55}$, and $kh_2=2\pi(t_2/\lambda)$ is within a range of $0.2 \leq kh_2 \leq 0.47$

(16) An SAW device which uses a 1st mode of an SAW excited with a structure satisfying conditions such that $kh_1=2\pi(t_1/\lambda)$ is within a range of $0.35 \leq kh_1 \pm 0.45$, and $kh_2=2\pi(t_2/\lambda)$ is within a range of $0.3 \leq kh_2 \leq 0.5$

(17) An SAW device which uses a 1st mode of an SAW excited with a structure satisfying conditions such that $kh_1=2\pi(t_1/\lambda)$ is within a range of $0.45 \leq kh_1 \leq 0.55$, and $kh_2=2\pi(t_2/\lambda)$ is within a range of $0.35 \leq kh_2 \leq 0.6$

(18) An SAW device which uses a 1st mode of an SAW excited with a structure satisfying conditions such that $kh_1=2\pi(t_1/\lambda)$ is within a range of $0.55 \leq kh_1 \leq 0.65$, and $kh_2=2\pi(t_2/\lambda)$ is within a range of $0.47 \leq kh_2 \leq 0.73$

(19) An SAW device which uses a 1st mode of an SAW excited with a structure satisfying conditions such that $kh_1=2\pi(t_1/\lambda)$ is within a range of $0.65 \leq kh_1 \leq 0.8$, and $kh_2=2\pi(t_2/\lambda)$ is within a range of $0.7 \leq kh_2 \leq 0.8$

(20) An SAW device which uses a 2nd mode of an SAW excited with a structure satisfying conditions such that $kh_1=2\pi(t_1/\lambda)$ is within a range of $0.8 \leq kh_1 \leq 1.0$, and $kh_2=2\pi(t_2/\lambda)$ is within a range of $0.35 \leq kh_2 \leq 0.55$ FIG. 7 is a sectional view of the electrode arrangement D. This SAW device includes at least diamond 1, a short circuit electrode 5 arranged on the diamond, a c-axis oriented polycrystalline LiNbO₃ layer 2 arranged on the short circuit electrode, an interdigital transducer 4 arranged on the LiNbO₃ layer, an SiO₂ layer 3 arranged on the interdigital transducer, and a short circuit electrode 5 on the SiO₂ layer. When the thickness of the LiNbO₃ layer is represented as $t_1$ ($\mu$m), the parameter $kh_1=2\pi(t_1/\lambda)$ is within a range of $0.35 \leq kh_1 \leq 1.0$. When the thickness of the SiO₂ layer is represented as $t_2$ ($\mu$m), the parameter $kh_2=2\pi(t_2/\lambda)$ is within a range of $0.3 \leq kh_2 \leq 0.8$. In addition, an SAW (wavelength: $\lambda \mu$m) in the 1st, or 2nd mode is appropriately used.

More specifically, SAW devices of the following types (21) to (25) are obtained.

(21) An SAW device which uses a 1st mode of an SAW excited with a structure satisfying conditions such that $kh_1=2\pi(t_1/\lambda)$ is within a range of $0.35 \leq kh_1 \leq 0.45$, and $kh_2=2\pi(t_2/\lambda)$ is within a range of $0.3 \leq kh_2 \leq 0.5$

(22) An SAW device which uses a 1st mode of an SAW excited with a structure satisfying conditions such that $kh_1=2\pi(t_1/\lambda)$ is within a range of $0.45 \leq kh_1 \leq 0.55$, and $kh_2=2\pi(t_2/\lambda)$ is within a range of $0.35 \leq kh_2 \leq 0.6$

(23) An SAW device which uses a 1st mode of an SAW excited with a structure satisfying conditions such that $kh_1=2\pi(t_1/\lambda)$ is within a range of $0.55 \leq kh_1 \leq 0.65$, and $kh_2=2\pi(t_2/\lambda)$ is within a range of $0.47 \leq kh_2 \leq 0.73$

(24) An SAW device which uses a 1st mode of an SAW excited with a structure satisfying conditions such that $kh_1=2\pi(t_1/\lambda)$ is within a range of $0.65 \leq kh_1 \leq 0.8$, and $kh_2=2\pi(t_2/\lambda)$ is within a range of $0.7 \leq kh_2 \leq 0.8$

(25) An SAW device which uses a 2nd mode of an SAW excited with a structure satisfying conditions such that $kh_1=2\pi(t_1/\lambda)$ is within a range of $0.8 \leq kh_1 \leq 1.0$, and $kh_2=2\pi(t_2/\lambda)$ is within a range of $0.35 \leq kh_2 \leq 0.55$.

FIG. 8 is a sectional view of the electrode arrangement E. This SAW device includes at least diamond 1, a interdigital transducer 4 arranged on the diamond, a c-axis oriented polycrystalline LiNbO₃ layer 2 arranged on the interdigital transducer, and an SiO₂ layer 3 arranged on the LiNbO₃ layer. When the thickness of the LiNbO₃ layer is represented as $t_1$ ($\mu$m), the parameter $kh_1=2\pi(t_1/\lambda)$ is within a range of $0.25 \leq kh_1 \leq 1.0$. When the thickness of the SiO₂ layer is represented as $t_2$ ($\mu$m), the parameter $kh_2=2\pi(t_2/\lambda)$ is within a range of $0.1 \leq kh_2 \leq 0.8$. In addition, an SAW (wavelength: $\lambda \mu$m) in the 0th, 1st, or 2nd mode is appropriately used.

More specifically, SAW devices of the following types (26) to (32) are obtained.

(26) An SAW device which uses a 0th mode of an SAW excited with a structure satisfying conditions such that $kh_1=2\pi(t_1/\lambda)$ is within a range of $0.25 \leq kh_1 \leq 0.45$, and $kh_2=2\pi(t_2/\lambda)$ is within a range of $0.1 \leq kh_2 \leq 0.45$.

(27) An SAW device which uses a 0th mode of an SAW excited with a structure satisfying conditions such that $kh_1=2\pi(t_1/\lambda)$ is within a range of $0.45 \leq kh_1 \leq 0.55$, and $kh_2=2\pi(t_2/\lambda)$ is within a range of $0.2 \leq kh_2 \leq 0.47$.

(28) An SAW device which uses a 1st mode of an SAW excited with a structure satisfying conditions such that $kh_1=2\pi(t_1/\lambda)$ is within a range of $0.35 \leq kh_1 \leq 0.45$, and $kh_2=2\pi(t_2/\lambda)$ is within a range of $0.3 \leq kh_2 \leq 0.5$.

(29) An SAW device which uses a 1st mode of an SAW excited with a structure satisfying conditions such that $kh_1=2\pi(t_1/\lambda)$ is within a range of $0.45 \leq kh_1 \leq 0.55$, and $kh_2=2\pi(t_2/\lambda)$ is within a range of $0.35 \leq kh_2 \leq 0.6$.

(30) An SAW device which uses a 1st mode of an SAW excited with a structure satisfying conditions such that $kh_1=2\pi(t_1/\lambda)$ is within a range of $0.55 \leq kh_1 \leq 0.65$, and $kh_2=2\pi(t_2/\lambda)$ is within a range of $0.47 \leq kh_2 \leq 0.73$.

(31) An SAW device which uses a 1st mode of an SAW excited with a structure satisfying conditions such that $kh_1=2\pi(t_1/\lambda)$ is within a range of $0.65 \leq kh_1 \leq 0.8$, and $kh_2=2\pi(t_2/\lambda)$ is within a range of $0.7 \leq kh_2 \leq 0.8$.

(32) An SAW device which uses a 2nd mode of an SAW excited with a structure satisfying conditions such that $kh_1=2\pi(t_1/\lambda)$ is within a range of $0.8 \leq kh_1 \leq 1.0$, and $kh_2=2\pi(t_2/\lambda)$ is within a range of $0.35 \leq kh_2 \leq 0.55$.

FIG. 9 is a sectional view of the electrode arrangement F. This SAW device includes at least diamond 1, a interdigital transducer 4 arranged on the diamond, a c-axis oriented polycrystalline LiNbO₃ layer 2 arranged on the interdigital transducer, a short circuit electrode 5 arrayed on the LiNbO₃ layer, and an SiO₂ layer 3 arranged on the short circuit electrode. When the thickness of the LiNbo₃ layer is represented as $t_1$ ($\mu$m), the parameter $kh_1=2\pi(t_1/\lambda)$ is within a range of $0.35 \leq kh_1 \leq 1.0$. When the thickness of the SiO₂ layer is represented as $t_2$ ($\mu$m), the parameter $kh_2=2\pi(t_2/\lambda)$ is within a range of $0.1 \leq kh_2 \leq 0.8$. In addition, an SAW (wavelength: $\lambda \mu$m) in the 0th, 1st, or 2nd mode is appropriately used.

More specifically, SAW devices of the following types (33) to (39) are obtained.

(33) An SAW device which uses a 0th mode of an SAW excited with a structure satisfying conditions such that $kh_1=2\pi(t_1/\lambda)$ is within a range of $0.25 \leq kh_{1 \leq 0.45}$, and $kh_2=2\pi(t_2/\lambda)$ is within a range of $0.1 \leq kh_2 \leq 0.45$.

(34) An SAW device which uses a 0th mode of an SAW excited with a structure satisfying conditions such that $kh_1=2\pi(t_1/\lambda)$ is within a range of $0.45 \leq kh_1 \leq 0.55$, and $kh_2=2\pi(t_2/\lambda)$ is within a range of $0.2 \leq kh_2 \leq 0.47$.

(35) An SAW device which uses a 1st mode of an SAW excited with a structure satisfying conditions such that $kh_1=2\pi(t_1/\lambda)$ is within a range of $0.35 \leq kh_1 \leq 0.45$, and $kh_2=2\pi(t_2/\lambda)$ is within a range of $0.3 \leq kh_2 \leq 0.5$.

(36) An SAW device which uses a 1st mode of an SAW excited with a structure satisfying conditions such that $kh_1=2\pi(t_1/\lambda)$ is within a range of $0.45 \leq kh_1 \leq 0.55$, and $kh_2=2\pi(t_2/\lambda)$ is within a range of $0.35 \leq kh_2 \leq 0.6$.

(37) An SAW device which uses a 1st mode of an SAW excited with a structure satisfying conditions such that $kh_1=2\pi(t_1/\lambda)$ is within a range of $0.55 \leq kh_1 \leq 0.65$, and $kh_2=2\pi(t_2/\lambda)$ is within a range of $0.47 \leq kh_2 \leq 0.73$.

(38) An SAW device which uses a 1st mode of an SAW excited with a structure satisfying conditions such that $kh_1=2\pi(t_1/\lambda)$ is within a range of $0.65 \leq kh_1 \leq 0.8$, and $kh_2=2\pi(t_2/\lambda)$ is within a range of $0.7 \leq kh_2 23\ 0.8$.

(39) An SAW device which uses a 2nd mode of an SAW excited with a structure satisfying conditions such that $kh_1=2\pi(t_1/\lambda)$ is within a range of $0.8 \leq kh_1 \leq 1.0$, and $kh_2=2\pi(t_2/\lambda)$ is within a range of $0.35 \leq kh_2 \leq 0.55$.

FIG. 10 is a sectional view of the electrode arrangement G. This SAW device includes at least diamond 1, a interdigital transducer 4 arranged on the diamond, a c-axis oriented polycrystalline $LiNbO_3$ layer 2 arranged on the interdigital transducer, an $SiO_2$ layer 3 arranged on the $LiNbO_3$ layer, and an short circuit electrode arranged on the $SiO_2$ layer. When the thickness of the $LiNbO_3$ layer is represented as $t_1$ ($\mu$m), the parameter $kh_1=2\pi(t_1/\lambda)$ is within a range of $0.25 \leq kh_1 \leq 1.0$. When the thickness of the $SiO_2$ layer is represented as $t_2$ ($\mu$m), the parameter $kh_2=2\pi(t_2/\lambda)$ is within a range of $0.1 \leq kh_2 \leq 0.8$. In addition, an SAW (wavelength: $\lambda$ $\mu$m) in the 0th, 1st, or 2nd mode is appropriately used.

More specifically, SAW devices of the following types (40) to (46) are obtained.

(40) An SAW device which uses a 0th mode of an SAW excited with a structure satisfying conditions such that $kh_1=2\pi(t_1/\lambda)$ is within a range of $0.25 \leq kh_1 \leq 0.45$, and $kh_2=2\pi(t_2/\lambda)$ is within a range of $0.1 \leq kh_2 \leq 0.45$.

(41) An SAW device which uses a 0th mode of an SAW excited with a structure satisfying conditions such that $kh_1=2\pi(t_1/\lambda)$ is within a range of $0.45 \leq kh_1 \leq 0.55$, and $kh_2=2\pi(t_2/\lambda)$ is within a range of $0.2 \leq kh_2 \leq 0.47$.

(42) An SAW device which uses a 1st mode of an SAW excited with a structure satisfying conditions such that $kh_1=2\pi(t_1/\lambda)$ is within a range of $0.35 \leq kh_1 \leq 0.45$, and $kh_2=2\pi(t_2/\lambda)$ is within a range of $0.3 \leq kh_2 \leq 0.5$.

(43) An SAW device which uses a 1st mode of an SAW excited with a structure satisfying conditions such that $kh_1=2\pi(t_1/\lambda)$ is within a range of $0.45 \leq kh_1 \leq 0.55$, and $kh_2=2\pi(t_2/\lambda)$ is within a range of $0.35 \leq kh_2 \leq 0.6$.

(44) An SAW device which uses a 1st mode of an SAW excited with a structure satisfying conditions such that $kh_1=2\pi(t_1/\lambda)$ is within a range of $0.55 \leq kh_1 \leq 0.65$, and $kh_2=2\pi(t_2/\lambda)$ is within a range of $0.47 \leq kh_2 \leq 0.73$.

(45) An SAW device which uses a 1st mode of an SAW excited with a structure satisfying conditions such that $kh_1=2\pi(t_1/\lambda)$ is within a range of $0.65 \leq kh_1 \leq 0.8$, and $kh_2=2\pi(t_2/\lambda)$ is within a range of $0.7 \leq kh_2 \leq 0.8$.

(46) An SAW device which uses a 2nd mode of an SAW excited with a structure satisfying conditions such that $kh_1=2\pi(t_1/\lambda)$ is within a range of $0.8 \leq kh_1 \leq 1.0$, and $kh_2=2\pi(t_2/\lambda)$ is within a range of $0.35 \leq kh_2 \leq 0.55$.

The relationship between the structural feature of the SAW device according to the present invention and the function of the characteristics of the device will be described below. Referring to FIGS. 11 to 16, the propagation velocity V of the SAW device according to the present invention can hardly be influenced by the electrode arrangements A to G but depends on the thicknesses of the $LiNbO_3$ and $SiO_2$ layers and the excited mode. Generally, the propagation velocity increases in a mode of higher order. In addition, generally, as the $SiO_2$ layer becomes thicker, the propagation velocity V tends to decrease. Furthermore, the influence of the thickness of the $LiNbO_3$ layer is significantly changed by the mode.

Therefore, to increase the propagation velocity, a mode of higher order-must be used, the $SiO_2$ layer must be made thin, and an optimum $LiNbO_3$ layer must be selected on the basis of the mode. As a result, the thickness of each layer and the mode can be selected such that the propagation velocity v of, e.g., about 7,000 m/s or more is obtained.

Referring to FIGS. 17 to 22, the coefficient TCD of the SAW device according to the present invention can hardly be influenced by the electrode arrangements A to G but largely depends on the thicknesses of the $LiNbO_3$ and $SiO_2$ layers and the excited mode. Generally, the coefficient TCD largely depends on the thickness of the $SiO_2$ layer and tends to increase as the $SiO_2$ layer becomes thicker. Assume that a desired range of the coefficient TCD is ±10 ppm or less. In this case, the thickness of the $SiO_2$ layer must be a certain value or less. When the thickness of the $SiO_2$ layer is represented as $kh_2$ and set at about 0.4, the coefficient TCD can be almost zero. In addition, the coefficient TCD also depends on the thickness of the $LiNbO_3$ layer. As a result, the thicknesses of the two layers and the mode can be selected to achieve a desired coefficient TCD.

Referring to FIGS. 23 to 64, the coefficient $K^2$ of the SAW device according to the present invention largely depends on the electrode arrangements A to G and also largely depends on the $LiNbO_3$ layer, the $SiO_2$ layer, and the mode.

More specifically, in the electrode arrangement A, the largest coefficient $K^2$ can be generally obtained in the 1st mode, as shown in FIGS. 23 to 28. In addition, the optimum coefficient $K^2$ can be selected in accordance with the thickness of the $SiO_2$ layer. For example, when the parameter $kh_2$ is about 0.4, and the parameter $kh_1$ is about 0.5, the coefficient $K^2$ is as large as 10%. Therefore, two layers and a mode for obtaining the desired coefficient $K^2$ can be selected.

In the electrode arrangement B, the similar tendency as in the electrode arrangement A is observed, as shown in FIGS. 29 to 34. However, the obtained value $K^2$ is smaller as a whole. Therefore, two layers and a mode for obtaining the desired coefficient $K^2$ can be selected.

In the electrode arrangement C, the similar tendency as in the electrode arrangement A is observed, as shown in FIGS. 35 to 40, and the obtained value $K^2$ is also similar to that in the electrode arrangement A as a whole. For example, when the parameter $kh_2$ is about 0.6, and the parameter $kh_1$ is about 0.8, the coefficient $K^2$ is as large as 8%. Therefore, two layers and a mode for obtaining the desired coefficient $K^2$ can be selected.

In the electrode arrangement D, the similar tendency as in the electrode arrangement A is observed, as shown in FIGS. 41 to 46. However, the obtained value $K^2$ is smaller as a whole. Therefore, two layers and a mode for obtaining the desired coefficient $K^2$ can be selected.

In the electrode arrangement E, the similar tendency as in the electrode arrangement A is observed, as shown in FIGS. 47 to 52, and the obtained value $K^2$ is also similar to that in the electrode arrangement A as a whole. For example, when the parameter $kh_2$ is about 0.2, and the parameter $kh_1$ is about 0.6, the coefficient $K^2$ is as large as 9%. Therefore, two layers and a mode for obtaining the desired coefficient $K^2$ can be selected.

In the electrode arrangement F, the similar tendency as in the electrode arrangement A is observed, as shown in FIGS. 53 to 58. However, the obtained value $K^2$ is smaller as a whole. Therefore, two layers and a mode for obtaining the desired coefficient $K^2$ can be selected.

In the electrode arrangement G, the similar tendency as in the electrode arrangement A is observed, as shown in FIGS. 59 to 64, and the obtained value $K^2$ is also similar to that in the electrode arrangement A as a whole. For example, when the parameter $kh_2$ is about 0.6, and the parameter $kh_1$ is about 1.0 in the 1st mode, the coefficient $K^2$ is as large as 6%. Therefore, two layers and a mode for obtaining the desired coefficient $K^2$ can be selected.

As a result, according to the present invention, the thicknesses of the $LiNbO_3$ and $SiO_2$ layers formed on the diamond can be appropriately selected in accordance with a mode. An SAW device having preferable characteristics can be obtained while minimizing troublesome trial-and-error in actual manufacturing of devices. As a result, the thickness of each layer, the mode, and the shape of the excitation interdigital transducer can be selected on the basis of a requirement for desired characteristics of the device. For example, a preferable range of the characteristic value is 7,000 to 8,000 m/s. A preferable range of the coefficient $K^2$ is at least 1% to 2% or more. A preferable range of the coefficient TCD is +10 ppm or less.

To generally give the above preferable characteristic values in more detail, the following selection is enabled according to the present invention.

Electrode Arrangement A

According to the arrangement of an SAW device using an SAW (wavelength: $\lambda$ $\mu$m) in the 0th mode, in which the parameters $kh_1$ and $kh_2$ are within a range of $0.25 \leq kh_1 \leq 0.35$ and within a range of $0.1 \leq kh_2 \leq 0.45$, respectively, an SAW device having characteristics such as an SAW propagation velocity of $8,300 \leq V \leq 9,500$ (m/s), an electromechanical coupling coefficient of $0.3 \leq K^2 \leq 1$ (%), and a coefficient of $-10 \leq TCD \leq 10$ (ppm/°C.) can be formed.

According to the arrangement of an SAW device using an SAW (wavelength: $\lambda$ $\mu$m) in the 0th mode, in which the parameters $kh_1$ and $kh_2$ are within a range of $0.35 \leq kh_1 \leq 0.45$ and within a range of $0.1 \leq kh_2 \leq 0.45$, respectively, an SAW device having characteristics such as an SAW propagation velocity of $8,000 \leq V \leq 9,500$ (m/s), an electromechanical coupling coefficient of $0.7 \leq K^2 \leq 1.2$ (%), and a coefficient of $-10 \leq TCD=10$ (ppm/°C.) can be formed.

According to the arrangement of an SAW device using an SAW (wavelength: $\lambda$ $\mu$m) in the 0th mode, in which the parameters $kh_1$ and $kh_2$ are within a range of $0.45 \leq kh_1 \leq 0.55$ and within a range of $0.2 \leq kh_2 \leq 0.47$, respectively, an SAW device having characteristics such as an SAW propagation velocity of $7,800 \leq V \leq 8,500$ (m/s), an electromechanical coupling coefficient of $1 \leq K^2 \leq 1.2$ (%), and a coefficient of $-10 \leq TCD \leq 10$ (ppm/°C.) can be formed.

According to the arrangement of an SAW device using an SAW (wavelength: $\lambda$ $\mu$m) in the 1st mode, in which the parameters $kh_1$ and $kh_2$ are within a range of $0.35 \leq kh_1 \leq 0.45$ and within a range of $0.3 \leq kh_2 \leq 0.5$, respectively, an SAW device having characteristics such as an SAW propagation velocity of $11,000 \leq V \leq 12,500$ (m/s), an electromechanical coupling coefficient of $8.5 \leq K^2 \leq 10$ (%), and a coefficient of $-10 \leq TCD \leq 10$ (ppm/°C.) can be formed.

According to the arrangement of an SAW device using an SAW (wavelength: $\lambda$ $\mu$m) in the 1st mode, in which the parameters $kh_1$ and $kh_2$ are within a range of $0.45 \leq kh_1 \leq 0.55$ and within a range of $0.35 \leq kh_2 \leq 0.6$, respectively, an SAW device having characteristics such as an SAW propagation velocity of $10,000 \leq V \leq 11,200$ (m/s), an electro-mechanical coupling coefficient of $8.8 \leq K^2 \leq 10.5$ (%), and a coefficient of $-10 \leq TCD \leq 10$ (ppm/°C.) can be formed.

According to the arrangement of an SAW device using an SAW (wavelength: $\lambda$ $\mu$m) in the 1st mode, in which the parameters $kh_1$ and $kh_2$ are within a range of $0.55 \leq kh_1 \leq 0.65$ and within a range of $0.47 \leq kh_2 \leq 0.73$, respectively, an SAW device having characteristics such as an SAW propagation velocity of $9,000 \leq V \leq 10,000$ (m/s), an electromechanical coupling coefficient of $8.5 \leq K^2 \leq 9.8$ (%), and a coefficient of $-10 \leq TCD \leq 10$ (ppm/°C.) can be formed.

According to the arrangement of an SAW device using an SAW (wavelength: $\lambda$ $\mu$m) in the 1st mode, in which the parameters $kh_1$ and $kh_2$ are within a range of $0.65 \leq kh_1 \leq 0.8$ and within a range of $0.7 \leq kh_2 \leq 0.8$, respectively, an SAW device having characteristics such as an SAW propagation velocity of $8,000 \leq V \leq 9,000$ (m/s), an electromechanical coupling coefficient of $8 \leq K^2 \leq 8.5$ (%), and a coefficient of $-10 \leq TCD \leq 10$ (ppm/°C.) can be formed.

According to the arrangement of an SAW device using an SAW (wavelength: $\lambda$ $\mu$m) in the 2nd mode, in which the parameters $kh_1$ and $kh_2$ are within a range of $0.8 \leq kh_1 \leq 1.0$ and within a range of $0.35 \leq kh_2 \leq 0.55$, respectively, an SAW device having characteristics such as an SAW propagation velocity of $11,200 \leq V \leq 12,500$ (m/s), an electromechanical coupling coefficient of $2 \leq K^2 \leq 4$ (%), and a coefficient of $-10 \leq TCD \leq 10$ (ppm/°C.) can be formed.

Electrode Arrangement B

According to the arrangement of an SAW device using an SAW (wavelength: $\lambda$ $\mu$m) in the 1st mode, in which the parameters $kh_1$ and $kh_2$ are within a range of $0.35 \leq kh_1 \leq 0.45$ and within a range of $0.3 \leq kh_2 \leq 0.5$, respectively, an SAW device having characteristics such as an SAW propagation velocity of $11,000 \leq V \leq 12,500$ (m/s), an electromechanical coupling coefficient of $1.6 \leq K^2 \leq 1.7$ (%), and a coefficient of $-10 \leq TCD \leq 10$ (ppm/°C.) can be formed.

According to the arrangement of an SAW device using an SAW (wavelength: $\lambda$ $\mu$m) in the 1st mode, in which the parameters $kh_1$ and $kh_2$ are within a range of $0.45 \leq kh_1 \leq 0.55$ and within a range of $0.35 \leq kh_2 \leq 0.6$, respectively, an SAW device having characteristics such as an SAW propagation velocity of $10,000 \leq V \leq 11,200$ (m/s), an electro-mechanical coupling coefficient of $2.5 \leq K^2 \leq 2.8$ (%), and a coefficient of $-10 \leq TCD \leq 10$ (ppm/°C.) can be formed.

According to the arrangement of an SAW device using an SAW (wavelength: $\lambda$ $\mu$m) in the 1st mode, in which the parameters $kh_1$ and $kh_2$ are within a range of $0.55 \leq kh_1 \leq 0.65$ and within a range of $0.47 \leq kh_2 \leq 0.73$, respectively, an SAW device having characteristics such as an SAW propagation velocity of $9,000 \leq V \leq 10,000$ (m/s), an electromechanical coupling coefficient of $2.8 \leq K^2 \leq 2.9$ (%), and a coefficient of $-10 \leq TCD \leq 10$ (ppm/°C.) can be formed.

According to the arrangement of an SAW device using an SAW (wavelength: $\lambda$ μm) in the 1st mode, in which the parameters $kh_1$ and $kh_2$ are within a range of $0.65 \leq kh_1 \leq 0.8$ and within a range of $0.7 \leq kh_2 \leq 0.8$, respectively, an SAW device having characteristics such as an SAW propagation velocity of $8,000 \leq V \leq 9,000$ (m/s), an electromechanical coupling coefficient of $3.3 \leq K^2 \leq 3.5$ (%), and a coefficient of $-10 \leq TCD \leq 10$ (ppm/°C.) can be formed.

According to the arrangement of an SAW device using an SAW (wavelength: $\lambda$ μm) in the 2nd mode, in which the parameters kh, and $kh_2$ are within a range of $0.8 \leq kh_1 \leq 1.0$ and within a range of $0.35 \leq kh_2 \leq 0.55$, respectively, an SAW device having characteristics such as an SAW propagation velocity of $11,200 \leq V \leq 12,500$ (m/s), an electromechanical coupling coefficient of $0.4 \leq K^2 \leq 1.5$ (%), and a coefficient of $-10 \leq TCD \leq 10$ (ppm/°C.) can be formed.

Electrode Arrangement C

According to the arrangement of an SAW device using an SAW (wavelength: $\lambda$ μm) in the 0th mode, in which the parameters $kh_1$ and $kh_2$ are within a range of $0.25 \leq kh_1 \pm 0.35$ and within a range of $0.2 \leq kh_2 \leq 0.45$, respectively, an SAW device having characteristics such as an SAW propagation velocity of $8,300 \leq V \leq 9,000$ (m/s), an electromechanical coupling coefficient of $0.3 \leq K^2 \leq 1.0$ (%), and a coefficient of $-10 \leq TCD \leq 10$ (ppm/°C.) can be formed.

According to the arrangement of an SAW device using an SAW (wavelength: $\lambda$ μm) in the 0th mode, in which the parameters $kh_1$ and $kh_2$ are within a range of $0.35 \leq kh_1 \leq 0.45$ and within a range of $0.1 \leq kh_2 \leq 0.45$, respectively, an SAW device having characteristics such as an SAW propagation velocity of $8,000 \leq V \leq 9,000$ (m/s), an electromechanical coupling coefficient of $0.3 \leq K^2 \leq 1$ (%), and a coefficient of $-10 \leq TCD \leq 10$ (ppm/°C.) can be formed.

According to the arrangement of an SAW device using an SAW (wavelength: $\lambda$ μm) in the 0th mode, in which the parameters $kh_1$ and $kh_2$ are within a range of $0.45 \leq kh_1 \leq 0.55$ and within a range of $0.2 \leq kh_2 \leq 0.47$, respectively, an SAW device having characteristics such as an SAW propagation velocity of $7,800 \leq V \leq 8,500$ (m/s), an electro-mechanical coupling coefficient of $0.7 \leq K^2 \leq 1.0$ (%), and a coefficient of $-10 \leq TCD \leq 10$ (ppm/°C.) can be formed.

According to the arrangement of an SAW device using an SAW (wavelength: $\lambda$ μm) in the 1st mode, in which the parameters $kh_1$ and $kh_2$ are within a range of $0.35 \leq kh_1 \leq 0.45$ and within a range of $0.3 \leq kh_2 \leq 0.5$, respectively, an SAW device having characteristics such as an SAW propagation velocity of $11,000 \leq V \leq 12,500$ (m/s), an electromechanical coupling coefficient of $7.5 \leq K^2 \leq 8.0$ (%), and a coefficient of $-10 \leq TCD \leq 10$ (ppm/°C.) can be formed.

According to the arrangement of an SAW device using an SAW (wavelength: $\lambda$ μm) in the 1st mode, in which the parameters $kh_1$ and $kh_2$ are within a range of $0.45 \leq kh_1 \leq 0.55$ and within a range of $0.35 \leq kh_2 \leq 0.6$, respectively, an SAW device having characteristics such as an SAW propagation velocity of $10,000 \leq V \leq 11,200$ (m/s), an electromechanical coupling coefficient of $7.8 \leq K^2 \leq 8.3$ (%), and a coefficient of $-10 \leq TCD \leq 10$ (ppm/°C.) can be formed.

According to the arrangement of an SAW device using an SAW (wavelength: $\lambda$ μm) in the 1st mode, in which the parameters $kh_1$ and $kh_2$ are within a range of $0.55 \leq kh_1 \leq 0.65$ and within a range of $0.47 \leq kh_2 \leq 0.73$, respectively, an SAW device having characteristics such as an SAW propagation velocity of $9,000 \leq V \leq 10,000$ (m/s), an electromechanical coupling coefficient of $7.8 \leq K^2 \leq 8.3$ (%), and a coefficient of $-10 \leq TCD \leq 10$ (ppm/°C.) can be formed.

According to the arrangement of an SAW device using an SAW (wavelength: $\lambda$ μm) in the 1st mode, in which the parameters $kh_1$ and $kh_2$ are within a range of $0.65 \leq kh_1 \leq 0.8$ and within a range of $0.7 \leq kh_2 \leq 0.8$, respectively, an SAW device having characteristics such as an SAW propagation velocity of $8,000 \leq V \leq 9,000$ (m/s), an electromechanical coupling coefficient of $7.5 \leq K^2 \leq 8.0$ (%), and a coefficient of $-10 \leq TCD \leq 10$ (ppm/°C.) can be formed.

According to the arrangement of an SAW device using an SAW (wavelength: $\lambda$ μm) in the 2nd mode, in which the parameters $kh_1$ and $kh_2$ are within a range of $0.8 \leq kh_1 \leq 1.0$ and within a range of $0.35 \leq kh_2 \leq 0.55$, respectively, an SAW device having characteristics such as an SAW propagation velocity of $11,200 \leq V \leq 12,500$ (m/s), an electromechanical coupling coefficient of $1.7 \leq K^2 \leq 3.3$ (%), and a coefficient of $-10 \leq TCD \leq 10$ (ppm/°C.) can be formed.

Electrode Arrangement D

According to the arrangement of an SAW device using an SAW (wavelength: $\lambda$ μm) in the 1st mode, in which the parameters $kh_1$ and $kh_2$ are within a range of $0.35 \leq kh_1 \leq 0.45$ and within a range of $0.3 \leq kh_2 \leq 0.5$, respectively, an SAW device having characteristics such as an SAW propagation velocity of $11,000 \leq V \leq 12,500$ (m/s), an electro-mechanical coupling coefficient of $1.4 \leq K^2 1.6$ (%), and a coefficient of $-10 \leq TCD \leq 10$ (ppm/°C.) can be formed.

According to the arrangement of an SAW device using an SAW (wavelength: $\lambda$ μm) in the 1st mode, in which the parameters $kh_1$ and $kh_2$ are within a range of $0.45 \leq kh_1 \leq 0.55$ and within a range of $0.35 \leq kh_2 \leq 0.6$, respectively, an SAW device having characteristics such as an SAW propagation velocity of $10,000 \leq V \leq 11,200$ (m/s), an electro-mechanical coupling coefficient of $2.0 \leq K^2 \leq 2.2$ (%), and a coefficient of $-10 \leq TCD \leq 10$ (ppm/°C.) can be formed.

According to the arrangement of an SAW device using an SAW (wavelength: $\lambda$ μm) in the 1st mode, in which the parameters $kh_1$ and $kh_2$ are within a range of $0.55 \leq kh_1 \leq 0.65$ and within a range of $0.47 \leq kh_2 \leq 0.73$, respectively, an SAW device having characteristics such as an SAW propagation velocity of $9,000 \leq V \leq 10,000$ (m/s), an electromechanical coupling coefficient of $1.7 \leq K^2 \leq 1.8$ (%), and a coefficient of $-10 \leq TCD \leq 10$ (ppm/°C.) can be formed.

According to the arrangement of an SAW device using an SAW (wavelength: $\lambda$ μm) in the 1st mode, in which the parameters $kh_1$ and $kh_2$ are within a range of $0.65 \leq kh_1 \leq 0.8$ and within a range of $0.7 \leq kh_2 \leq 0.8$, respectively, an SAW device having characteristics such as an SAW propagation velocity of $8,000 \leq V \leq 9,000$ (m/s), an electromechanical coupling coefficient of $3.2 \leq K^2 \leq 3.3$ (%), and a coefficient of $-10 \leq TCD \leq 10$ (ppm/°C.) can be formed.

According to the arrangement of an SAW device using an SAW (wavelength: $\lambda$ μm) in the 2nd mode, in which the parameters $kh_1$ and $kh_2$ are within a range of $0.8 \leq kh_1 \leq 1.0$ and within a range of $0.35 \leq kh_2 \leq 0.55$, respectively, an SAW device having characteristics such as an SAW propagation velocity of $11,200 \leq V \leq 12,500$ (m/s), an electro-mechanical coupling coefficient of $0.3 \leq K^2 \leq 1.4$ (%), and a coefficient of $-10 \leq TCD \leq 10$ (ppm/°C.) can be formed.

Electrode Arrangement E

According to the arrangement of an SAW device using an SAW (wavelength: $\lambda$ μm) in the 0th mode, in which the parameters $kh_1$ and $kh_2$ are within a range of $0.25 \leq kh_1 \leq 0.35$ and within a range of $0.1 \leq kh_2 \leq 0.45$, respectively, an SAW device having characteristics such as an SAW propagation velocity of $8,300 \leq V \leq 9,500$ (m/s), an electromechanical coupling coefficient of $0.3 \leq K^2 \leq 1.3$ (%), and a coefficient of $-10 \leq TCD \leq 10$ (ppm/°C.) can be formed.

According to the arrangement of an SAW device using an SAW (wavelength: $\lambda$ μm) in the 0th mode, in which the parameters $kh_1$ and $kh_2$ are within a range of $0.35 \leq kh_1 \leq 0.45$ and within a range of $0.1 \leq kh_2 \leq 0.45$, respectively, an SAW device having characteristics such as an SAW propagation velocity of $8,000 \leq V \leq 9,500$ (m/s), an electromechanical coupling coefficient of $1 \leq K^2 \leq 1.7$ (%), and a coefficient of $-10 \leq TCD \leq 10$ (ppm/°C.) can be formed.

According to the arrangement of an SAW device using an SAW (wavelength: $\lambda$ μm) in the 0th mode, in which the parameters $kh_1$ and $kh_2$ are within a range of $0.45 \leq kh_1 \leq 0.55$ and within a range of $0.2 \leq kh_2 \leq 0.47$, respectively, an SAW device having characteristics such as an SAW propagation velocity of $7,800 \leq V \leq 8,500$ (m/s), an electro-mechanical coupling coefficient of $1.5 \leq K^2 \leq 1.8$ (%), and a coefficient of $-10 \leq TCD \leq 10$ (ppm/°C.) can be formed.

According to the arrangement of an SAW device using an SAW (wavelength: $\lambda$ μm) in the 1st mode, in which the parameters $kh_1$ and $kh_2$ are within a range of $0.35 \leq kh_1 \leq 0.45$ and within a range of $0.3 \leq kh_2 \leq 0.5$, respectively, an SAW device having characteristics such as an SAW propagation velocity of $11,000 \leq V \leq 12,500$ (m/s), an electro-mechanical coupling coefficient of $7.5 \leq K^2 \leq 9.5$ (%), and a coefficient of $-10 \leq TCD \leq 10$ (ppm/°C.) can be formed.

According to the arrangement of an SAW device using an SAW (wavelength: $\lambda$ μm) in the 1st mode, in which the parameters $kh_1$ and $kh_2$ are within a range of $0.45 \leq kh_1 \leq 0.55$ and within a range of $0.35 \leq kh_2 \leq 0.6$, respectively, an SAW device having characteristics such as an SAW propagation velocity of $10,000 \leq V \leq 11,200$ (m/s), an electromechanical coupling coefficient of $7 \leq K^2 \leq 9$ (%), and a coefficient of $-10 \leq TCD \leq 10$ (ppm/°C.) can be formed.

According to the arrangement of an SAW device using an SAW (wavelength: $\lambda$ μm) in the 1st mode, in which the parameters $kh_1$ and $kh_2$ are within a range of $0.55 \leq kh_1 \leq 0.65$ and within a range of $0.47 \leq kh_2 \leq 0.73$, respectively, an SAW device having characteristics such as an SAW propagation velocity of $9,000 \leq V \leq 10,000$ (m/s), an electromechanical coupling coefficient of $6.2 \leq K^2 \leq 8$ (%), and a coefficient of $-10 \leq TCD \leq 10$ (ppm/°C.) can be formed.

According to the arrangement of an SAW device using an SAW (wavelength: $\lambda$ μm) in the 1st mode, in which the parameters $kh_1$ and $kh_2$ are within a range of $0.65 \leq kh_1 \leq 0.8$ and within a range of $0.7 \leq kh_2 \leq 0.8$, respectively, an SAW device having characteristics such as an SAW propagation velocity of $8,000 \leq V \leq 9,000$ (m/s), an electromechanical coupling coefficient of $6 \leq K^2 \leq 6.3$ (%), and a coefficient of $-10 \leq TCD \leq 10$ (ppm/°C.) can be formed.

According to the arrangement of an SAW device using an SAW (wavelength: $\lambda$ μm) in the 2nd mode, in which the parameters $kh_1$ and $kh_2$ are within a range of $0.8 \leq kh_1 \leq 1.0$ and within a range of $0.35 \leq kh_2 \leq 0.55$, respectively, an SAW device having characteristics such as an SAW propagation velocity of $11,200 \leq V \leq 12,500$ (m/s), an electro-mechanical coupling coefficient of $1.5 \leq K^2 \leq 3.5$ (%), and a coefficient of $-10 \leq TCD \leq 10$ (ppm/°C.) can be formed.

Electrode Arrangement F

According to the arrangement of an SAW device using an SAW (wavelength: $\lambda$ μm) in the 0th mode, in which the parameters $kh_1$ and $kh_2$ are within a range of $0.35 \leq kh_1 \leq 0.45$ and within a range of $0.1 \leq kh_2 \leq 0.45$, respectively, an SAW device having characteristics such as an SAW propagation velocity of $8,000 \leq V \leq 9,000$ (m/s), an electromechanical coupling coefficient of $0.3 \leq K^2 \leq 1.0$ (%), and a coefficient of $-10 \leq TCD \leq 10$ (ppm/°C.) can be formed.

According to the arrangement of an SAW device using an SAW (wavelength: $\lambda$ μm) in the 0th mode, in which the parameters $kh_1$ and $kh_2$ are within a range of $0.45 \leq kh_1 \leq 0.55$ and within a range of $0.2 \leq kh_2 \leq 0.47$, respectively, an SAW device having characteristics such as an-SAW propagation velocity of $7,800 \leq V \leq 8,500$ (m/s), an electromechanical coupling coefficient of $1.2 \leq K^2 \leq 1.3$ (%), and a coefficient of $-10 \leq TCD \leq 10$ (ppm/°C.) can be formed.

According to the arrangement of an SAW device using an SAW (wavelength: $\lambda$ μm) in the 1st mode, in which the parameters $kh_1$ and $kh_2$ are within a range of $0.35 \leq kh_1 \leq 0.45$ and within a range of $0.3 \leq kh_2 \leq 0.5$, respectively, an SAW device having characteristics such as an SAW propagation velocity of $11,000 \leq V \leq 12,500$ (m/s), an electromechanical coupling coefficient of $0.3 \leq K^2 \leq 0.5$ (%), and a coefficient of $-10 \leq TCD \leq 10$ (ppm/°C.) can be formed.

According to the arrangement of an SAW device using an SAW (wavelength: $\lambda$ μm) in the 1st mode, in which the parameters $kh_1$ and $kh_2$ are within a range of $0.45 \leq kh_1 \leq 0.55$ and within a range of $0.35 \leq kh_2 \leq 0.6$, respectively, an SAW device having characteristics such as an SAW propagation velocity of $10,000 \leq V \leq 11,200$ (m/s), an electromechanical coupling coefficient of $0.4 \leq K^2 \leq 0.8$ (%), and a coefficient of $-10 \leq TCD \leq 10$ (ppm/°C.) can be formed.

According to the arrangement of an SAW device using an SAW (wavelength: $\lambda$ μm) in the 1st mode, in which the parameters $kh_1$ and $kh_2$ are within a range of $0.55 \leq kh_1 \leq 0.65$ and within a range of $0.47 \leq kh_2 \leq 0.73$, respectively, an SAW device having characteristics such as an SAW propagation velocity of $9,000 \leq V \leq 10,000$ (m/s), an electro-mechanical coupling coefficient of $0.6 \leq K^2 \leq 0.8$ (%), and a coefficient of $-10 \leq TCD \leq 10$ (ppm/°C.) can be formed.

According to the arrangement of an SAW device using an SAW (wavelength: $\lambda$ μm) in the 1st mode, in which the parameters $kh_1$ and $kh_2$ are within a range of $0.65 \leq kh_1 \leq 0.8$ and within a range of $0.7 \leq kh_2 \leq 0.8$, respectively, an SAW device having characteristics such as an SAW propagation velocity of $8,000 \leq V \leq 9,000$ (m/s), an electro-mechanical coupling coefficient of $6 \leq K^2 \leq 6.3$ (%), and a coefficient of $-10 \leq TCD \leq 10$ (ppm/°C.) can be formed.

According to the arrangement of an SAW device using an SAW (wavelength: $\lambda$ μm) in the 2nd mode, in which the parameters $kh_1$ and $kh_2$ are within a range of $0.8 \leq kh_1 \leq 1.0$ and within a range of $0.35 \leq kh_2 \leq 0.55$, respectively, an SAW device having characteristics such as an SAW propagation velocity of $11,200 \leq V \leq 12,500$ (m/s), an electro-mechanical coupling coefficient of $0.3 \leq K^2 \leq 1.2$ (%), and a coefficient of $-10 \leq TCD \leq 10$ (ppm/°C.) can be formed.

Electrode Arrangement G

According to the arrangement of an SAW device using an SAW (wavelength: $\lambda$ μm) in the 0th mode, in which the parameters $kh_1$ and $kh_2$ are within a range of $0.25 \leq kh_1 \leq 0.35$ and within a range of $0.1 \leq kh_2 \leq 0.45$, respectively, an SAW device having characteristics such as an SAW propagation velocity of $8,300 \leq V \leq 9,500$ (m/s), an electro-mechanical coupling coefficient of $0.3 \leq K^2 \leq 1.2$ (%), and a coefficient of $-10 \leq TCD \leq 10$ (ppm/°C.) can be formed.

According to the arrangement of an SAW device using an SAW (wavelength: $\lambda$ $\mu$m) in the 0th mode, in which the parameters $kh_1$ and $kh_2$ are within a range of $0.35 \leq kh_1 \leq 0.45$ and within a range of $0.1 \leq kh_2 \leq 0.45$, respectively, an SAW device having characteristics such as an SAW propagation velocity of $8,000 \leq V \leq 9,000$ (m/s), an electromechanical coupling coefficient of $0.5 \leq K^2 \leq 1.5$ (%), and a coefficient of $-10 \leq TCD \leq 10$ (ppm/°C.) can be formed.

According to the arrangement of an SAW device using an SAW (wavelength: $\lambda$ $\mu$m) in the 0th mode, in which the parameters $kh_1$ and $kh_2$ are within a range of $0.45 \leq kh_1 \leq 0.55$ and within a range of $0.2 \leq kh_2 \leq 0.47$, respectively, an SAW device having characteristics such as an SAW propagation velocity of $7,800 \leq V \leq 8,500$ (m/s), an electro-mechanical coupling coefficient of $1.3 \leq K^2 \leq 1.7$ (%), and a coefficient of $-10 \leq TCD \leq 10$ (ppm/°C.) can be formed.

According to the arrangement of an SAW device using an SAW (wavelength: $\lambda$ $\mu$m) in the 1st mode, in which the parameters $kh_1$ and $kh_2$ are within a range of $0.35 \leq kh_1 \leq 0.45$ and within a range of $0.3 \leq kh_2 \leq 0.5$, respectively, an SAW device having characteristics such as an SAW propagation velocity of $11,000 \leq V \leq 12,500$ (m/s), an electro-mechanical coupling coefficient of $6.2 \leq K^2 \leq 7.0$ (%), and a coefficient of $-10 \leq TCD \leq 10$ (ppm/°C.) can be formed.

According to the arrangement of an SAW device using an SAW (wavelength: $\lambda$ $\mu$m) in the 1st mode, in which the parameters $kh_1$ and $kh_2$ are within a range of $0.45 \leq kh_1 \leq 0.55$ and within a range of $0.35 \leq kh_2 \leq 0.6$, respectively, an SAW device having characteristics such as an SAW propagation velocity of $11,000 \leq V \leq 11,200$ (m/s), an electromechanical coupling coefficient of $6 \leq K^2 \leq 7.2$ (%), and a coefficient of $-10 \leq TCD \leq 10$ (ppm/°C.) can be formed.

According to the arrangement of an SAW device using an SAW (wavelength: $\lambda$ $\mu$m) in the 1st mode, in which the parameters $kh_1$ and $kh_2$ are within a range of $0.55 \leq kh_1 \leq 0.65$ and within a range of $0.47 \leq kh_2 \leq 0.73$, respectively, an SAW device having characteristics such as an SAW propagation velocity of $9,000 \leq V \leq 10,000$ (m/s), an electromechanical coupling coefficient of $5.6 \leq K^2 \leq 6.6$ (%), and a coefficient of $-10 \leq TCD \leq 10$ (ppm/°C.) can be formed.

According to the arrangement of an SAW device using an SAW (wavelength: $\lambda$ $\mu$m) in the 1st mode, in which the parameters $kh_1$ and $kh_2$ are within a range of $0.65 \leq kh_1 \leq 0.8$ and within a range of $0.7 \leq kh_2 \leq 0.8$, respectively, an SAW device having characteristics such as an SAW propagation velocity of $8,000 \leq V \leq 9,000$ (m/s), an electromechanical coupling coefficient of $5.6 \leq K^2 \leq 5.8$ (%), and a coefficient of $-10 \leq TCD \leq 10$ (ppm/°C.) can be formed.

According to the arrangement of an SAW device using an SAW (wavelength: $\lambda$ $\mu$m) in the 2nd mode, in which the parameters $kh_1$ and $kh_1$ are within a range of $0.8 \leq kh_1 \leq 1.0$ and within a range of $0.35 \leq kh_2 \leq 0.55$, respectively, an SAW device having characteristics such as an SAW propagation velocity of $11,200 \leq V \leq 12,500$ (m/s), an electro-mechanical coupling coefficient of $1.5 \leq K^2 \leq 3.0$ (%), and a coefficient of $-10 \leq TCD \leq 10$ (ppm/°C.) can be formed.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

The present invention will be described below in detail with reference to the accompanying drawings as needed.

(Mode of SAW)

The SAW device according to the present invention has a basic structure in which an $LiNbO_3$ layer is formed on diamond as a substrate material, and an $SiO_2$ layer is formed on the $LiNbO_3$ layer. When the sound velocity of the diamond as a substrate material is higher than that of $LiNbO_3$ as a piezoelectric material, and an SAW is oscillated using an interdigital transducer, a plurality of SAWs with different propagation velocities V are excited. In this case, the modes are expressed as the 0th mode, the 1st mode, the 2nd mode, the 3rd mode, . . . in an order from a lower propagation velocity V.

The SAW mode used by the SAW device according to the present invention can be determined by measuring the SAW propagation velocity V at the operating frequency of the device.

Figure 1:
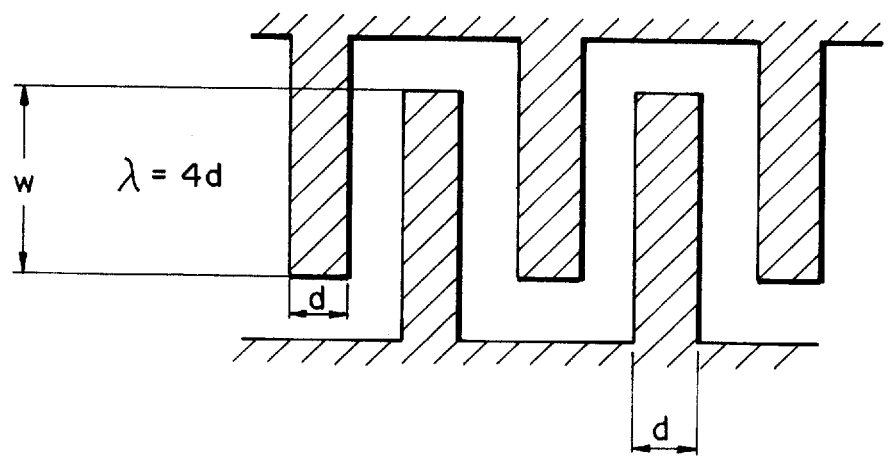
FIG. 1 is a plan view schematically showing a planar shape of an interdigital transducer (single electrode) constituting an SAW device, in which reference numeral 1 denotes diamond; 2, an $LiNbO_3$ layer having a c-axis orientation; 3, an $Sio_2$ layer; 4, an interdigital transducer; and 5, a short-circuit electrode.
Figure 2:
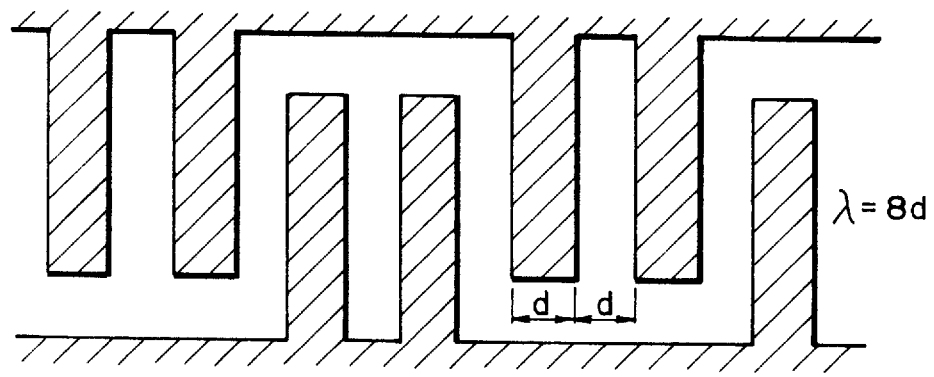
FIG. 2 is a plan view schematically showing another planar shape of an interdigital transducer (double electrode) constituting an SAW device, in which reference numeral 1 denotes diamond; 2, an $LiNbO_3$ layer having a c-axis orientation; 3, an $SiO_2$ layer; 4, an interdigital transducer; and 5, a short-circuit electrode.

The propagation velocity V can be obtained from, e.g., a relation $V=f\lambda$ (f is the center frequency; $\lambda$ is the wavelength based on the electrode width of the interdigital transducer). When the interdigital transducer constituting the SAW device is a single electrode (electrode width d) having a planar shape as shown in FIG. 1, $\lambda=4d$. When the interdigital transducer is a double electrode (electrode width d) having a planar shape as shown in FIG. 2, $\lambda=8d$.

(Structure)

The SAW device according to the present invention basically has a layer structure in which the layer structure according to the present invention is formed on an appropriate substrate (e.g., Si) as needed. Therefore, two structures shown in the schematic sectional views of FIGS. 3A and 3B can be occasionally employed for implementation of the present invention in order to, e.g., obtain a necessary mechanical strength without influencing the characteristics of the SAW device according to the present invention.

Therefore, the SAW device according to the present invention basically has a layer structure including at least diamond as a substrate material or a diamond layer, an $LiNbO_3$ layer having a c-axis orientation and formed on the diamond, and an $SiO_2$ layer formed on the $LiNbO_3$ layer.

The thickness of the diamond or diamond layer is not particularly limited. With a thickness to be described below, the characteristics of the SAW device according to the present invention are not influenced. On the other hand, parameters defined as $kh_1=2\pi(t_1/\lambda_n)$ and $kh_2=2\pi(t_2/\lambda_n)$ are selected within specific ranges, where $t_1$ ($\mu$m) is the thickness of the $LiNbO_3$ layer, and $t_2$ ($\mu$m) is the thickness of the $SiO_2$ layer. The thickness of each layer is selected to be optimized in accordance with the operating frequency, the shape of the excitation interdigital transducer (to be described below), and the like.

(Electrode Arrangement)

In the present invention, excitation and short-circuit electrodes are arranged in the above-described basic layer structure in various embodiments. As shown in FIGS. 11 to 22, the various electrode arrangements can hardly influence the characteristics of the device according to the present invention. In the present invention, various electrode arrangements are allowed in accordance with the application purposes of the device. Particularly, in the present invention, seven electrode arrangements as shown in FIGS. 4 to 10 in which an interdigital transducer 4 and, as needed, a short-circuit electrode 5 are arranged are preferably used. The seven electrode arrangements will be described below in more detail.

Figure 4:
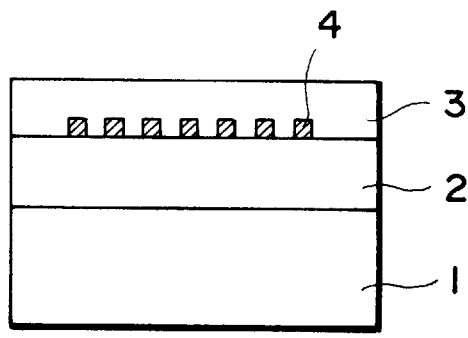
FIG. 4 is a sectional view schematically showing an embodiment (electrode arrangement A) of the electrode arrangement of the surface acoustic wave device of the present invention.

In the arrangement shown in FIG. 4 (electrode arrangement A), the SAW device comprises diamond 1, an $LiNbO_3$ layer 2 formed on the diamond, the interdigital transducer 4 formed on the $LiNbO_3$ layer 2, and an $SiO_2$ layer 3 formed on the interdigital transducer 4.

Figure 6:
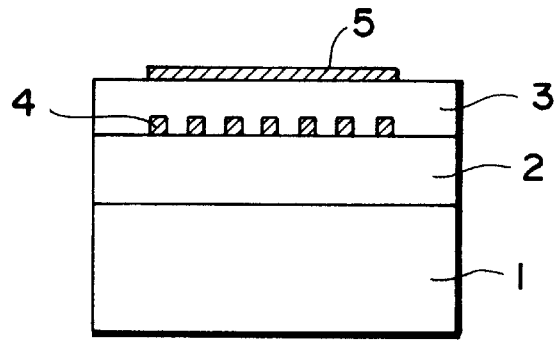
FIG. 6 is a sectional view schematically showing an embodiment (electrode arrangement C) of the electrode arrangement of the surface acoustic wave device of the present invention.

In the arrangement shown in FIG. 6 (electrode arrangement C), a short-circuit electrode is formed on the $SiO_2$ layer in the "electrode arrangement A".

Figure 8:
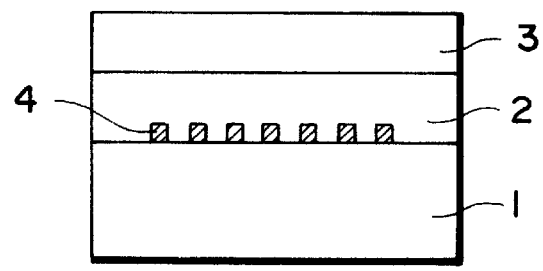
FIG. 8 is a sectional view schematically showing an embodiment (electrode arrangement E) of the electrode arrangement of the surface acoustic wave device of the present invention.

In the arrangement shown in FIG. 8 (electrode arrangement E), the SAW device comprises the diamond 1, the interdigital transducer 4 formed on the diamond, the $LiNbO_3$ layer 2 formed on the interdigital transducer, and the $SiO_2$ layer 3 formed on the $LiNbO_3$ layer 2.

Figure 10:
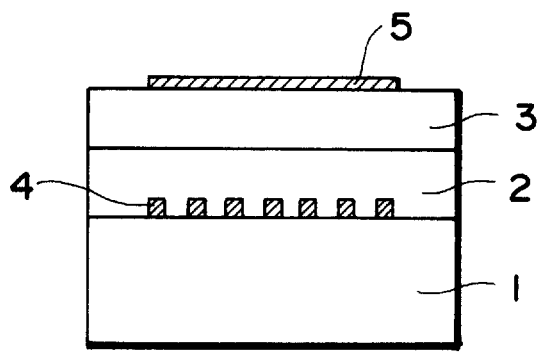
FIG. 10 is a sectional view schematically showing an embodiment (electrode arrangement G) of the electrode arrangement of the surface acoustic wave device of the present invention.

In the arrangement shown in FIG. 10 (electrode arrangement G), the short-circuit electrode 5 is formed on the $SiO_2$ layer 3 in the "electrode arrangement E".

Figure 9:
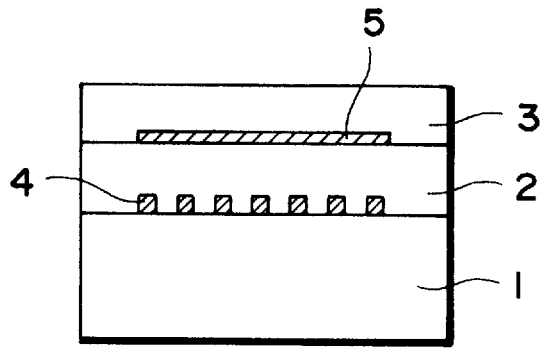
FIG. 9 is a sectional view schematically showing an embodiment (electrode arrangement F) of the electrode arrangement of the surface acoustic wave device of the present invention.

In the arrangement shown in FIG. 9 (electrode arrangement F), the short-circuit electrode 5 is formed on the $LiNbO_3$ layer 2 in the "electrode arrangement E".

Figure 5:
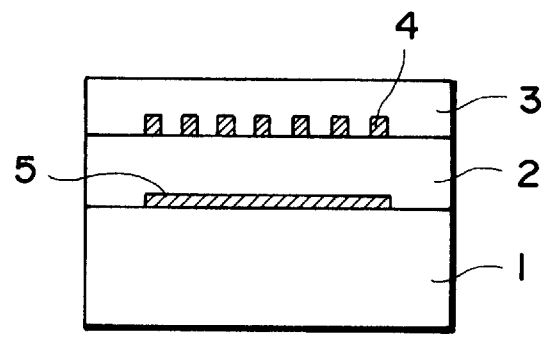
FIG. 5 is a sectional view schematically showing an embodiment (electrode arrangement B) of the electrode arrangement of the surface acoustic wave device of the present invention.

In the arrangement shown in FIG. 5 (electrode arrangement B), the short-circuit electrode 5 is formed on the diamond 1 in the "electrode arrangement A".

Figure 7:
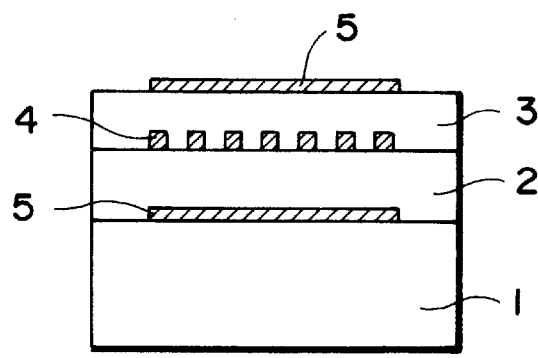
FIG. 7 is a sectional view schematically showing an embodiment (electrode arrangement D) of the electrode arrangement of the surface acoustic wave device of the present invention.

In the arrangement shown in FIG. 7 (electrode arrangement D), the short-circuit electrode 5 is formed on the diamond 1 in the "electrode arrangement C".

The respective layers constituting the SAW device of the present invention will be described below in more detail.

(Substrate)

The SAW device according to the present invention does not always need a substrate. For example, diamond as a substrate material can be used without being processed, as will be described below. As needed, an appropriate substrate formed of, e.g., a semiconductor such as Si, a metal, a glass material, a ceramic, or the like can be used.

(Diamond as Substrate Material)

In the present invention, diamond as a substrate material is not particularly limited. Single-crystal diamond and/or polycrystalline diamond can be used. A method of forming the diamond or the diamond layer is not particularly limited.

More specifically, single-crystal diamond may be used as the diamond. In addition, a diamond film may be formed on any material (substrate) other than those described above by vapor deposition to obtain a polycrystalline diamond film or an epitaxially grown diamond film.

In the present invention, when the diamond is a diamond film, the method of depositing the diamond film or a thin diamond film is not particularly limited.

More specifically, a known technique such as CVD (Chemical Vapor Deposition), microwave plasma CVD, PVD (Physical Vapor Deposition), sputtering, ion plating, a plasma jet method, a flame method, or a hot filament method can be used as the deposition method.

In the present invention, the thickness of the diamond layer is not limited. A thickness for stably exciting and propagating a desired SAW suffices. Therefore, the thickness must be at least ½ the SAW (wavelength: $\lambda_n$ $\mu$m). The thickness is preferably one or more times the SAW for use.

($LiNbO_3$ Film)

In the present invention, the $LiNbO_3$ film to be formed on diamond may be either a single-crystal film or a polycrystalline film. In the present invention, a polycrystalline film is particularly preferable from the viewpoint of cost in manufacturing devices. The method of forming the $LiNbO_3$ film on the diamond is not particularly limited either, and a known technique such as sputtering, deposition, CVD, laser annealing, MOCVD (Organic Metal CVD), or MBE (Molecular Beam Epitaxy) can be used without particular limitation (for example, a film forming method and a film characteristic measuring method described in Furushima, Y. et al., ULTRASONICS SYMPOSIUM 1993, pp. 263–266. Shimizu, M et al., J. Appl. Phys., 32, pp. 4111–4114, 1993 are incorporated in this specification).

When the c-axis orientation (to be described below) of the $LiNbO_3$ layer formed by the above technique under predetermined conditions is checked, manufacturing conditions for forming a film having a c-axis orientation which exhibits a desired value a can be set.

As for the thickness of the $LiNbO_3$ film, when various conditions for the above-described known film forming method are set, one skilled in the art can easily form a film having a desired thickness. In addition, after film formation, the device can be cut and the section can be directly measured using a scanning electron microscope or the like, as needed.

(Orientation of $LiNbO_3$ Film)

In the present invention, in either a single-crystal or polycrystalline $LiNbO_3$ film to be formed on the diamond, it is preferable that the c-axis of the microcrystalline $LiNbO_3$ film be substantially perpendicularly oriented on the diamond substrate material surface from the viewpoint of the electro-mechanical coupling properties, the piezoelectric properties, and the like. In the present invention, such an $LiNbO_3$ film is defined as a film having a c-axis orientation. The degree of substantially perpendicular orientation of the c-axis of the microcrystalline $LiNbO_3$ film formed on the diamond substrate material surface according to the present invention can be directly qualitatively observed by directly observing the cleavage surface of the device with an electron microscope or directly observing the surface of the $LiNbO_3$ film with an electron microscope.

To quantitatively evaluate the orientation, the X-ray rocking pattern method can be used as one of the crystal face orientation evaluation techniques to evaluate the degree of perpendicular orientation of the c-axis of the microcrystalline $LiNbO_3$ film formed on the diamond substrate material surface, as will be described below. More specifically, a conventional X-ray diffraction apparatus (using a Cu-Kα ray) can be used to perform evaluation as follows:

(1) A device as a measurement target is set on a sample holder of an X-ray diffractometer.

(2) A plane orientation to be evaluated is measured using the X-ray diffraction patterning method.

(3) The θ-axis (measurement sample rotation) and 2θ-axis (X-ray counter) are rotated and fixed at the maximum value of the output in the plane orientation to be evaluated. In a microcrystalline $LiNbO_3$ film whose c-axis of the perpendicularly oriented with respect to the substrate, 2θ is 39° at a peak of (006).

(4) Only the device is rotated (only the θ-axis), and the rocking curve is measured.

(5) The measured rocking curve is approximated by Gaussian distribution, and the dispersion value σ is obtained.

The dispersion value σ of the rocking curve measured in the above manner is evaluated as dispersion of the c-axis from a line perpendicular to the substrate. When the c-axis orientation is disordered, the piezoelectric properties tend to be degraded. The SAW device of the present invention exhibits satisfactory piezoelectric properties when the value σ is 8° or less, and more satisfactory piezoelectric properties when the value σ is 4° or less.

The above technique can be used even after an SiO2 film is formed on the $LiNbO_3$ film. More specifically, as needed, the $SiO_2$ film is removed to expose the $LiNbO_3$ film, and thereafter, the X-ray diffraction apparatus or the like is used. The above technique can also be used in observation of the section of the device with a scanning electron microscope. In this case, the perpendicularity on the substrate surface is measured within a predetermined range.

($SiO_2$ Layer)

In the present invention, the $SiO_2$ layer formed on the $LiNbO_3$ film may be a single-crystal layer, a polycrystalline layer, or an amorphous layer. Particularly, an amorphous $SiO_2$ layer can be preferably used.

A method of forming this film is not particularly limited in the present invention. More specifically, a known technique such as CVD, PVD, and sputtering can be preferably used. An RF magnetron sputtering apparatus can be more preferably used.

As for the thickness of the $SiO_2$ film, one skilled in the art can easily form a film having a desired thickness by setting various conditions for the above-described known film forming method. In addition, after film formation, the device can be cut, and the section can be directly measured using a scanning electron microscope or the like, as needed.

(Interdigital Transducer)

In the present invention, the material for forming the interdigital transducer is not particularly limited as far as it is a conductive material. From the viewpoint of workability as an interdigital transducer and cost, Al (aluminum) can be particularly preferably used.

The thickness of the interdigital transducer is preferably about 100 to 5,000 Å (more preferably, about 100 to 500 Å) though it is not particularly limited as far as the function as an electrode can be obtained.

When this thickness is smaller than 100 Å, the resistivity increases, resulting in an increase in loss. On the other hand, when the thickness of the electrode exceeds 5,000 Å, the mass addition effect which causes reflection of an SAW due to the thickness and height of the electrode becomes conspicuous, and desired SAW characteristics may be impeded.

The planar shape of the interdigital transducer is not particularly limited as far as the function as an electrode can be obtained. A so-called single electrode whose schematic plan view is shown in FIG. 1 or a double electrode whose schematic plan view is shown in FIG. 2 can be preferably used.

(Short-circuit Electrode)

In the SAW device of the present invention, the short-circuit electrode arranged as needed is an electrode having a function of setting an equipotential of an electric field to change the SAW characteristics of the device. This electrode is preferably formed of a (thin) metal film (e.g., Al, Au, or Al-Cu). Since the short-circuit electrode has a function different from that of the interdigital transducer, the material for forming the short-circuit electrode need not be the same as that of the interdigital transducer.

The thickness of the short-circuit electrode is not particularly limited as far as the function as an electrode can be obtained. However, it is preferably about 50 to 3,000 Å (more preferably, about 100 to 500 Å).

When this thickness is smaller than 50 Å, it is difficult to obtain an equipotential. A thickness larger than 3,000 Å easily affects reflection of an SAW.

The short-circuit electrode preferably has a planar shape of "non-segmented electrode" having the same area as that of the interdigital transducer.

The present invention will be described below in more detail in accordance with examples.

EXAMPLE (Example 1)

A polycrystalline diamond film was formed on the (100) plane of single-crystal silicon by microwave plasma CVD. Thereafter, the surface was polished to form a diamond film having a thickness of about 20 μm.

<Diamond Film Forming Conditions>

Microwave power: 150 W

Reaction gas: $CH_4:H_2$=1:100

Reaction pressure: 40 Torr

Deposition temperature: 850° C.

Film thickness (after surface polishing): 20 μm

Each $LiNbO_3$ film (thickness: 0.38 to 1.27 μm, six types) was formed on the diamond film by RF magnetron sputtering.

All the formed $LiNbO_3$ films were films having a c-axis orientation. The values a of X-ray rocking curves were 2° to 3°.

<RF Magnetron Sputtering Conditions>

Pressure: $1\times10^{-2}$ Torr

Substrate temperature: 650° C.

Ar: $O_2$=1:1

RF power: 150 W

Target Li:Nb=1:1 sintered body (sintered body of $Li_2CO_3$ and $Nb_2O$,)

Film thickness: six different values of 0.38, 0.51, 0.64, 0.76, 1.02, 1.27 μm

An interdigital transducer (planar shape; double electrode shown in FIG. 2, electrode width d=1 μm, period=8 μm) having a thickness of 400 Å was formed using Al. An SiO$_2$ film was formed on the interdigital transducer by RF magnetron sputtering, thereby completing an SAW device having the layer structure shown in FIG. 3B and the electrode arrangement (electrode arrangement A) shown in FIG. 4 (number of electrode pairs of input interdigital transducer: 30, number of electrode pairs of output interdigital transducer: 30, center-to-center distance between the input and output electrodes: 400 μm).

<RF Magnetron Sputtering Conditions>
Pressure: 0.02 Torr
Substrate temperature: 650° C.
Ar: O$_2$=1:1
RF power: 200 W
Target: SiO$_2$
Film thickness: thickness corresponding a value obtained by equally dividing a thickness of 0.13 to 1.62 μm into 40 portions A short-circuit electrode (thickness: 100 Å) was formed on the SAW device (electrode arrangement A) by using Al, thereby completing an SAW device having the layer structure shown in FIG. 3B and the electrode arrangement C shown in FIG. 6.

An SAW device having the electrode arrangement E shown in FIG. 8, an SAW device having the electrode arrangement B shown in FIG. 5, an SAW device having the electrode arrangement G shown in FIG. 10, and an SAW device having the electrode arrangement F shown in FIG. 9 were manufactured in accordance with the same procedures for manufacturing the above SAW device except that the order of layer formation was changed.

A short-circuit electrode (thickness: 100 Å) was formed on the SiO$_2$ film of the SAW device having the electrode arrangement B shown in FIG. 5 by using Al, thereby completing an SAW device having the electrode arrangement D shown in FIG. 7.

A high frequency was applied to the input electrode of each of the above SAW devices to excite an SAW. From a relation V=fλ (f is the center frequency; λ=8d=8 μm), the propagation velocity V (m/s) of the SAW in each excitation mode was obtained. The radiation conductance of the interdigital transducer (IDT, interdigital transducer) was measured by using a network analyzer (8719A available from Yokogawa Hewlett Packard (YHP)), and the electromechanical coupling coefficient (K$^2$) was obtained on the basis of a real part G of the radiation conductance as follows:

$$K^2 = (G/8) \cdot f_0 \cdot C \cdot N$$

(f$_0$: center frequency, C: total capacitance of interdigital transducer, N: number of pairs of interdigital transducer)

The frequency temperature coefficient (TCF) was measured from the dependency of the frequency of the SAW on the temperature, and the coefficient TCD was obtained from a relation TCF =−TCD.

The thickness t$_1$ (μm) of the LiNbO$_3$ layer and the thickness t$_2$ (μm) of the SiO$_2$ layer of the SAW device were obtained by cutting the device after measurement of the above various parameters and observing the section with a scanning electron microscope (SEM) at a magnification of x1,000 to x5,000.

Figure 3A:
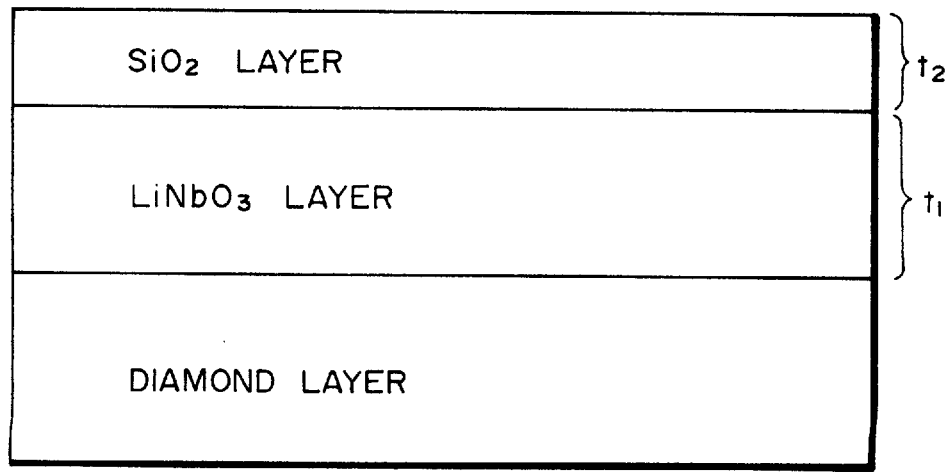
FIG. 3A is a sectional view showing an embodiment (layer structure 1) of the layer structure of the SAW device of the present invention.
Figure 3B:
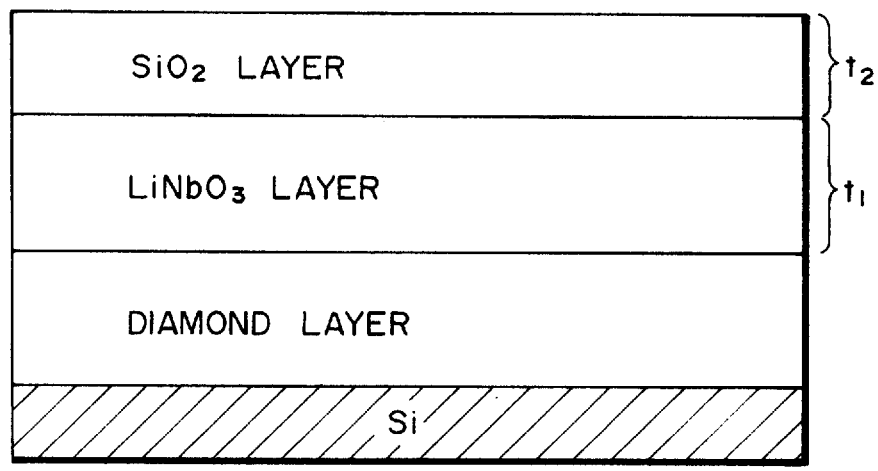
FIG. 3B is a sectional view showing another embodiment (layer structure 2) of the layer structure of the SAW device of the present invention.

On the basis of obtained data, the parameters kh$_1$=2π(t$_1$/λ) and kh$_2$=2π(t$_2$/λ) were obtained for each of the SAW devices (λ=8 μm) having the layer structure (layer structure 2) shown in FIG. 3B and the electron arrangements (electron arrangements A to G) shown in FIGS. 4 to 10.

Figure 11:
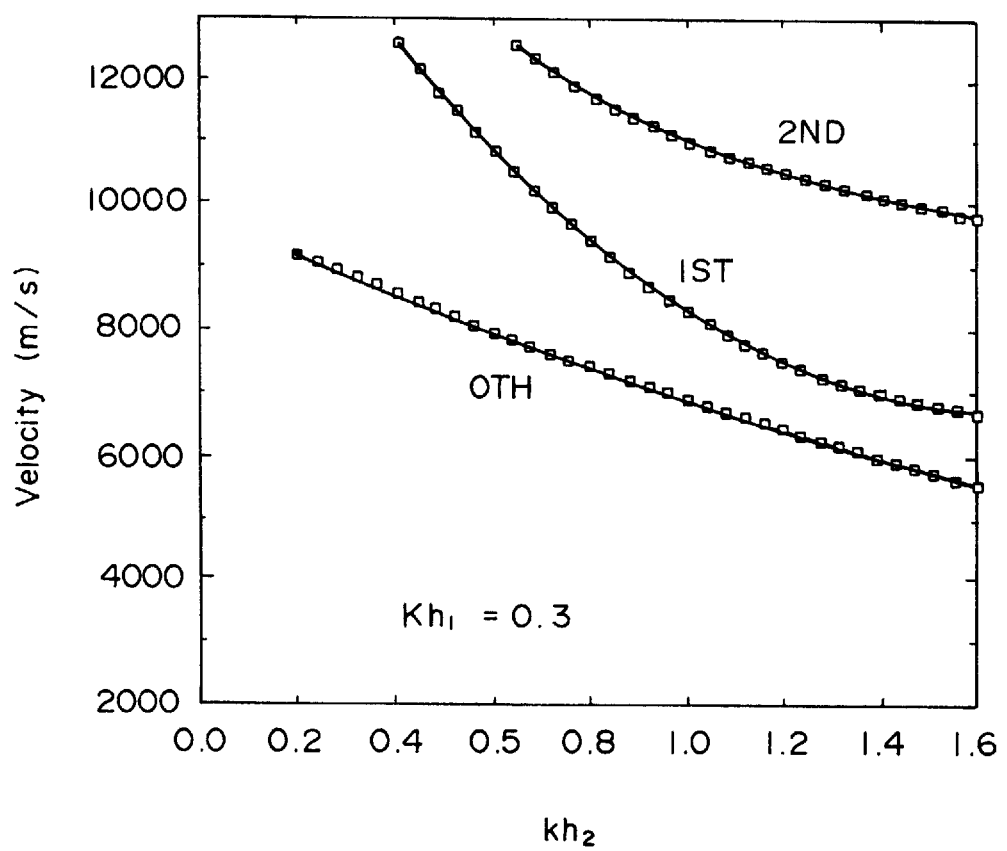
FIG. 11 is a graph showing the relationship between an SAW propagation velocity V and a parameter $kh_2$ in an SAW device having the layer structure 2 and the electrode arrangement A, B, C, D, E, F, or G (parameter $kh_1=0.3$)
Figure 12:
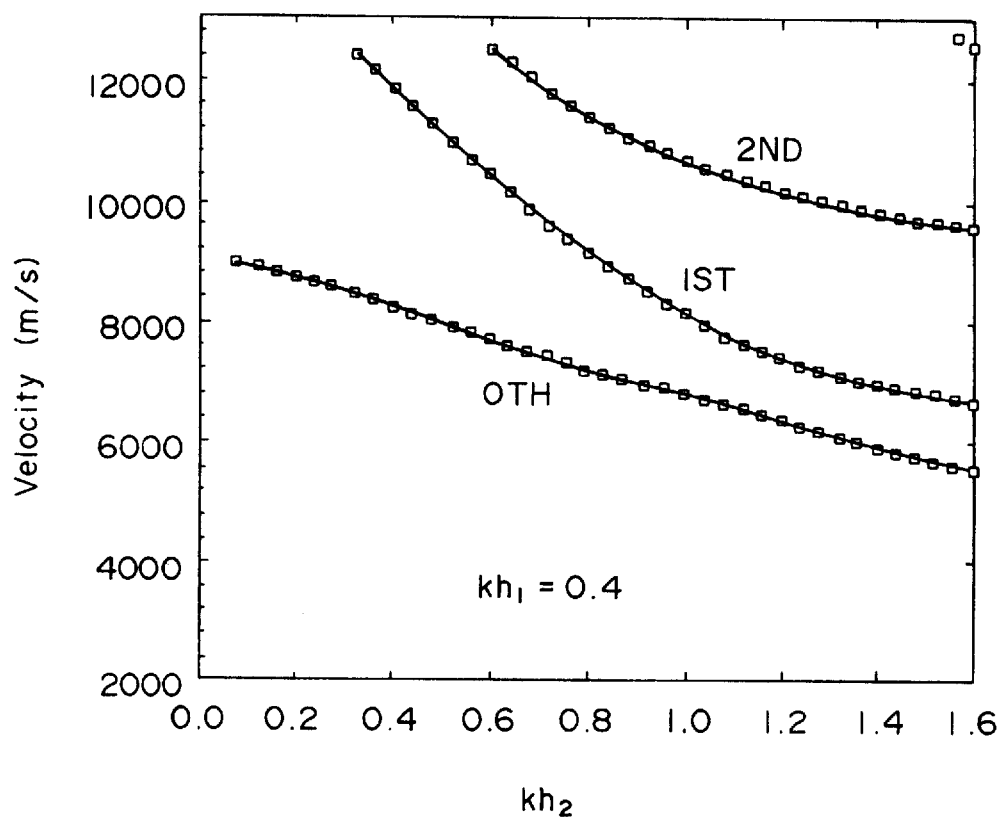
FIG. 12 is a graph showing the relationship between an SAW propagation velocity V and a parameter $kh_2$ in an SAW device having the layer structure 2 and the electrode arrangement A, B, C, D, E, F, or G (parameter $kh_1=0.4$)
Figure 13:
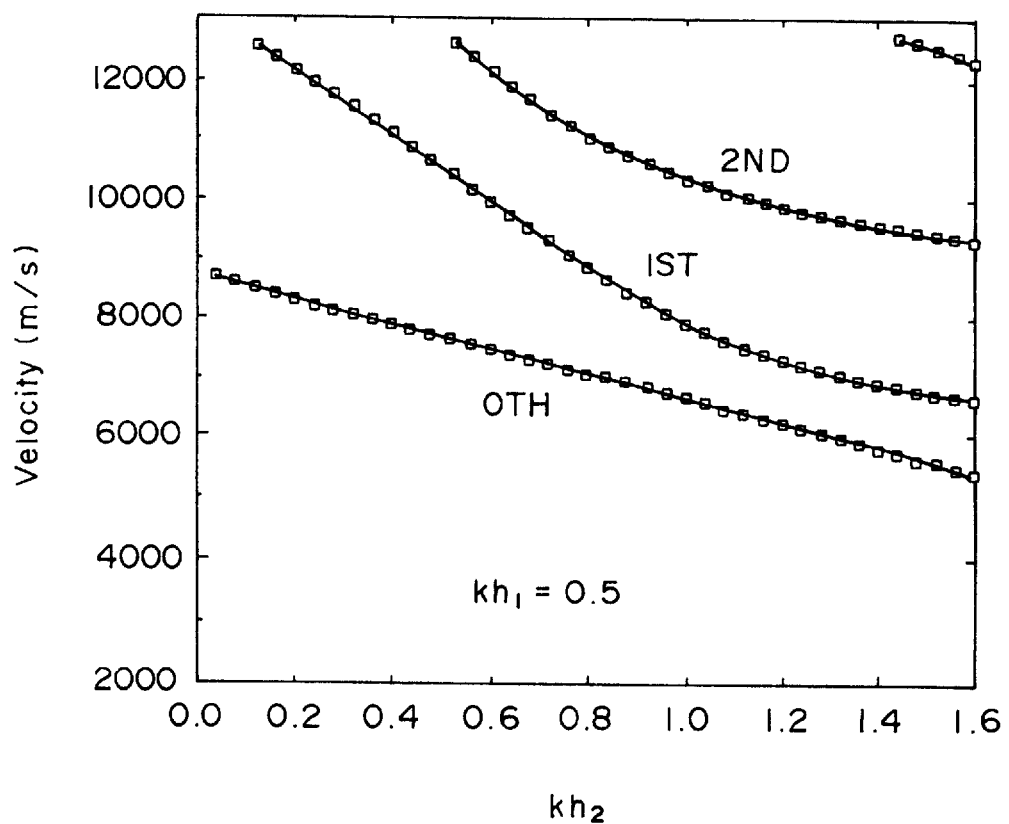
FIG. 13 is a graph showing the relationship between an SAW propagation velocity V and a parameter $kh_2$ in an SAW device having the layer structure 2 and the electrode arrangement A, B, C, D, E, F, or G (parameter $kh_1=0.5$)
Figure 14:
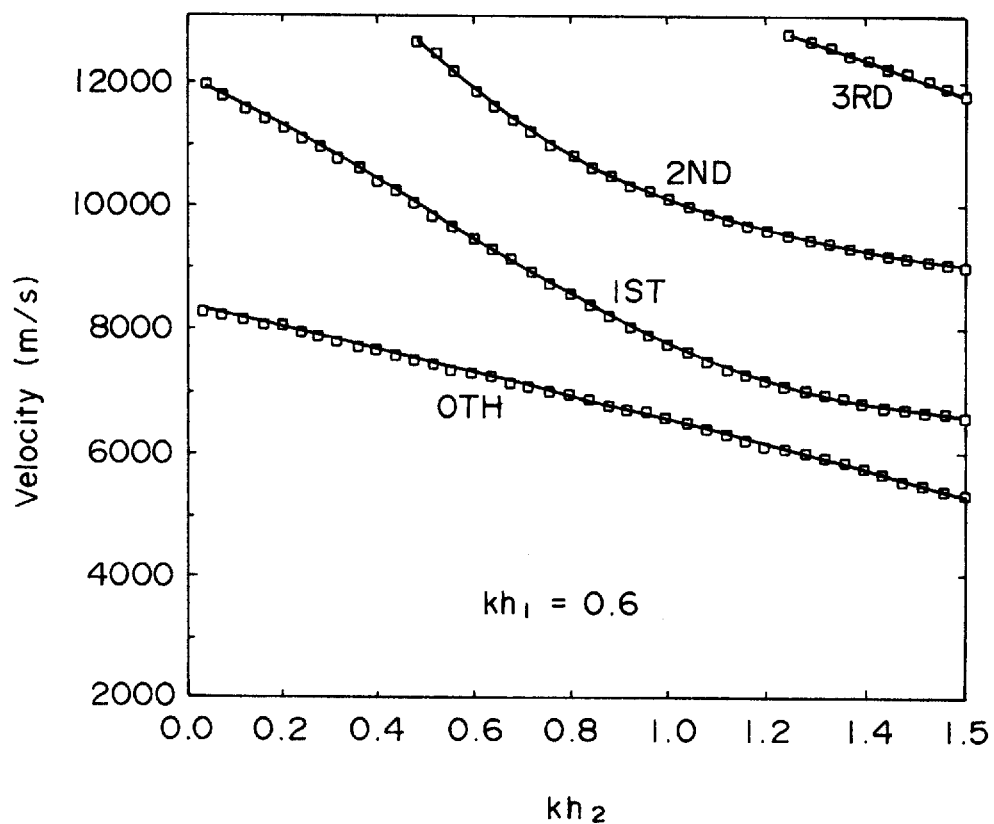
FIG. 14 is a graph showing the relationship between an SAW propagation velocity V and a parameter $kh_2$ in an SAW device having the layer structure 2 and the electrode arrangement A, B, C, D, E, F, or G (parameter $kh_1=0.6$)
Figure 15:
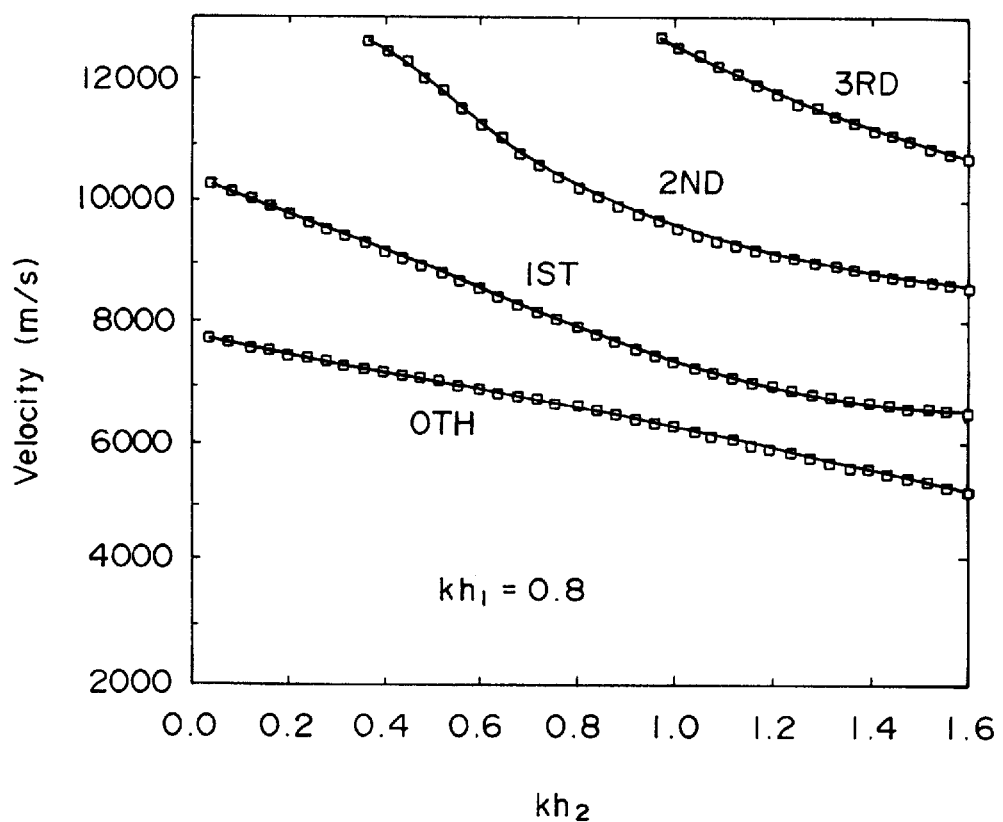
FIG. 15 is a graph showing the relationship between an SAW propagation velocity V and a parameter $kh_2$ in an SAW device having the layer structure 2 and the electrode arrangement A, B, C, D, E, F, or G (parameter $kh_1=0.8$)
Figure 16:
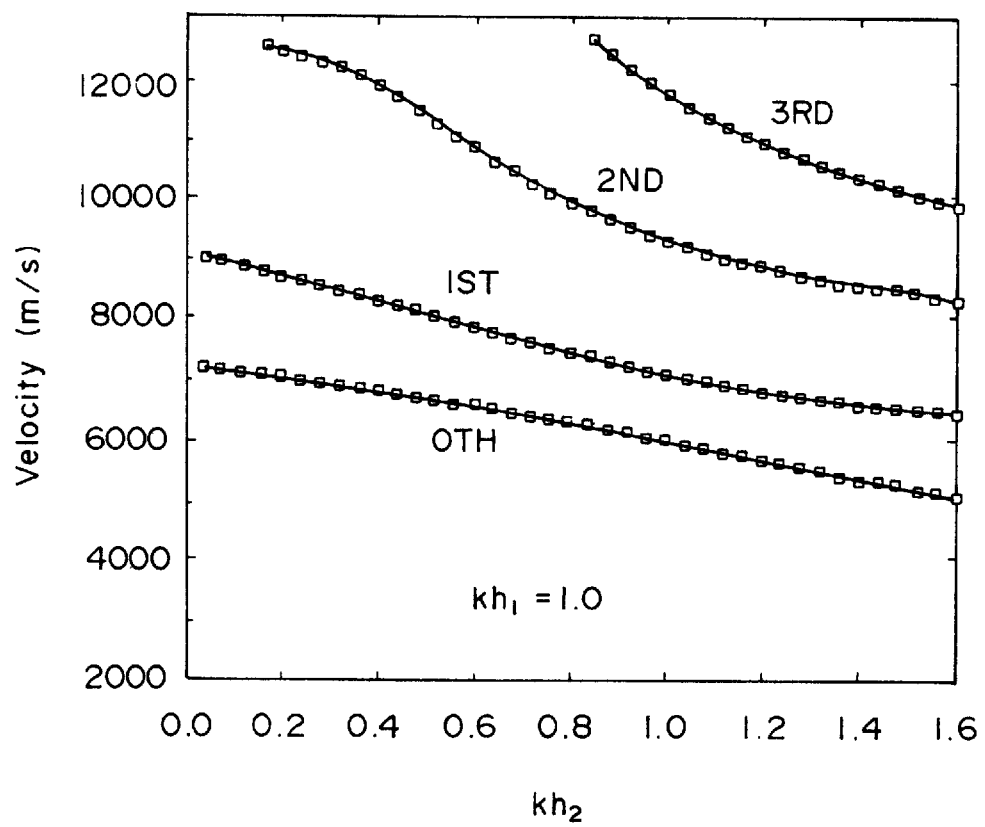
FIG. 16 is a graph showing the relationship between an SAW propagation velocity V and a parameter $kh_2$ in an SAW device having the layer structure 2 and the electrode arrangement A, B, C, D, E, F, or G (parameter $kh_1=1.0$)

The relation (dependency) between the propagation velocity V and the parameter kh$_2$, which are obtained in the above manner, is shown in a graph of FIG. 11 (kh$_1$=0.3), FIG. 12 (kh$_1$=0.4), FIG. 13 (kh$_1$=0.5), FIG. 14 (kh$_1$=0.6), FIG. 15 (kh$_1$=0.8), or FIG. 16 (kh$_1$=1.0).

Figure 17:
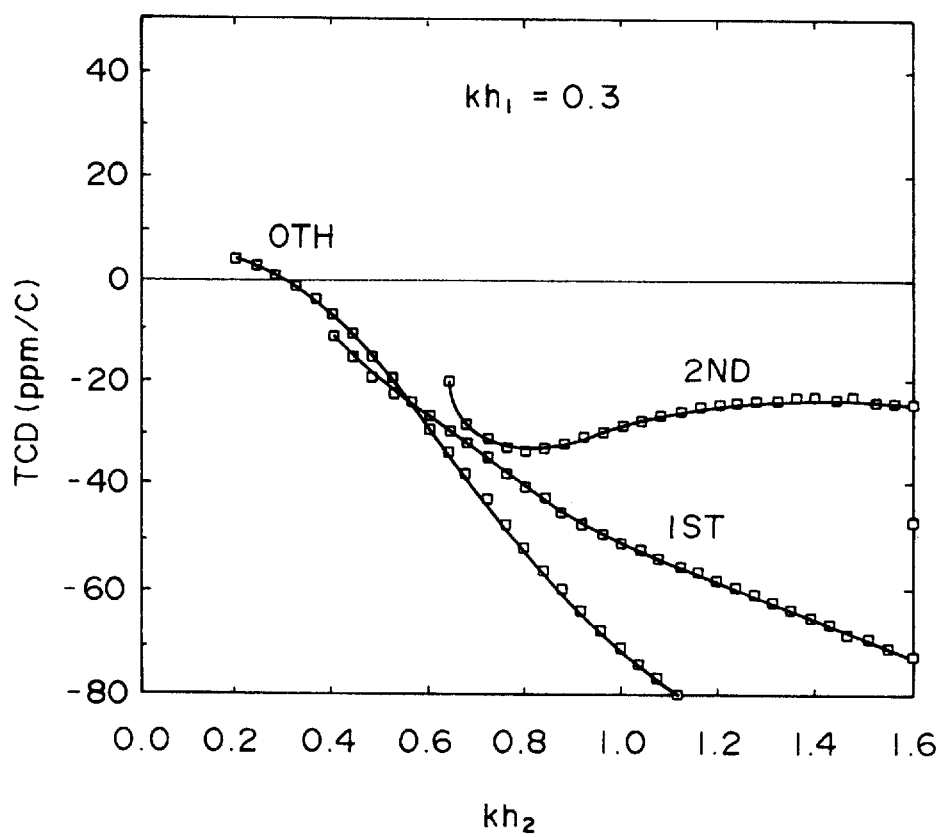
FIG. 17 is a graph showing the relationship between an SAW delay time temperature coefficient TCD and the parameter $kh_2$ in an SAW device having the layer structure 2 and the electrode arrangement A, B, C, D, E, F, or G (parameter $kh_1=0.3$)
Figure 18:
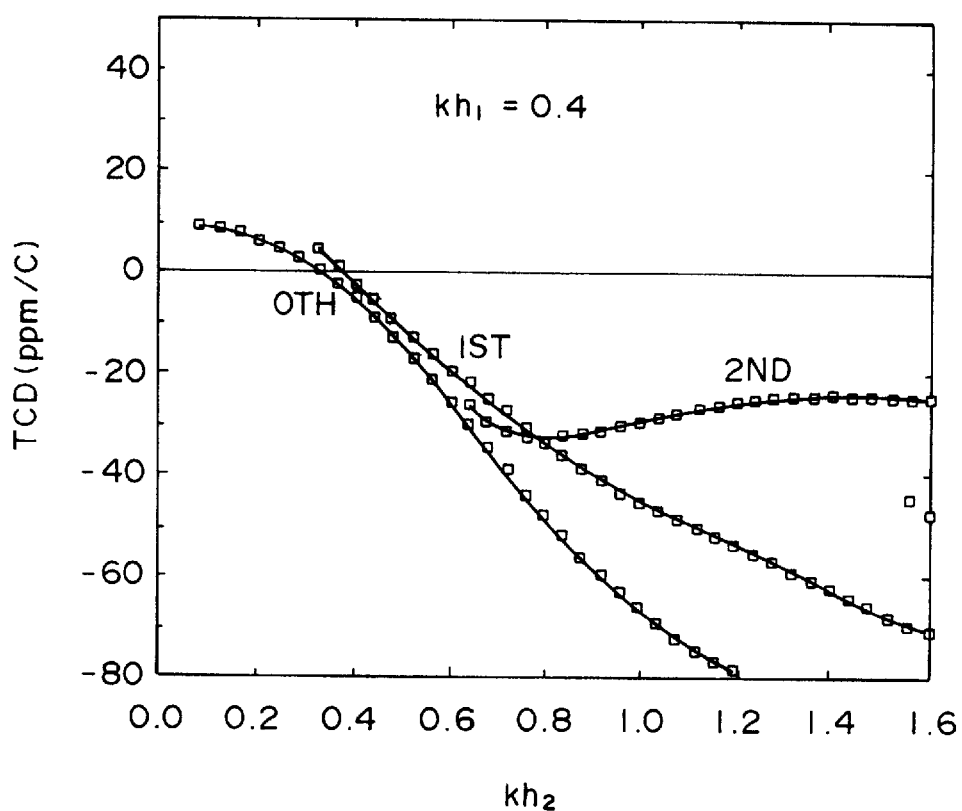
FIG. 18 is a graph showing the relationship between an SAW delay time temperature coefficient TCD and the parameter $kh_2$ in an SAW device having the layer structure 2 and the electrode arrangement A, B, C, D, E, F, or G (parameter $kh_1=0.4$)
Figure 19:
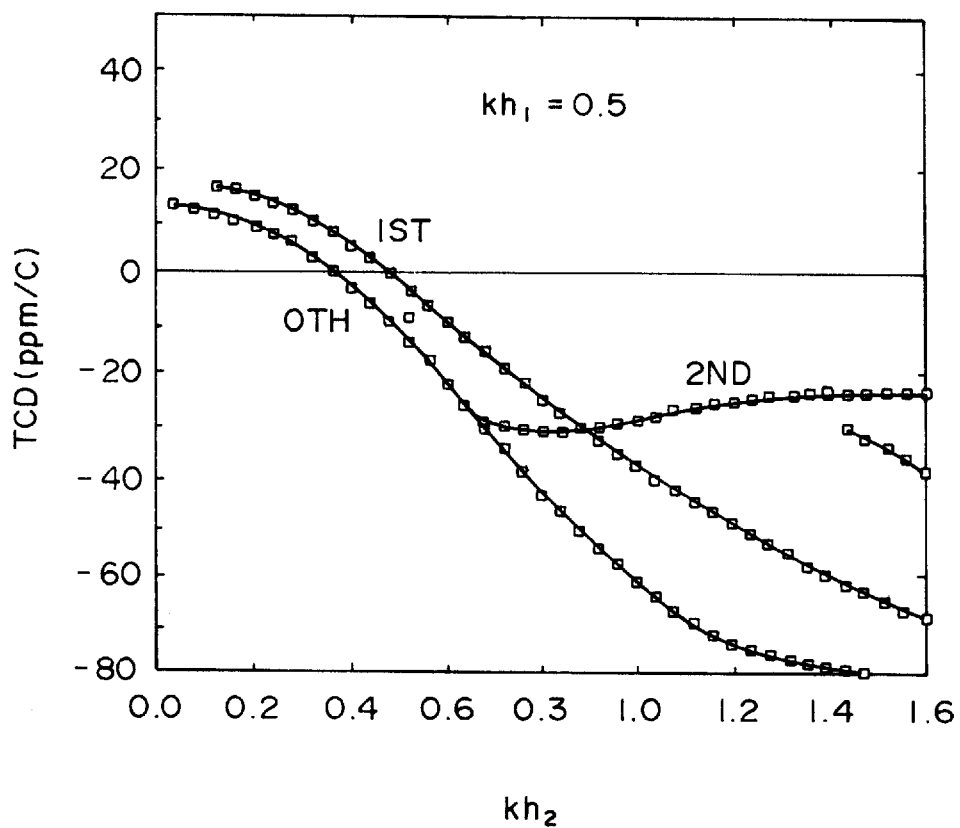
FIG. 19 is a graph showing the relationship between an SAW delay time temperature coefficient TCD and the parameter $kh_2$ in an SAW device having the layer structure 2 and the electrode arrangement A, B, C, D, E, F, or G (parameter $kh_1=0.5$)
Figure 20:
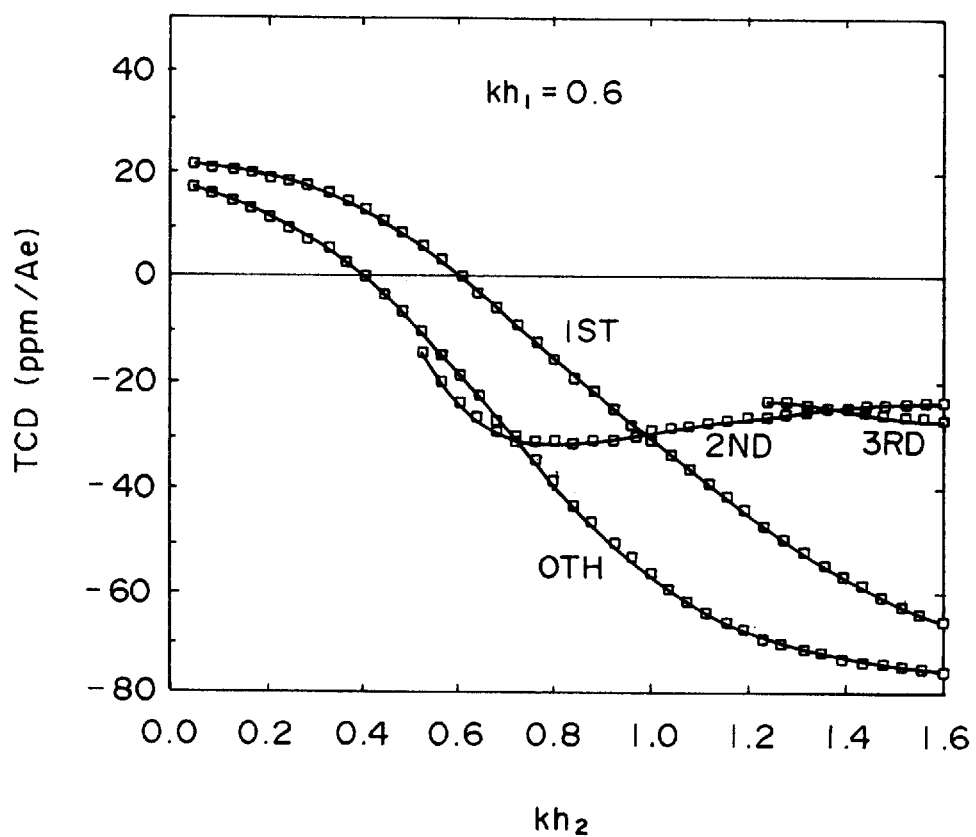
FIG. 20 is a graph showing the relationship between an SAW delay time temperature coefficient TCD and the parameter $kh_2$ in an SAW device having the layer structure 2 and the electrode arrangement A, B, C, D, E, F, or G (parameter $kh_1=0.6$)
Figure 21:
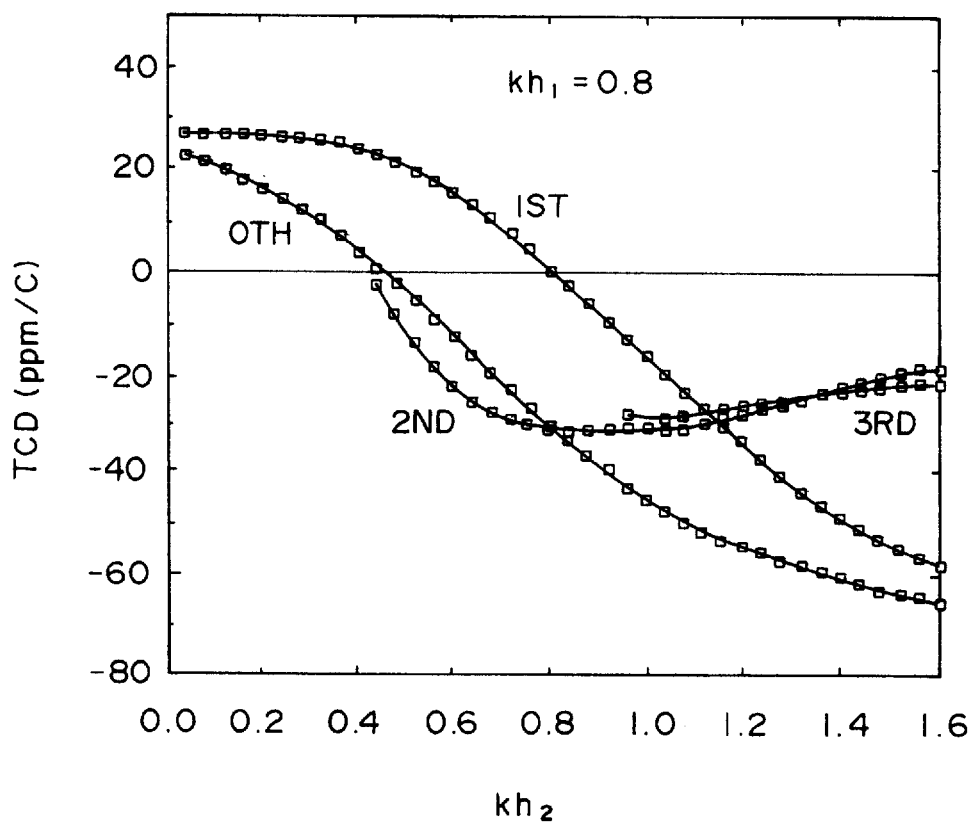
FIG. 21 is a graph showing the relationship between an SAW delay time temperature coefficient TCD and the parameter $kh_2$ in an SAW device having the layer structure 2 and the electrode arrangement A, B, C, D, E, F, or G (parameter $kh_1=0.8$)
Figure 22:
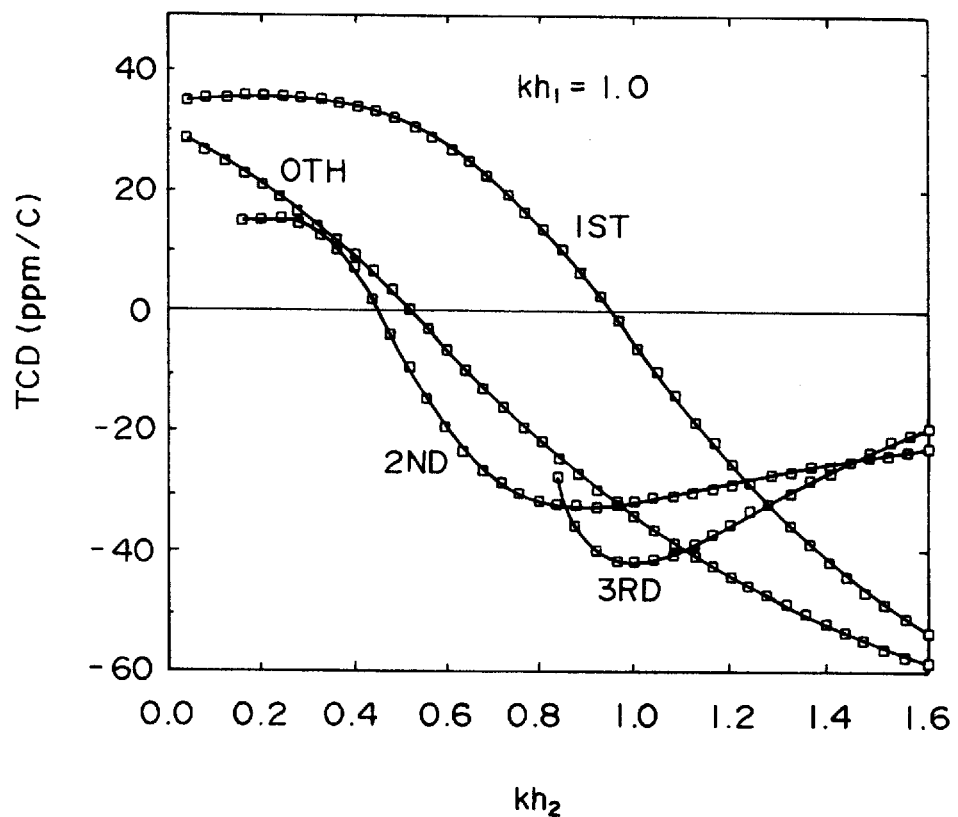
FIG. 22 is a graph showing the relationship between an SAW delay time temperature coefficient TCD and the parameter $kh_2$ in an SAW device having the layer structure 2 and the electrode arrangement A, B, C, D, E, F, or G (parameter $kh_1=1.0$)

The relation (dependency) between the delay time temperature coefficient TCD and the parameter kh$_2$, which are obtained in the above manner, is shown in a graph of FIG. 17 (kh$_1$=0.3), FIG. 18 (kh$_1$=0.4), FIG. 19 (kh$_1$=0.5), FIG. 20 (kh$_1$=0.6), FIG. 21 (kh$_1$=0.8), or FIG. 21 (kh$_1$=1.0).

Figure 23:
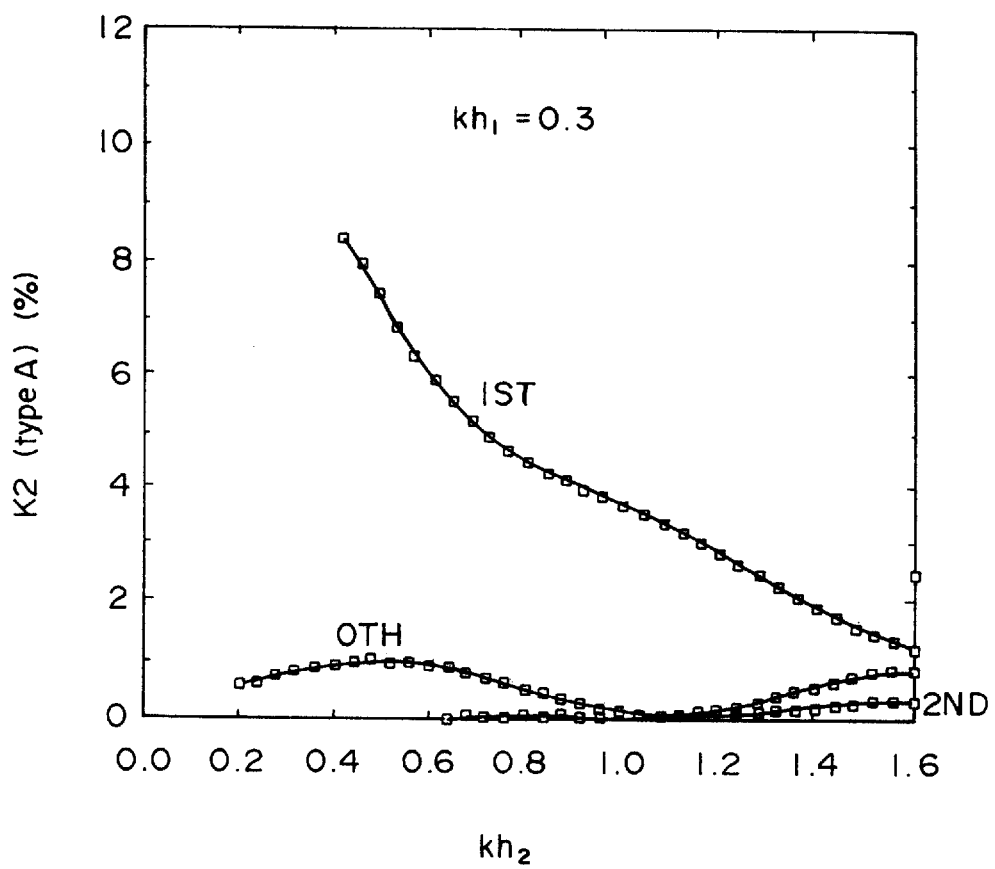
FIG. 23 is a graph showing the relationship between an SAW electromechanical coupling coefficient $K^2$ and the parameter $kh_2$ in an SAW device having the layer structure 2 and the electrode arrangement A (parameter $kh_1=0.3$).
Figure 24:
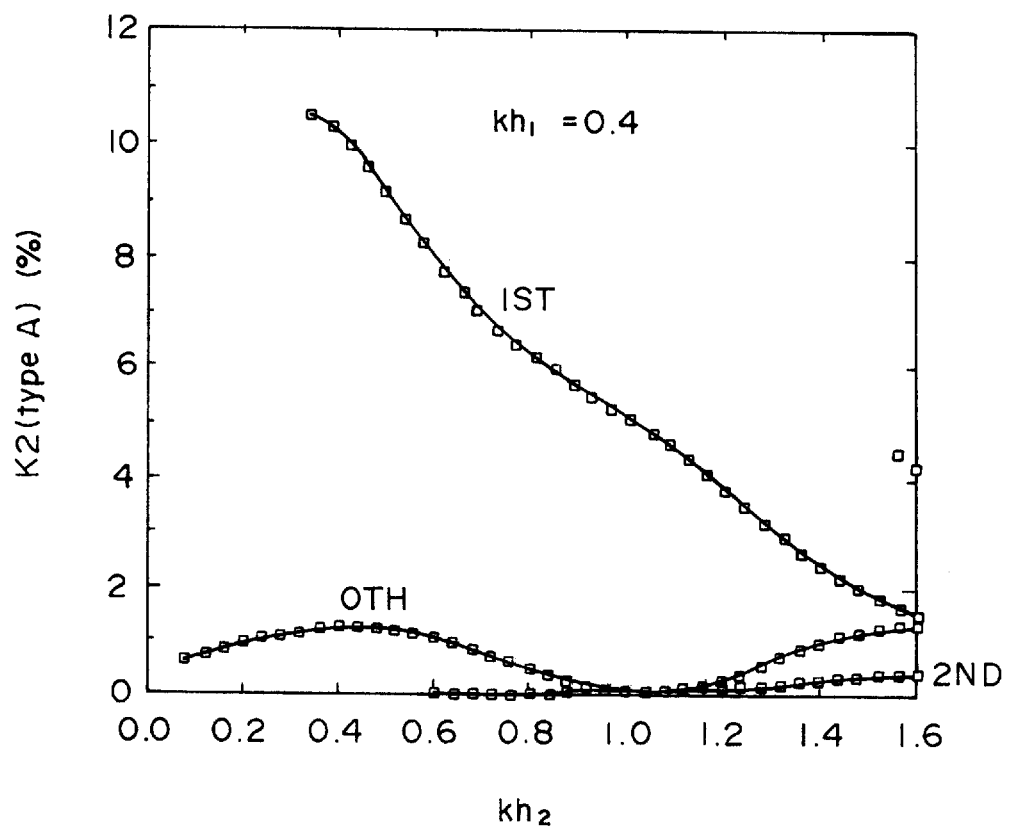
FIG. 24 is a graph showing the relationship between an SAW electromechanical coupling coefficient $K^2$ and the parameter $kh_2$ in an SAW device having the layer structure 2 and the electrode arrangement A (parameter $kh_1=0.4$).
Figure 25:
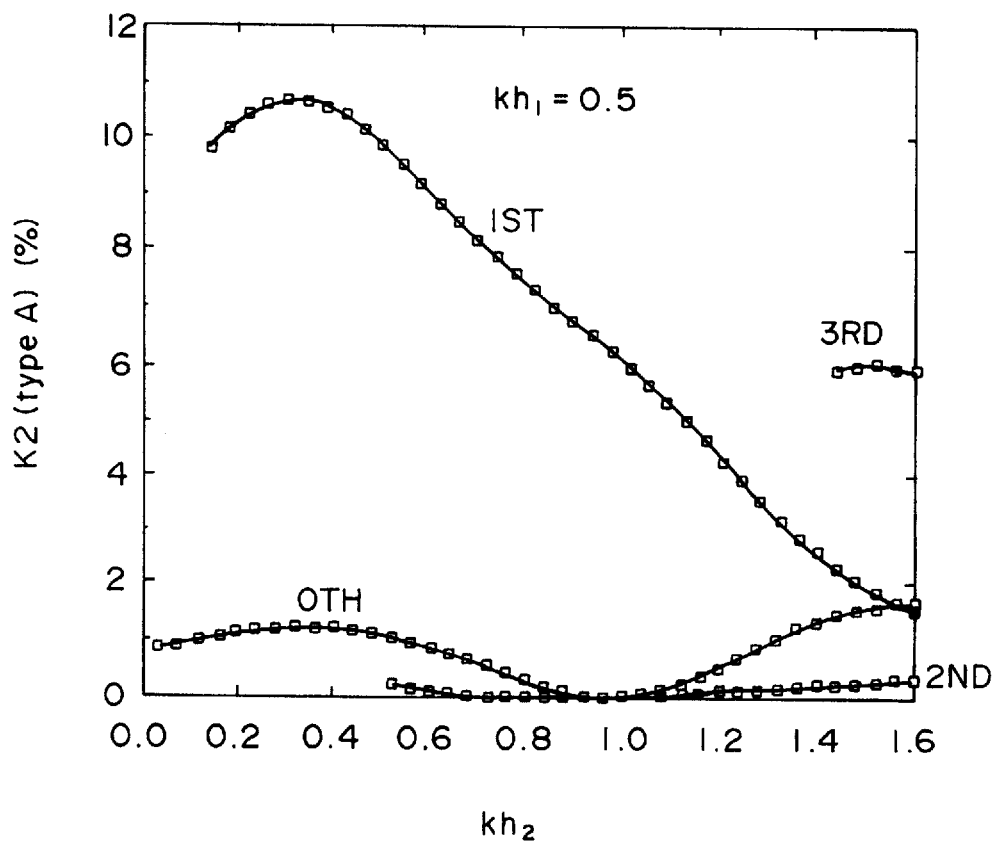
FIG. 25 is a graph showing the relationship between an SAW electromechanical coupling coefficient $K^2$ and the parameter $kh_2$ in an SAW device having the layer structure 2 and the electrode arrangement A (parameter $kh_1=0.5$).
Figure 26:
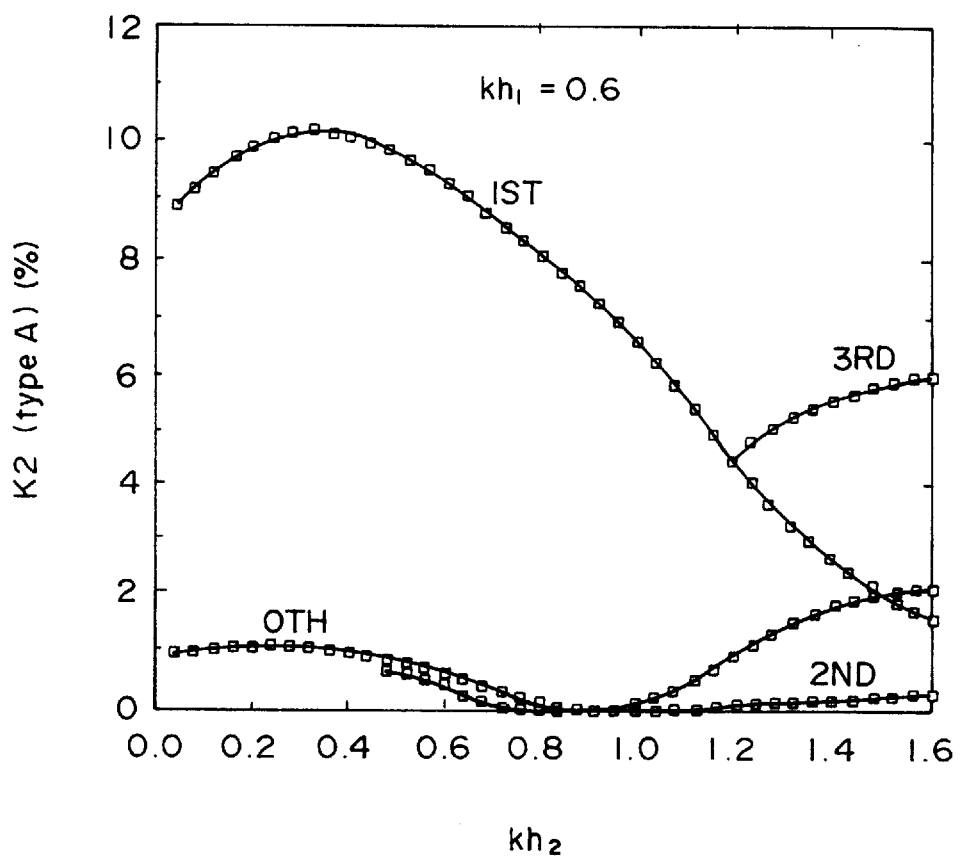
FIG. 26 is a graph showing the relationship between an SAW electromechanical coupling coefficient $K^2$ and the parameter $kh_2$ in an SAW device having the layer structure 2 and the electrode arrangement A (parameter $kh_1=0.6$).
Figure 27:
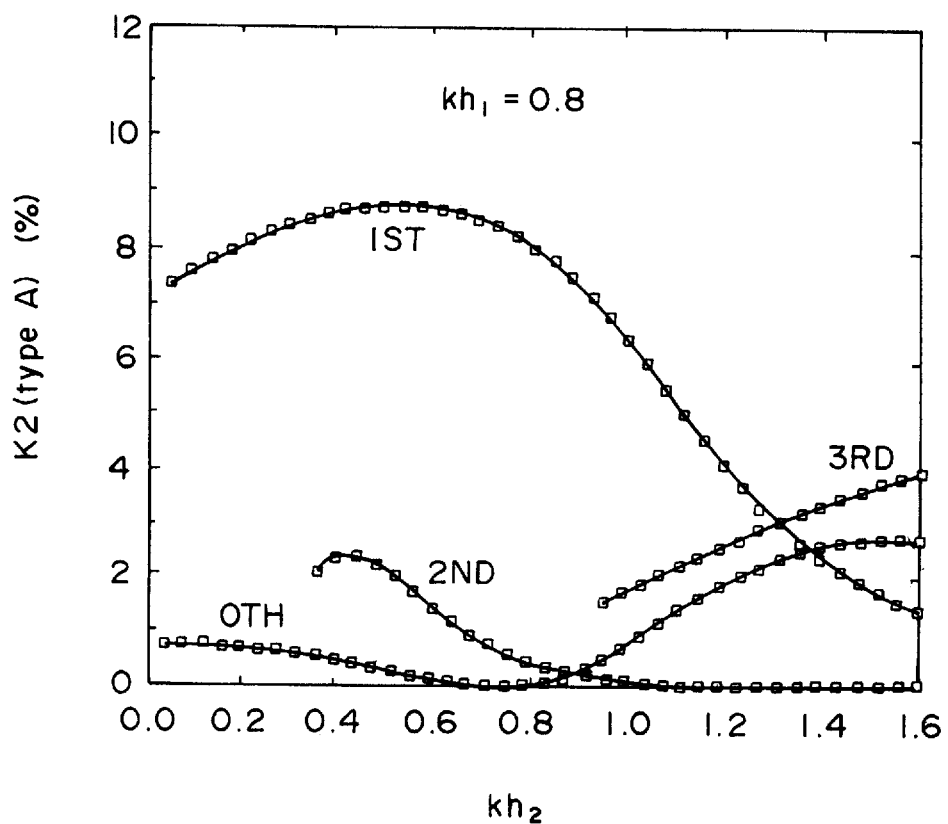
FIG. 27 is a graph showing the relationship between an SAW electromechanical coupling coefficient $K^2$ and the parameter $kh_2$ in an SAW device having the layer structure 2 and the electrode arrangement A (parameter $kh_1=0.8$).
Figure 28:
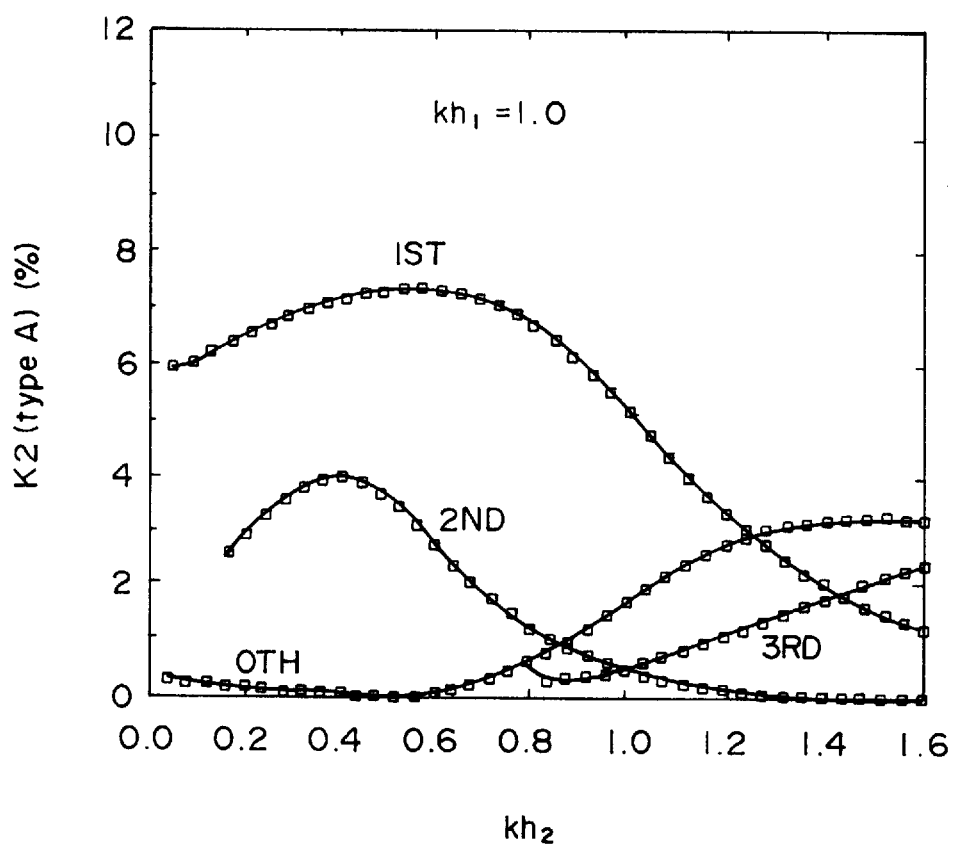
FIG. 28 is a graph showing the relationship between an SAW electromechanical coupling coefficient $K^2$ and the parameter $kh_2$ in an SAW device having the layer structure 2 and the electrode arrangement A (parameter $kh_1=1.0$).
Figure 29:
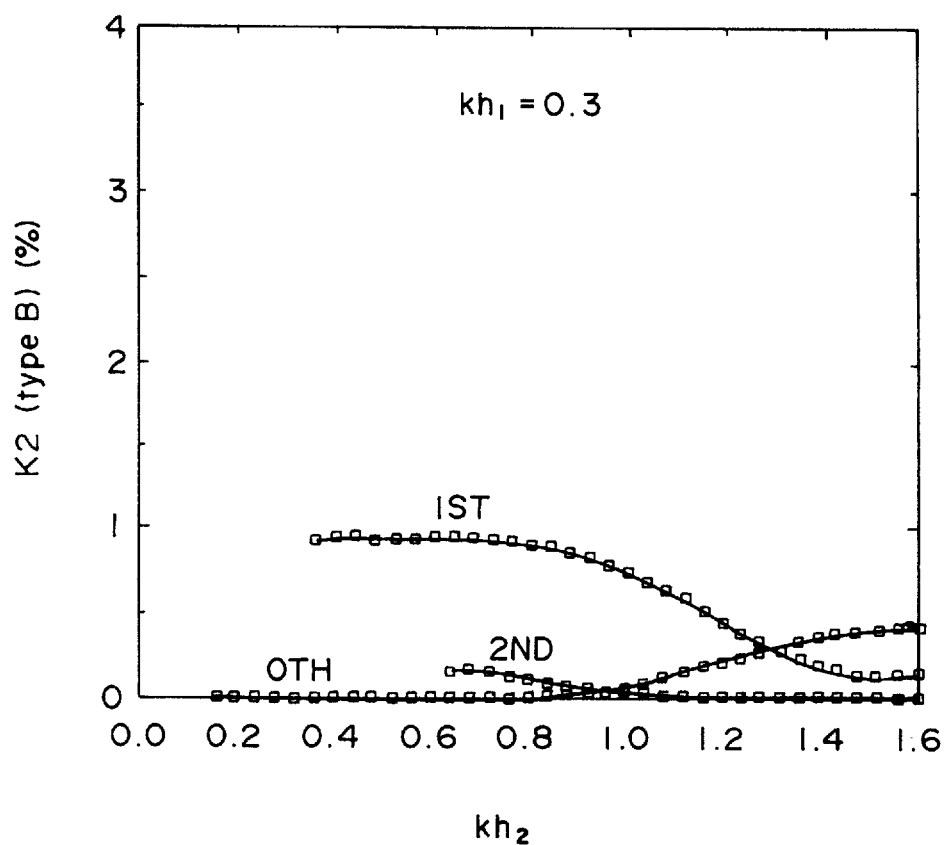
FIG. 29 is a graph showing the relationship between an SAW electromechanical coupling coefficient $K^2$ and the parameter $kh_2$ in an SAW device having the layer structure 2 and the electrode arrangement B (parameter $kh_1=0.3$).
Figure 30:
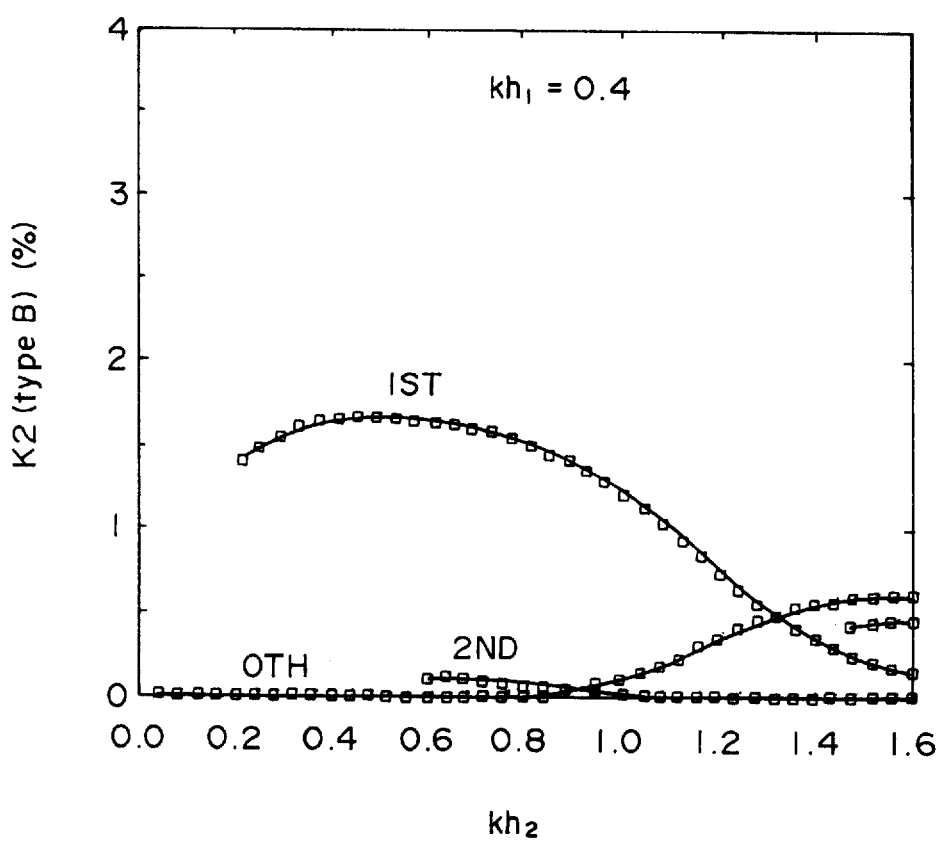
FIG. 30 is a graph showing the relationship between an SAW electromechanical coupling coefficient $K^2$ and the parameter $kh_2$ in an SAW device having the layer structure 2 and the electrode arrangement B (parameter $kh_1=0.4$).
Figure 31:
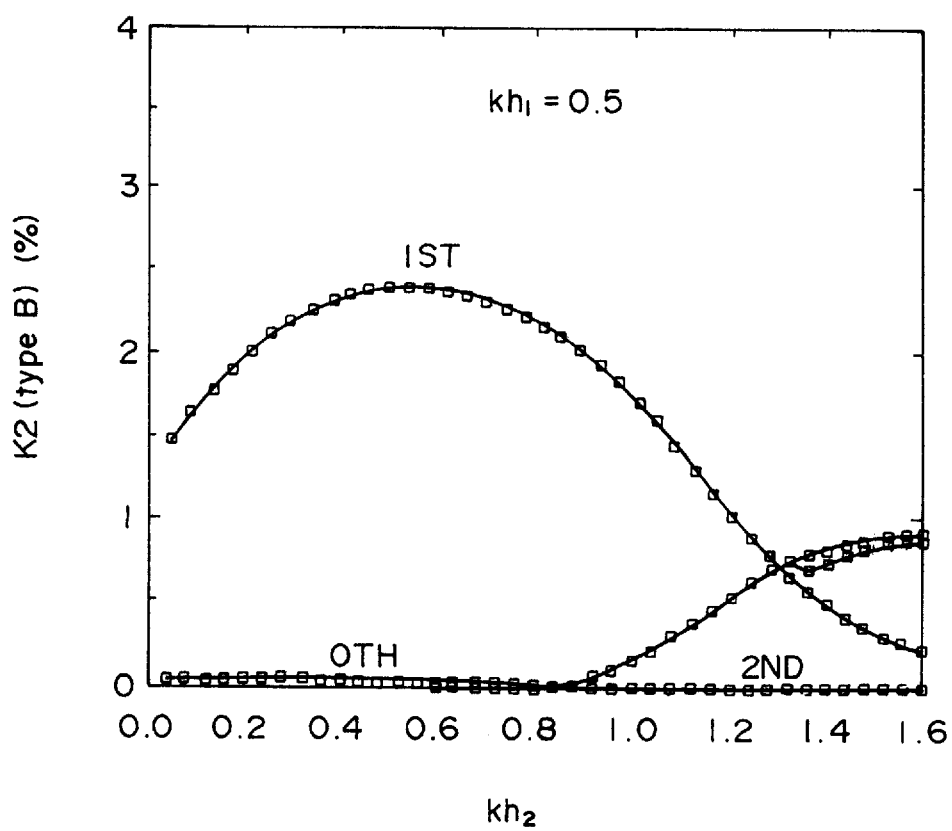
FIG. 31 is a graph showing the relationship between an SAW electromechanical coupling coefficient $K^2$ and the parameter $kh_2$ in an SAW device having the layer structure 2 and the electrode arrangement B (parameter $kh_1=0.5$).
Figure 32:
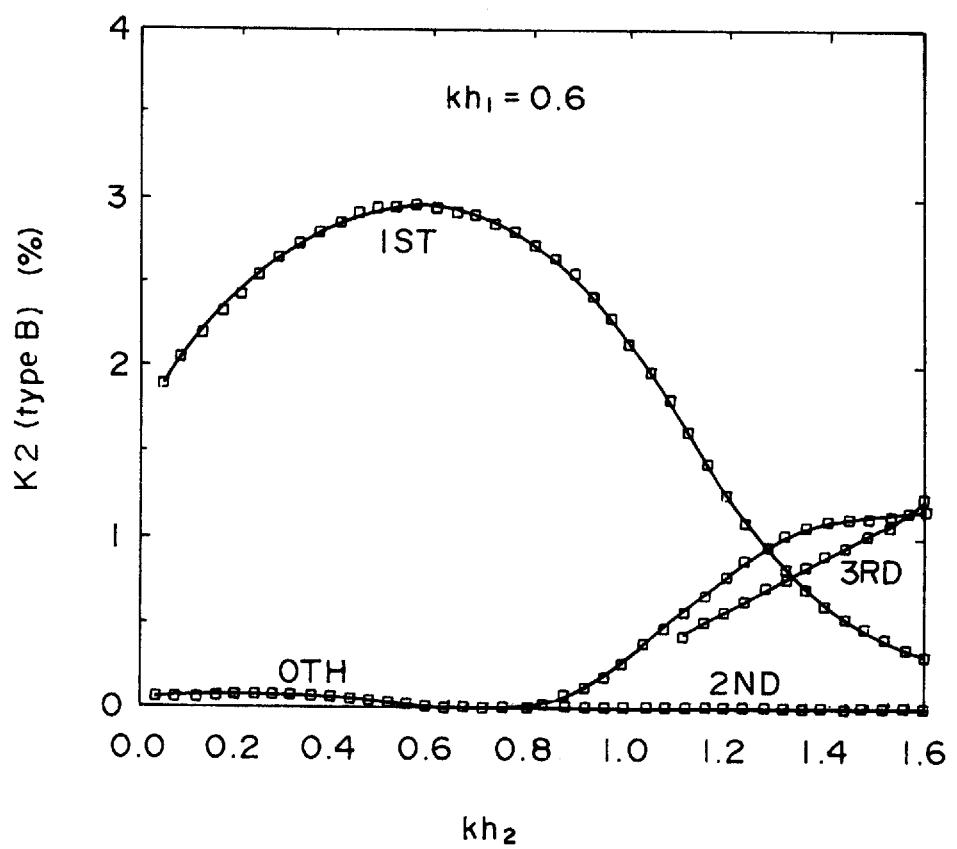
FIG. 32 is a graph showing the relationship between an SAW electromechanical coupling coefficient $K^2$ and the parameter $kh_2$ in an SAW device having the layer structure 2 and the electrode arrangement B (parameter $kh_1=0.6$).
Figure 33:
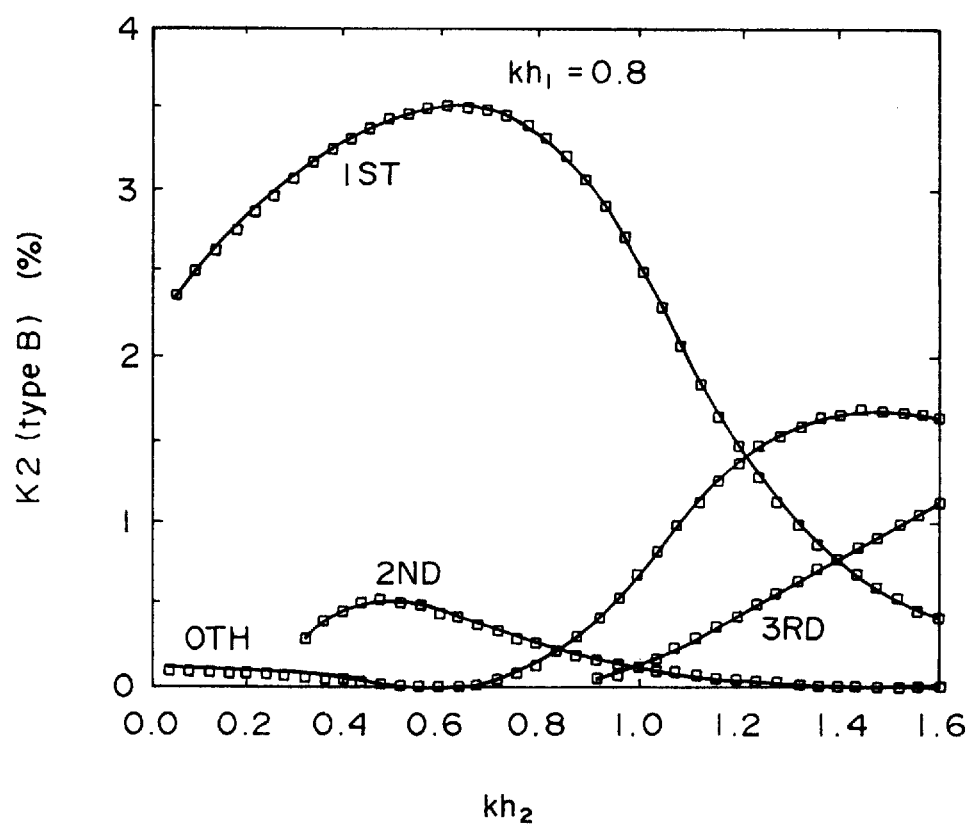
FIG. 33 is a graph showing the relationship between an SAW electromechanical coupling coefficient $K^2$ and the parameter $kh_2$ in an SAW device having the layer structure 2 and the electrode arrangement B (parameter $kh_1=0.8$).
Figure 34:
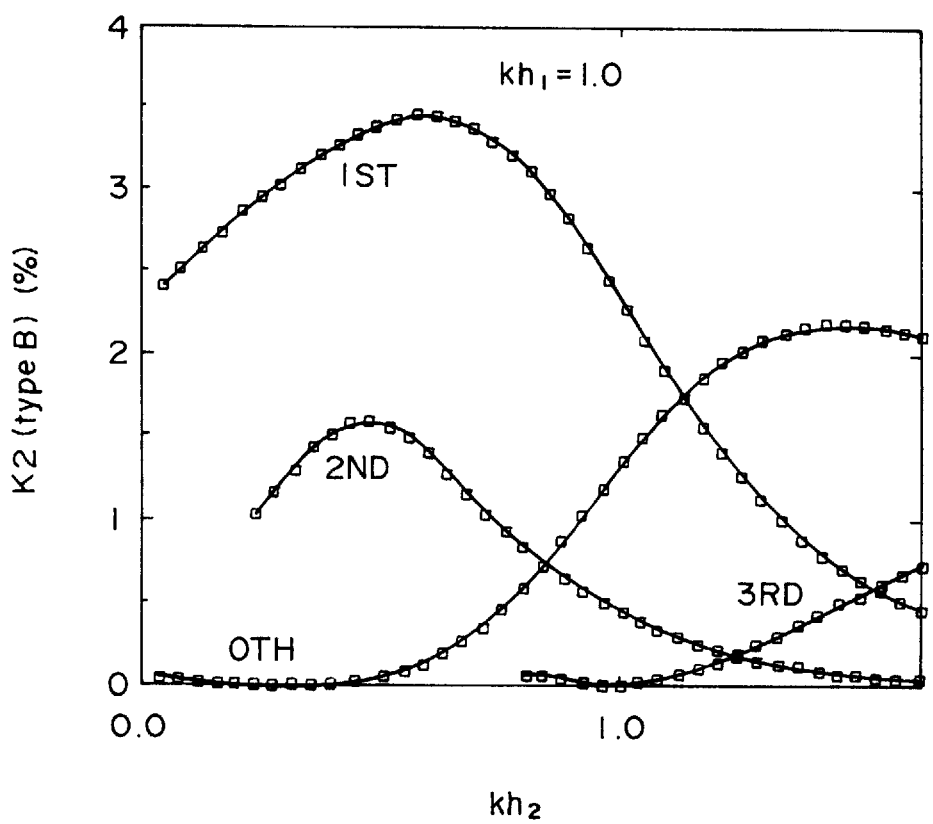
FIG. 34 is a graph showing the relationship between an SAW electromechanical coupling coefficient $K^2$ and the parameter $kh_1$ in an SAW device having the layer structure 2 and the electrode arrangement B (parameter $kh_1=1.0$).
Figure 35:
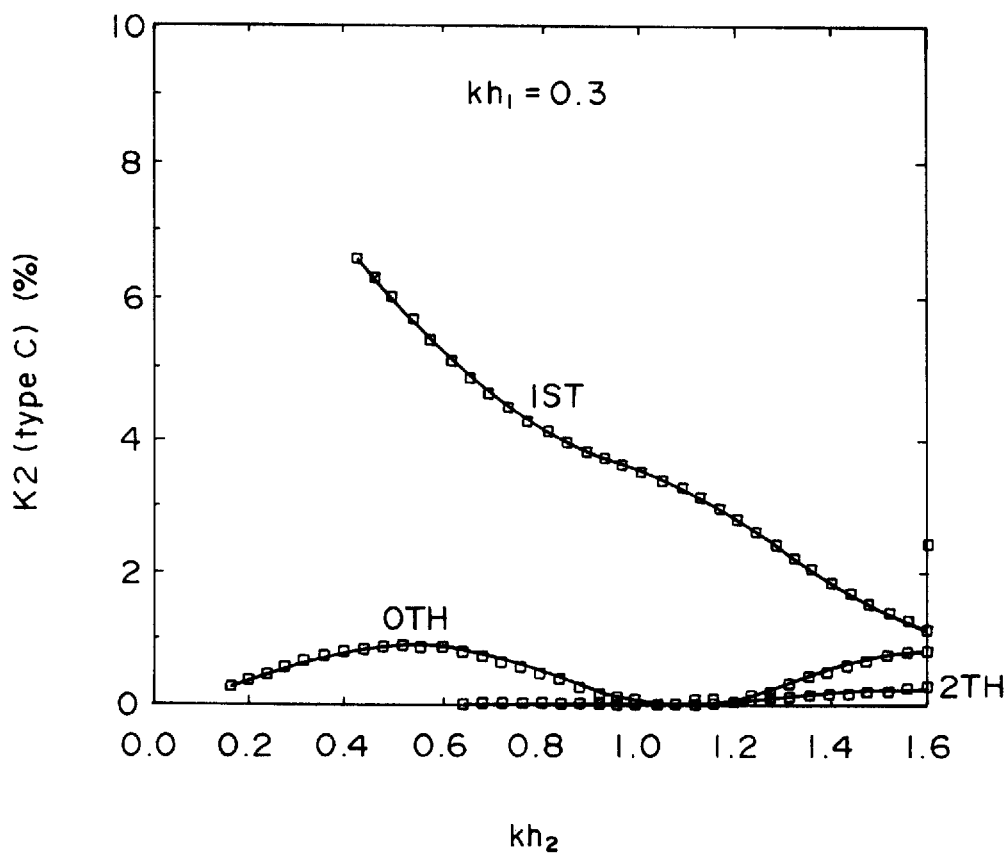
FIG. 35 is a graph showing the relationship between an SAW electromechanical coupling coefficient $K^2$ and the parameter $kh_2$ in an SAW device having the layer structure 2 and the electrode arrangement C (parameter $kh_1=0.3$).
Figure 36:
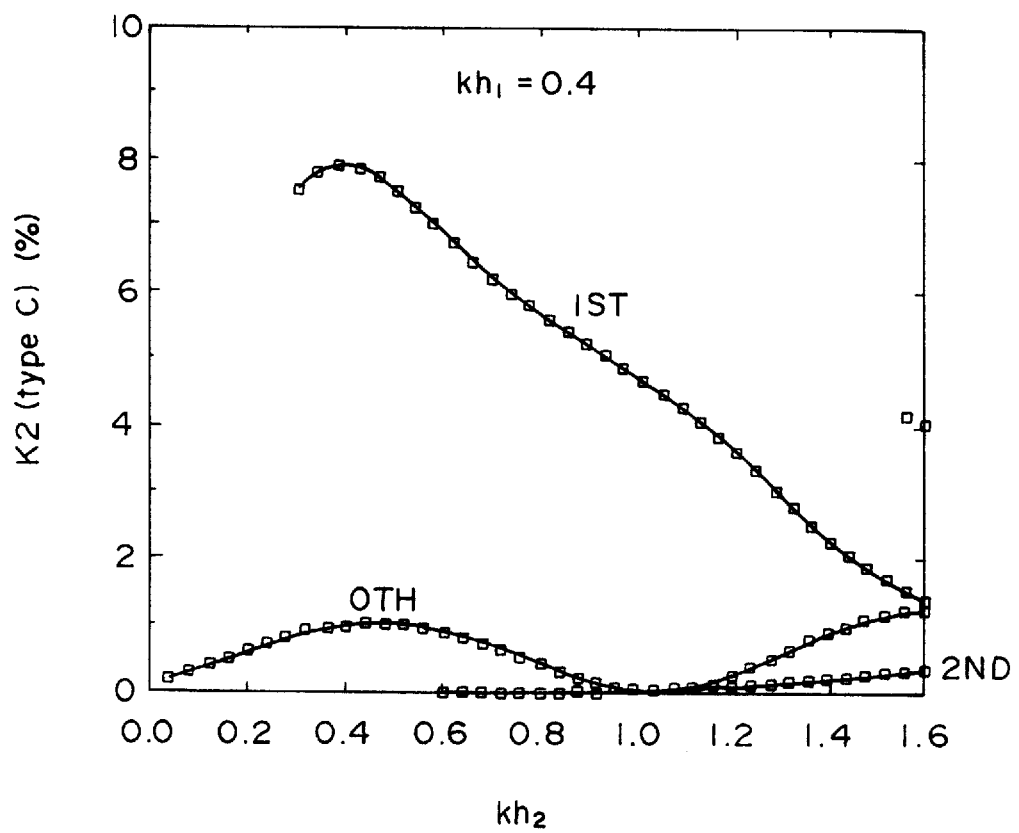
FIG. 36 is a graph showing the relationship between an SAW electromechanical coupling coefficient $K^2$ and the parameter $kh_2$ in an SAW device having the layer structure 2 and the electrode arrangement C (parameter $kh_1=0.4$).
Figure 37:
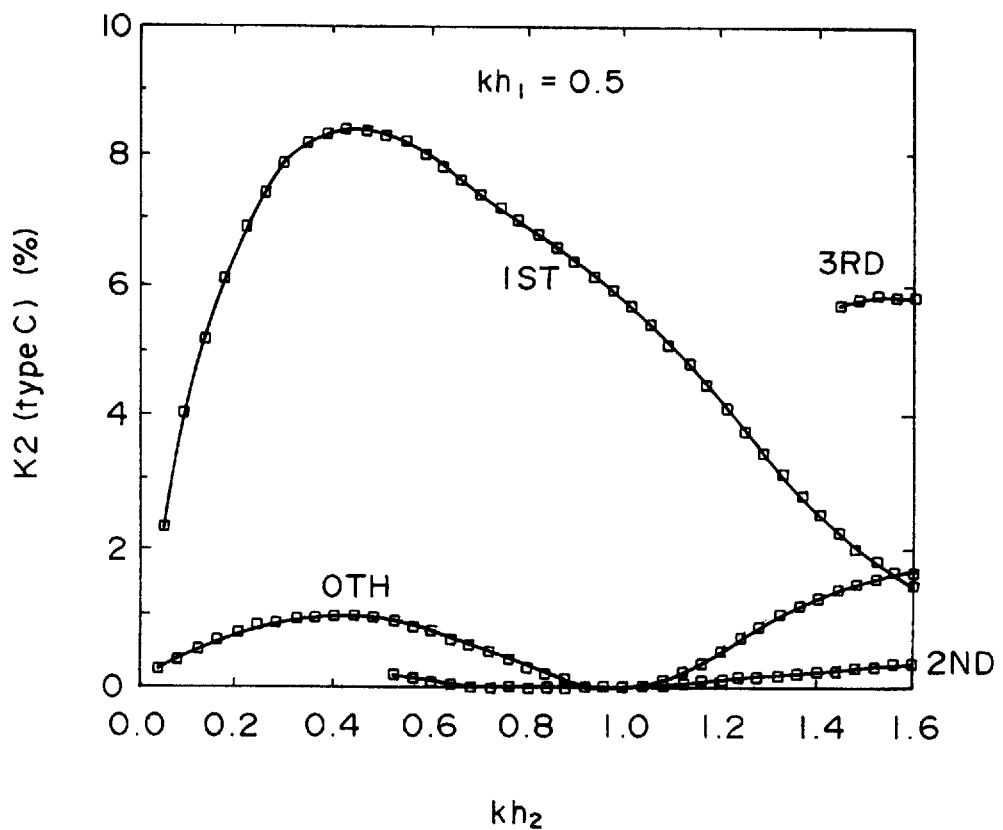
FIG. 37 is a graph showing the relationship between an SAW electromechanical coupling coefficient $K^2$ and the parameter $kh_2$ in an SAW device having the layer structure 2 and the electrode arrangement C (parameter $kh_1=0.5$).
Figure 38:
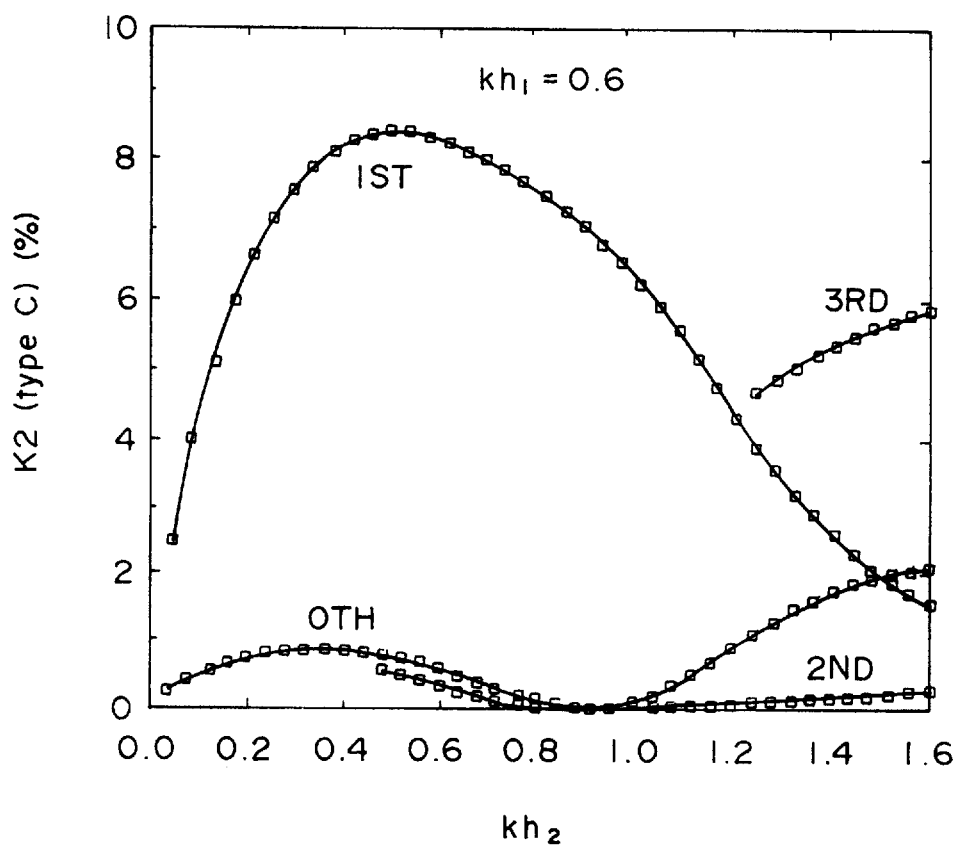
FIG. 38 is a graph showing the relationship between an SAW electromechanical coupling coefficient $K^2$ and the parameter $kh_2$ in an SAW device having the layer structure 2 and the electrode arrangement C (parameter $kh_1=0.6$).
Figure 39:
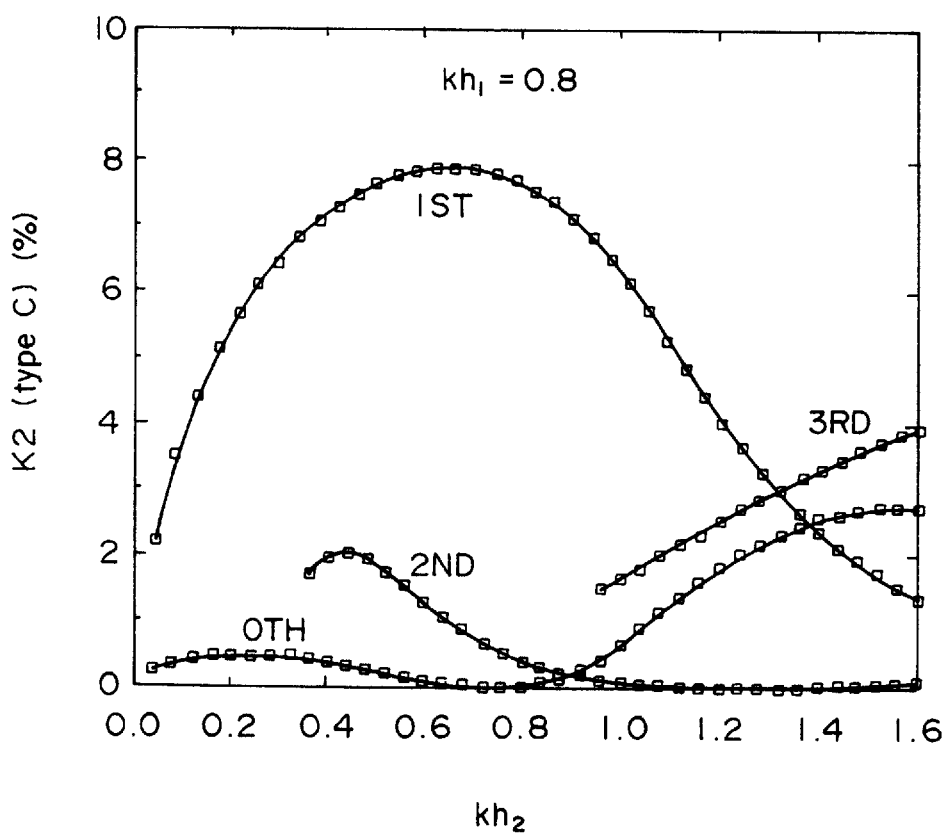
FIG. 39 is a graph showing the relationship between an SAW electromechanical coupling coefficient $K^2$ and the parameter $kh_2$ in an SAW device having the layer structure 2 and the electrode arrangement C (parameter $kh_1=0.8$).
Figure 40:
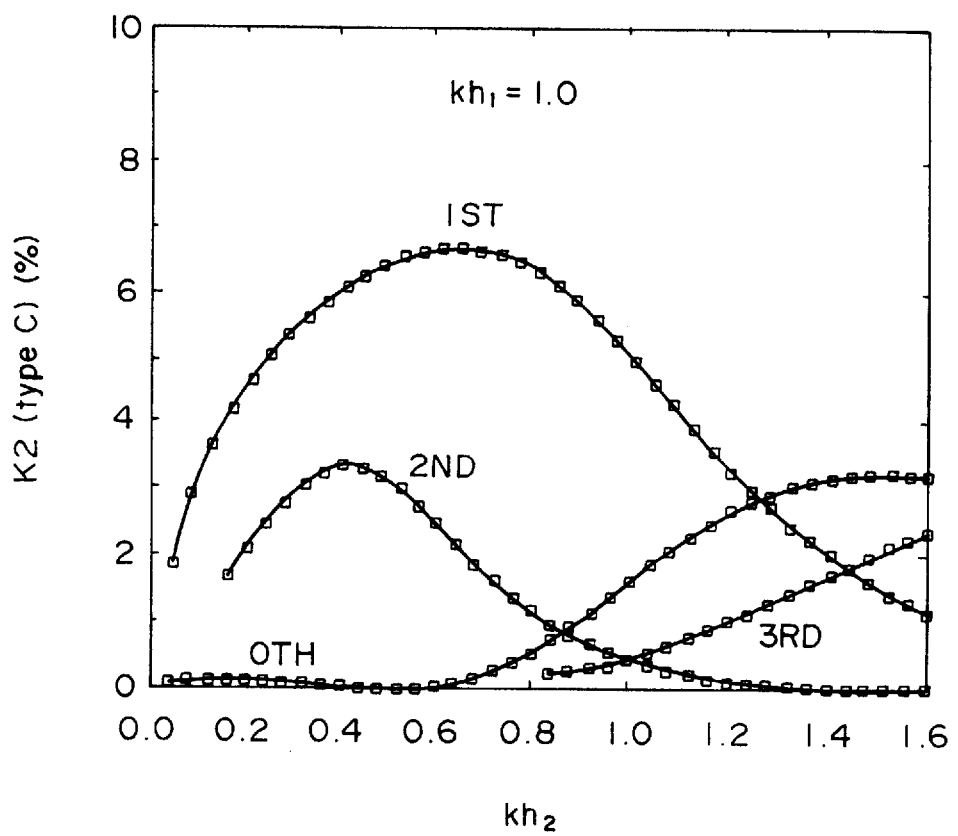
FIG. 40 is a graph showing the relationship between an SAW electromechanical coupling coefficient $K^2$ and the parameter $kh_2$ in an SAW device having the layer structure 2 and the electrode arrangement C (parameter $kh_1=1.0$).
Figure 41:
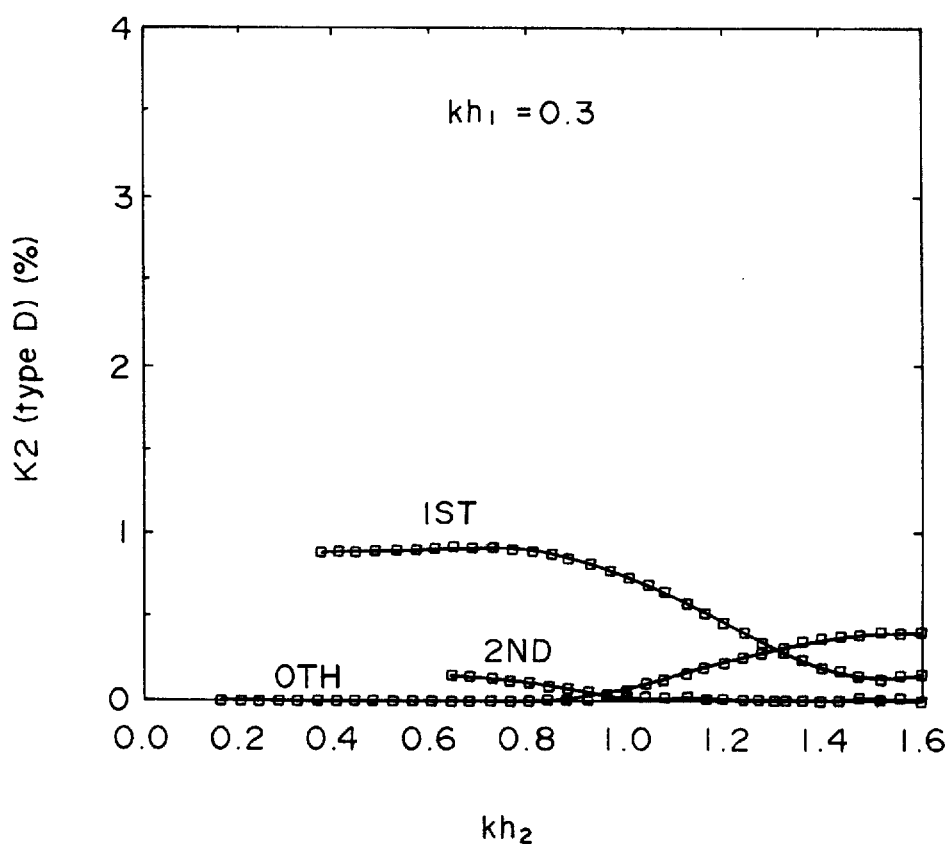
FIG. 41 is a graph showing the relationship between an SAW electromechanical coupling coefficient $K^2$ and the parameter $kh_2$ in an SAW device having the layer structure 2 and the electrode arrangement D (parameter $kh_1=0.3$).
Figure 42:
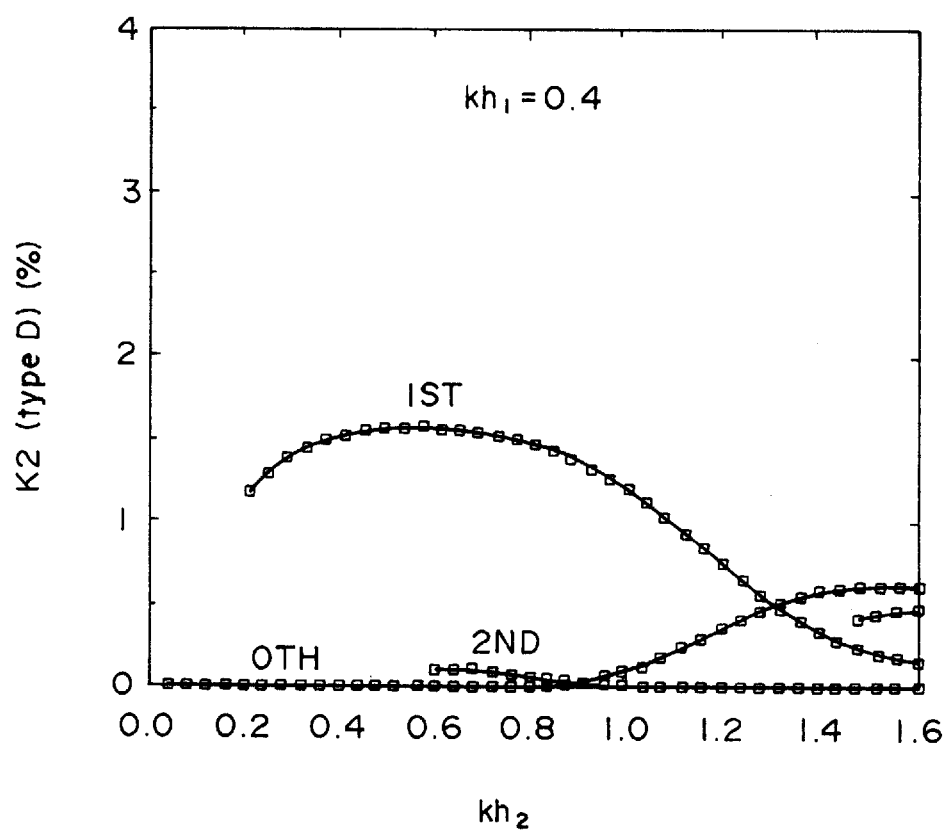
FIG. 42 is a graph showing the relationship between an SAW electromechanical coupling coefficient $K^2$ and the parameter $kh_2$ in an SAW device having the layer structure 2 and the electrode arrangement D (parameter $kh_1=0.4$).
Figure 43:
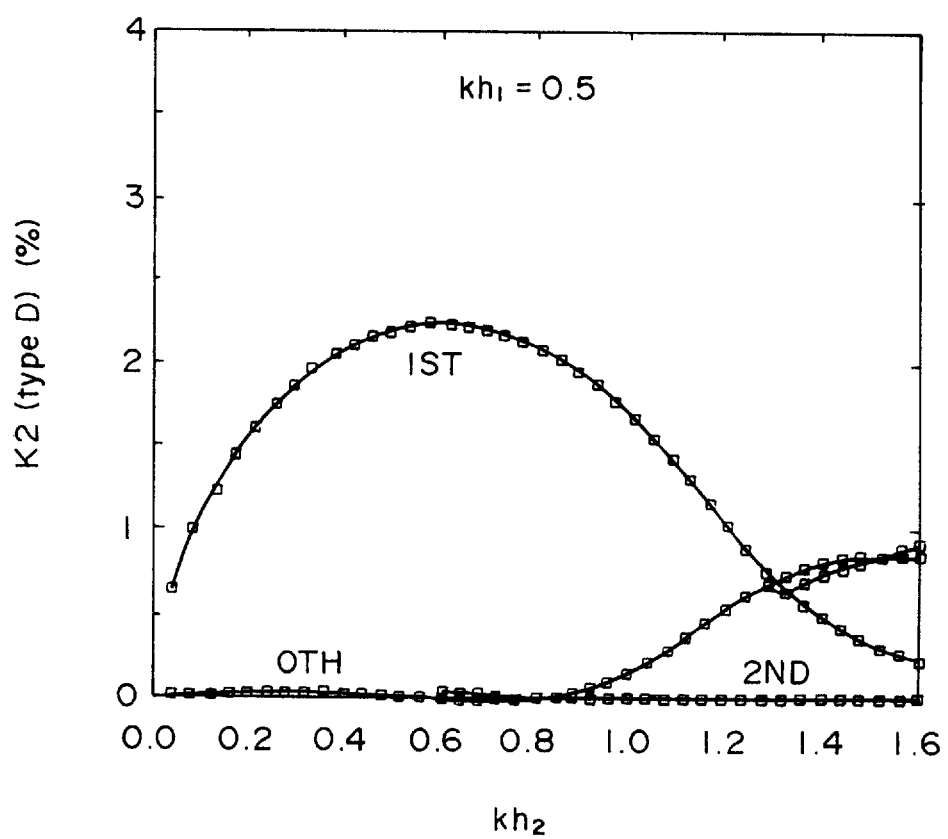
FIG. 43 is a graph showing the relationship between an SAW electromechanical coupling coefficient $K^2$ and the parameter $kh_1$ in an SAW device having the layer structure 2 and the electrode arrangement D (parameter $kh_1=0.5$).
Figure 44:
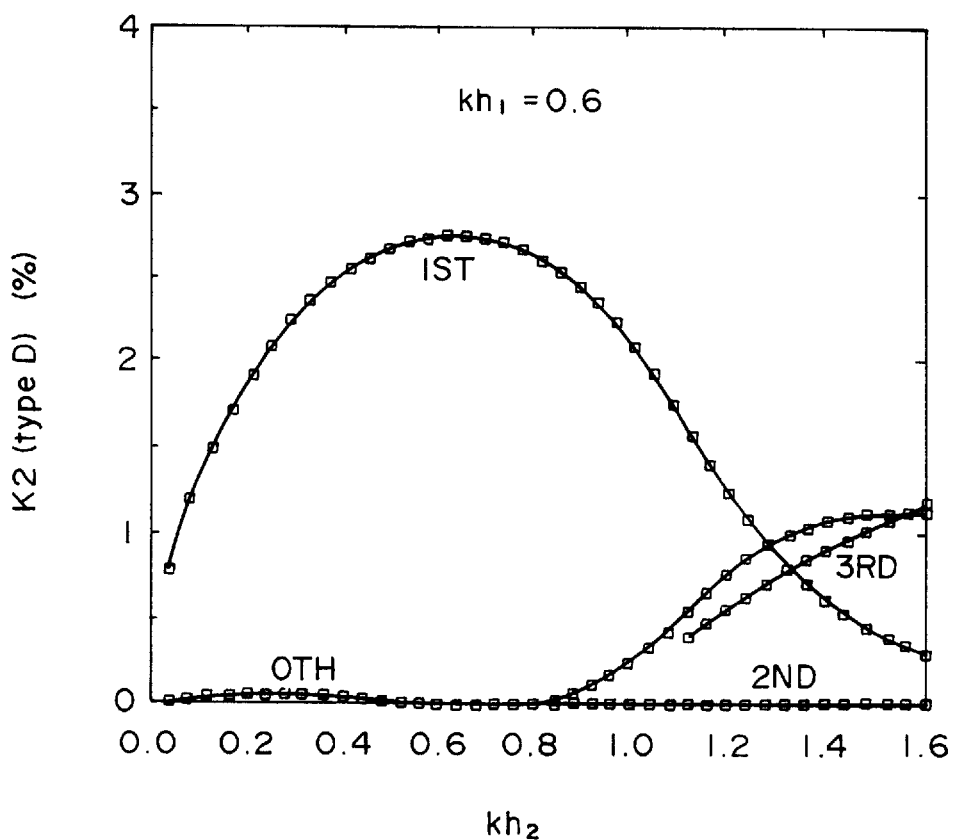
FIG. 44 is a graph showing the relationship between an SAW electromechanical coupling coefficient $K^2$ and the parameter $kh_2$ in an SAW device having the layer structure 2 and the electrode arrangement D (parameter $kh_1=0.6$).
Figure 45:
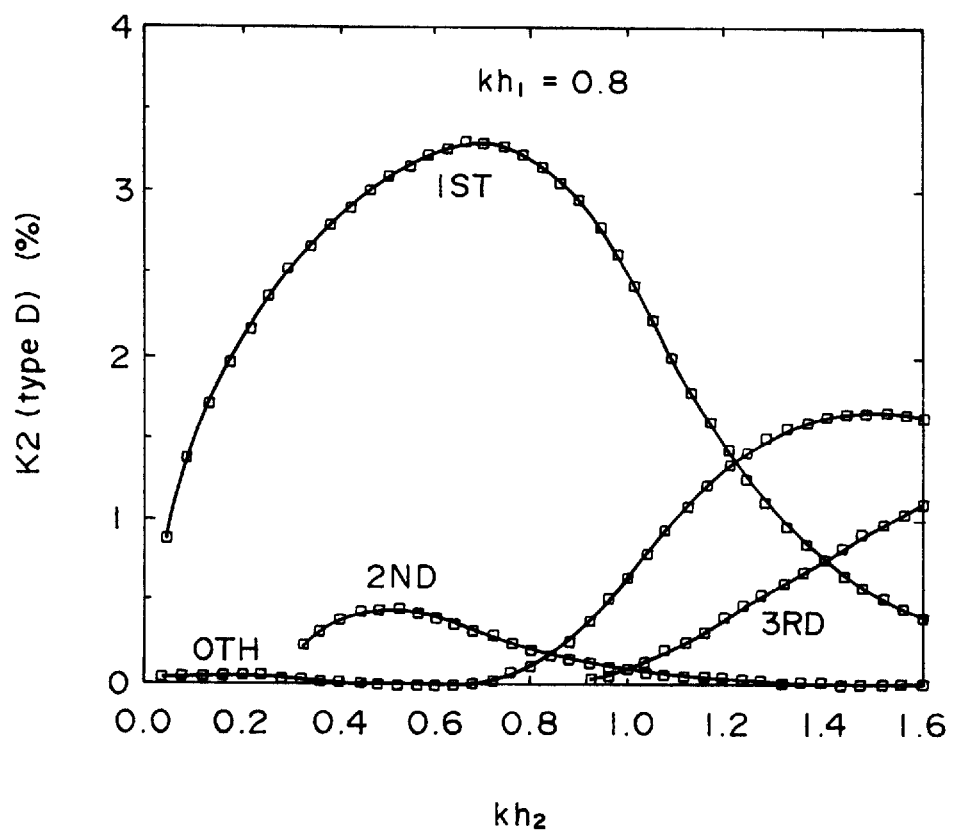
FIG. 45 is a graph showing the relationship between an SAW electromechanical coupling coefficient $K^2$ and the parameter $kh_2$ in an SAW device having the layer structure 2 and the electrode arrangement D (parameter $kh_1=0.8$).
Figure 46:
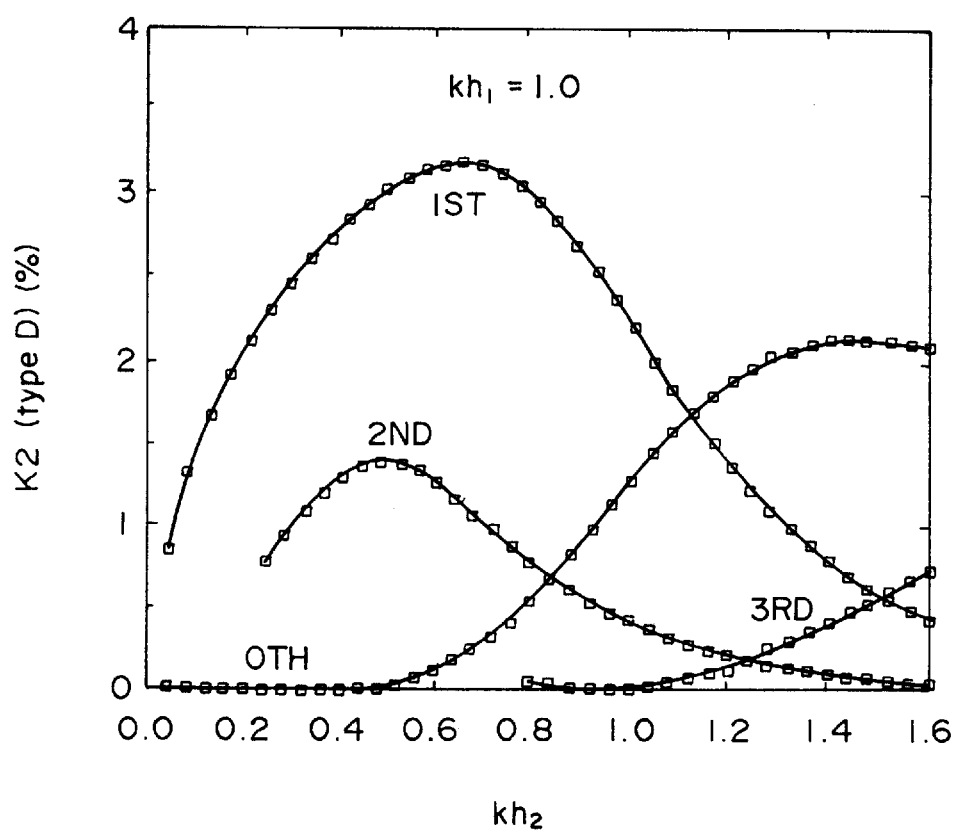
FIG. 46 is a graph showing the relationship between an SAW electromechanical coupling coefficient $K^2$ and the parameter $kh_2$ in an SAW device having the layer structure 2 and the electrode arrangement D (parameter $kh_1=1.0$).
Figure 47:
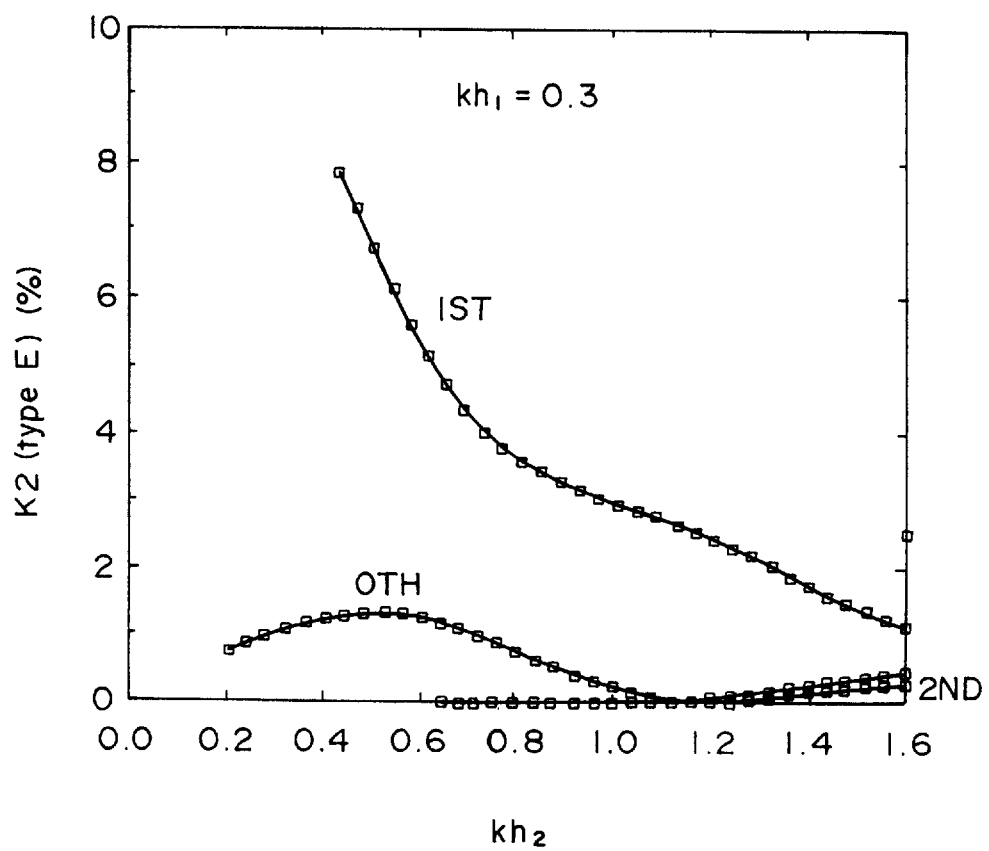
FIG. 47 is a graph showing the relationship between an SAW electromechanical coupling coefficient $K^2$ and the parameter $kh_2$ in an SAW device having the layer structure 2 and the electrode arrangement E (parameter $kh_1=0.3$).
Figure 48:
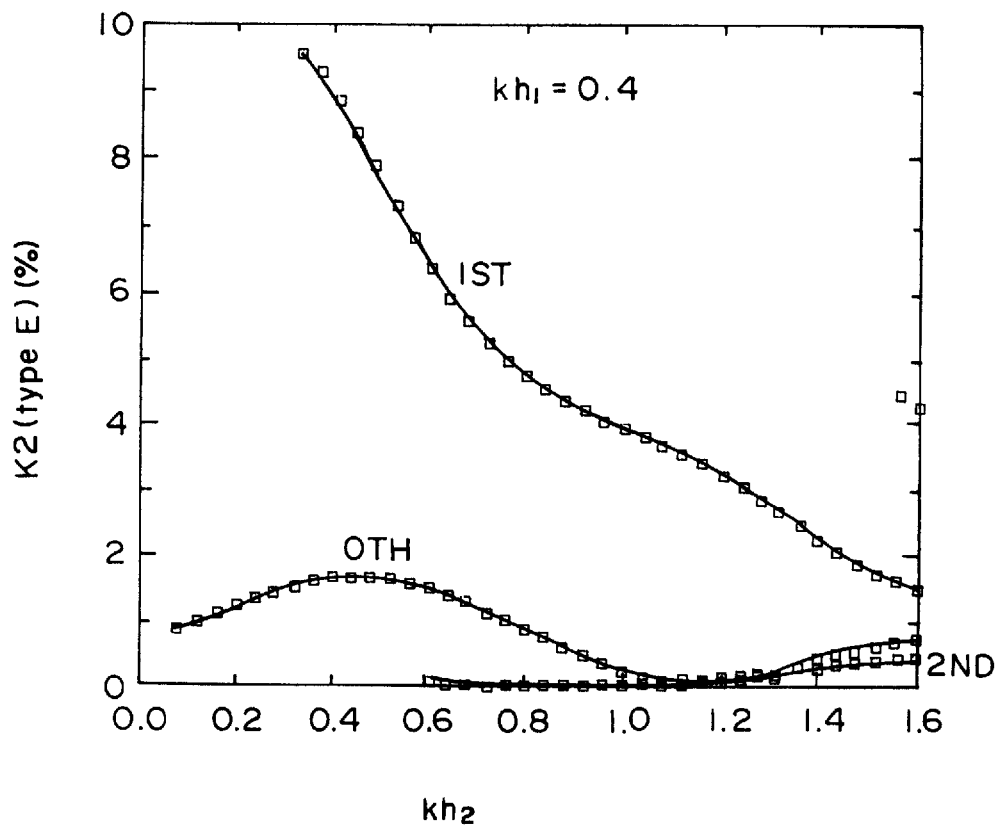
FIG. 48 is a graph showing the relationship between an SAW electromechanical coupling coefficient $K^2$ and the parameter $kh_2$ in an SAW device having the layer structure 2 and the electrode arrangement E (parameter $kh_1=0.4$).
Figure 49:
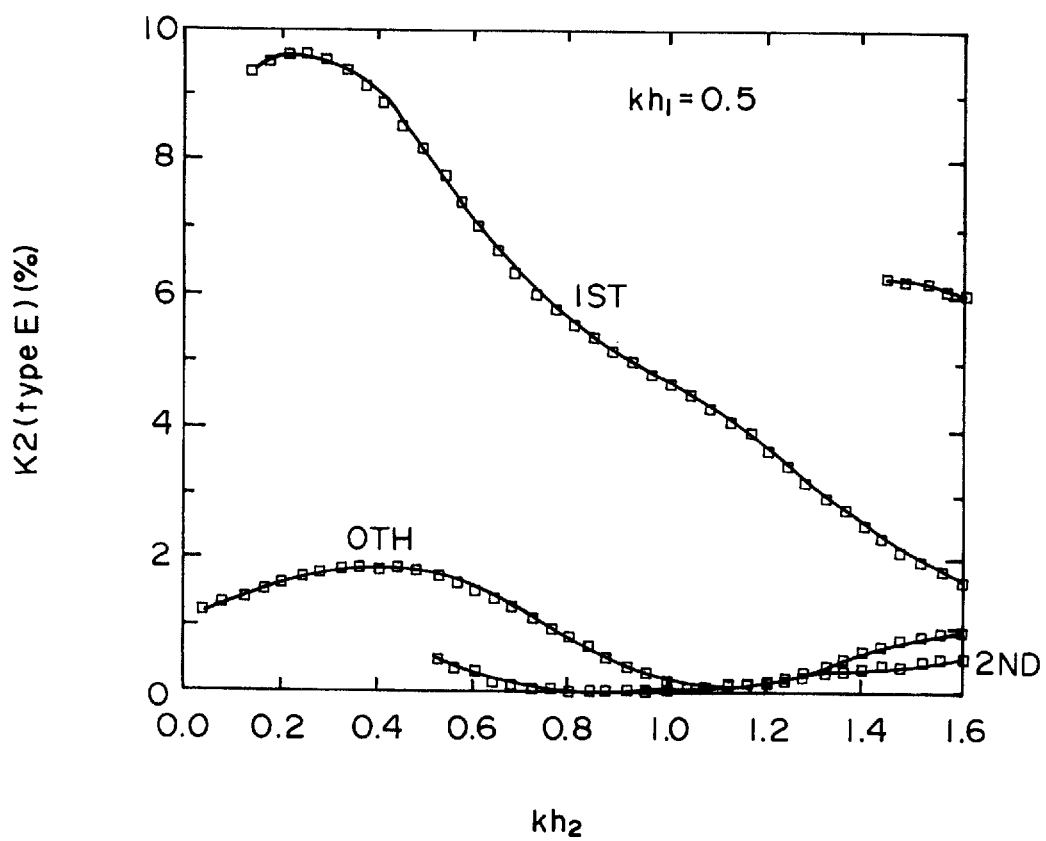
FIG. 49 is a graph showing the relationship between an SAW electromechanical coupling coefficient $K^2$ and the parameter $kh_2$ in an SAW device having the layer structure 2 and the electrode arrangement E (parameter $kh_1=0.5$).
Figure 50:
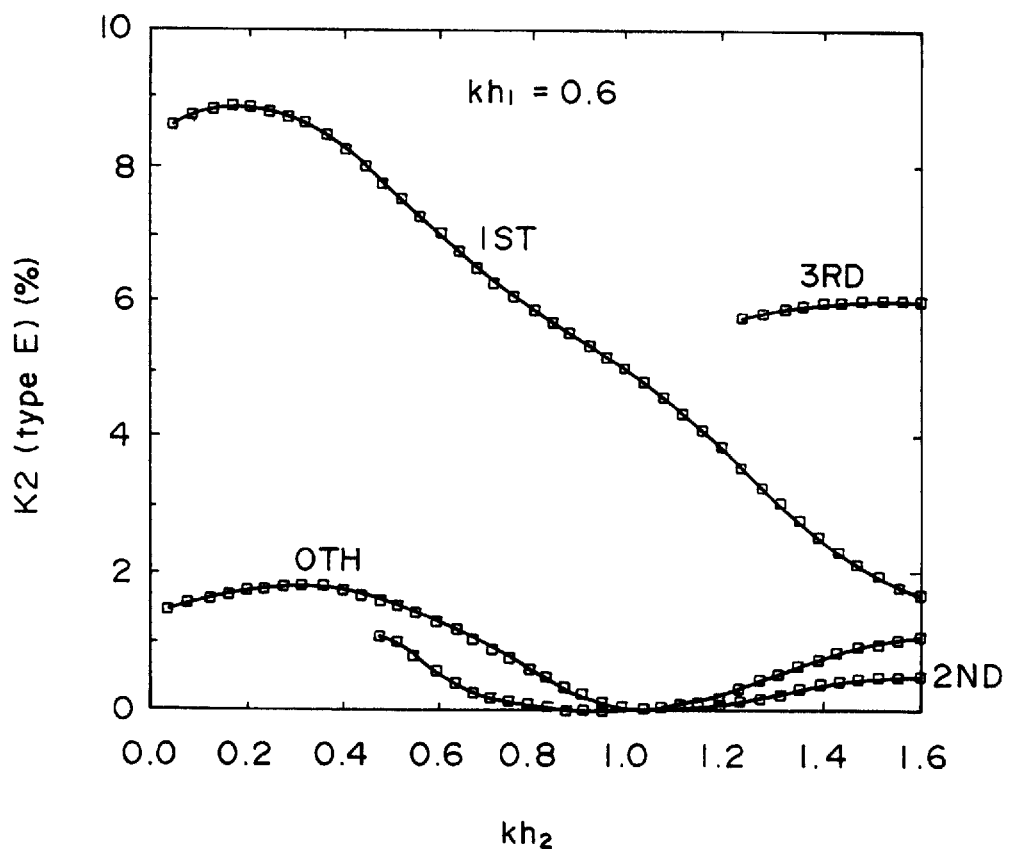
FIG. 50 is a graph showing the relationship between an SAW electromechanical coupling coefficient $K^2$ and the parameter $kh_2$ in an SAW device having the layer structure 2 and the electrode arrangement E (parameter $kh_1=0.6$).
Figure 51:
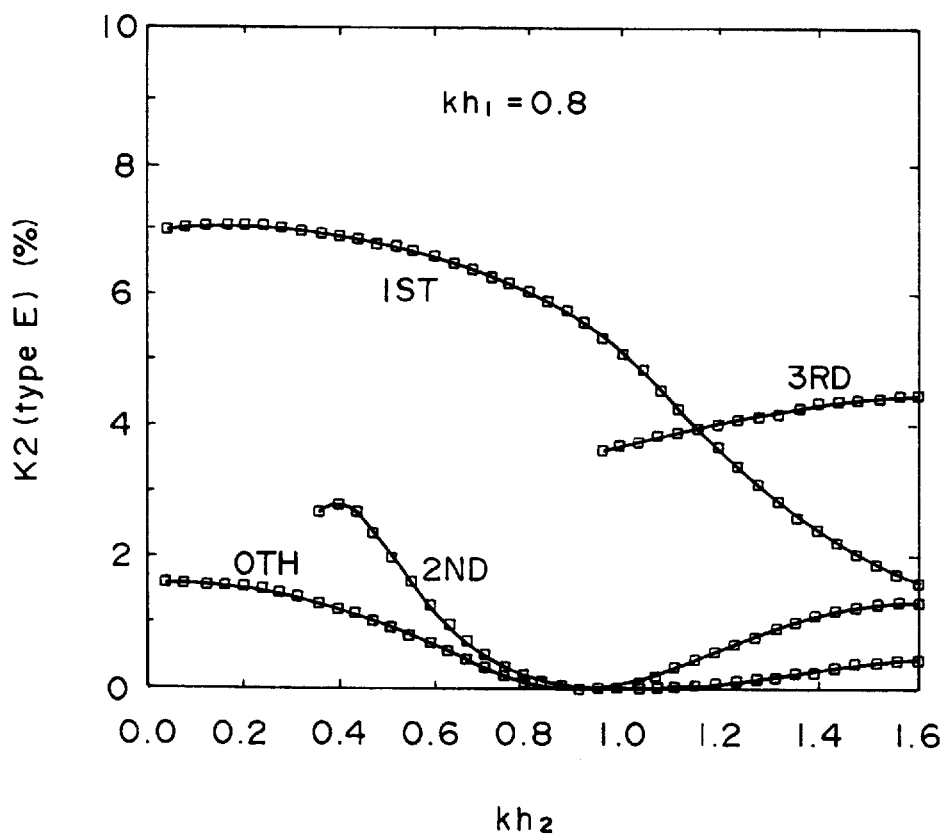
FIG. 51 is a graph showing the relationship between an SAW electromechanical coupling coefficient $K^2$ and the parameter $kh_2$ in an SAW device having the layer structure 2 and the electrode arrangement E (parameter $kh_1=0.8$).
Figure 52:
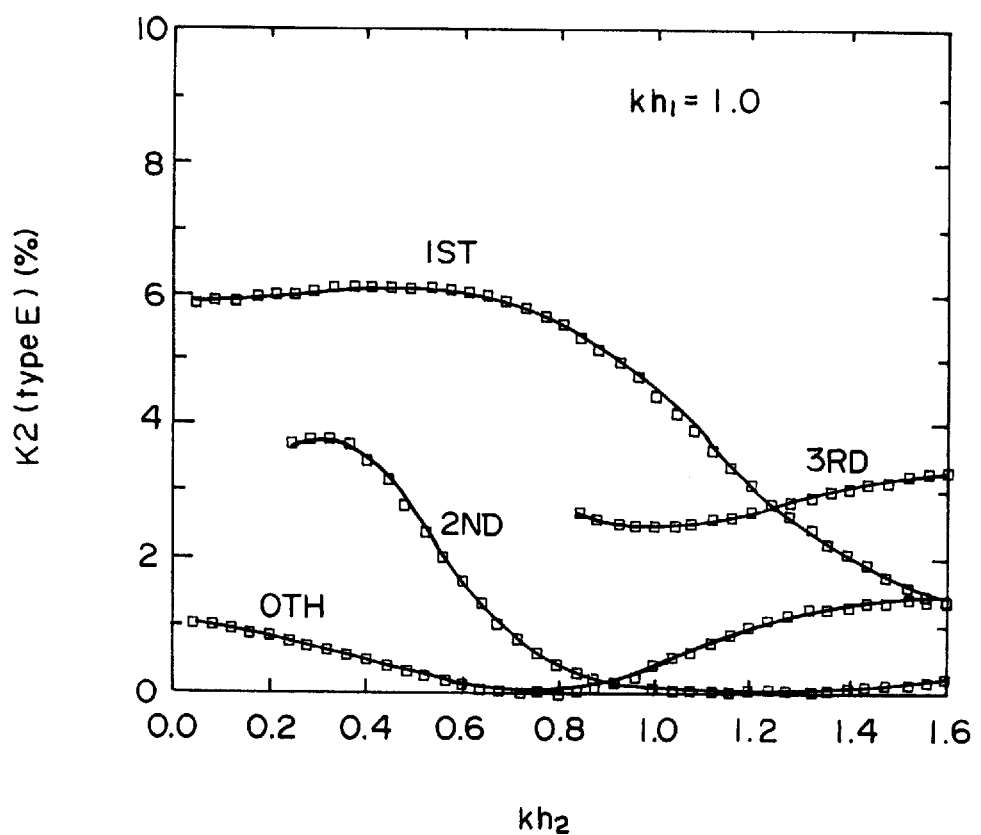
FIG. 52 is a graph showing the relationship between an SAW electromechanical coupling coefficient $K^2$ and the parameter $kh_2$ in an SAW device having the layer structure 2 and the electrode arrangement E (parameter $kh_1=1.0$).
Figure 53:
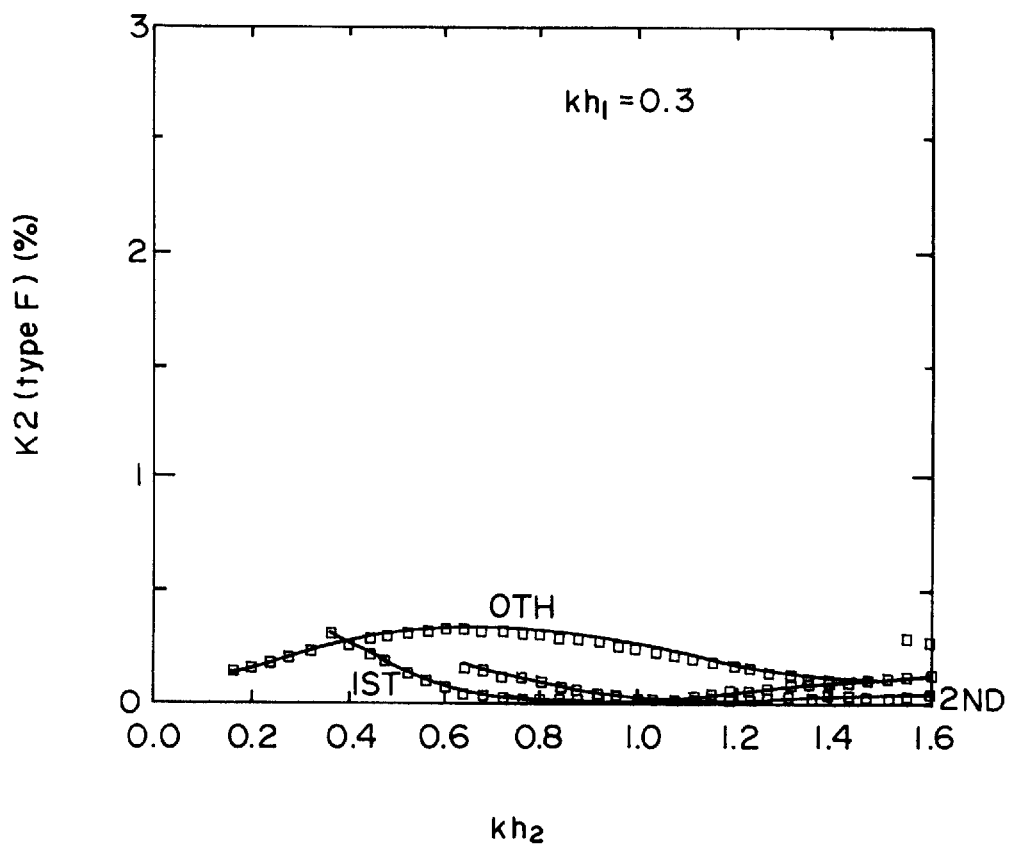
FIG. 53 is a graph showing the relationship between an SAW electromechanical coupling coefficient $K^2$ and the parameter $kh_2$ in an SAW device having the layer structure 2 and the electrode arrangement F (parameter $kh_1=0.3$).
Figure 54:
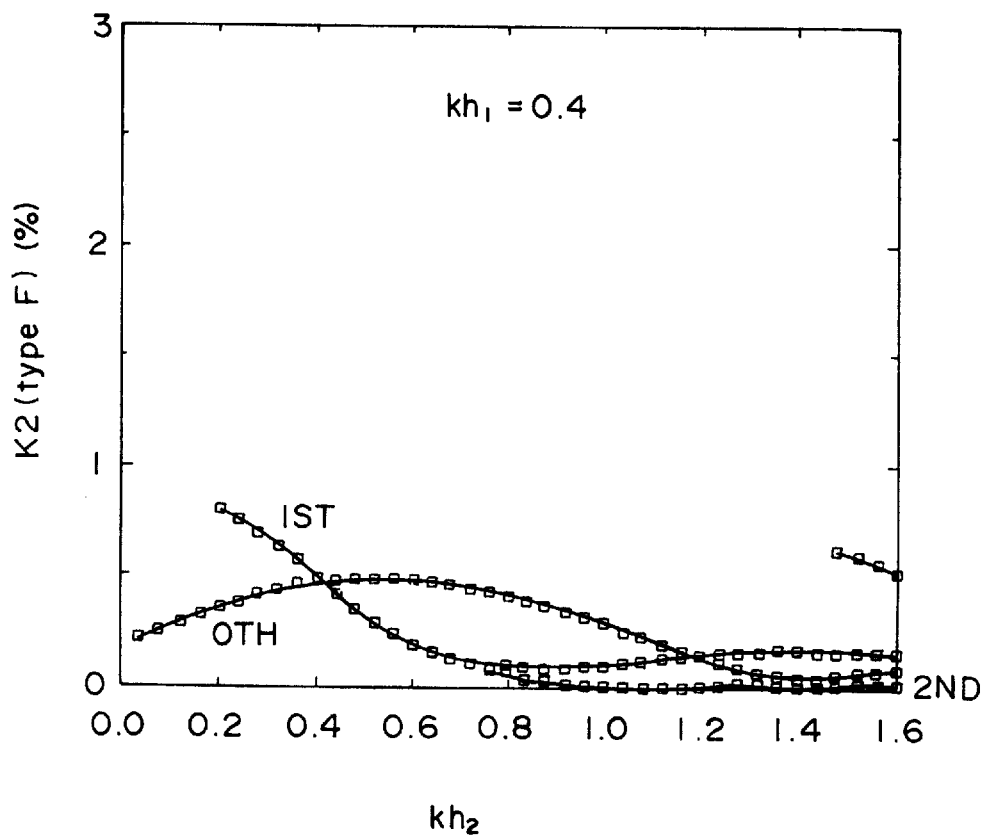
FIG. 54 is a graph showing the relationship between an SAW electromechanical coupling coefficient $K^2$ and the parameter $kh_2$ in an SAW device having the layer structure 2 and the electrode arrangement F (parameter $kh_1=0.4$).
Figure 55:
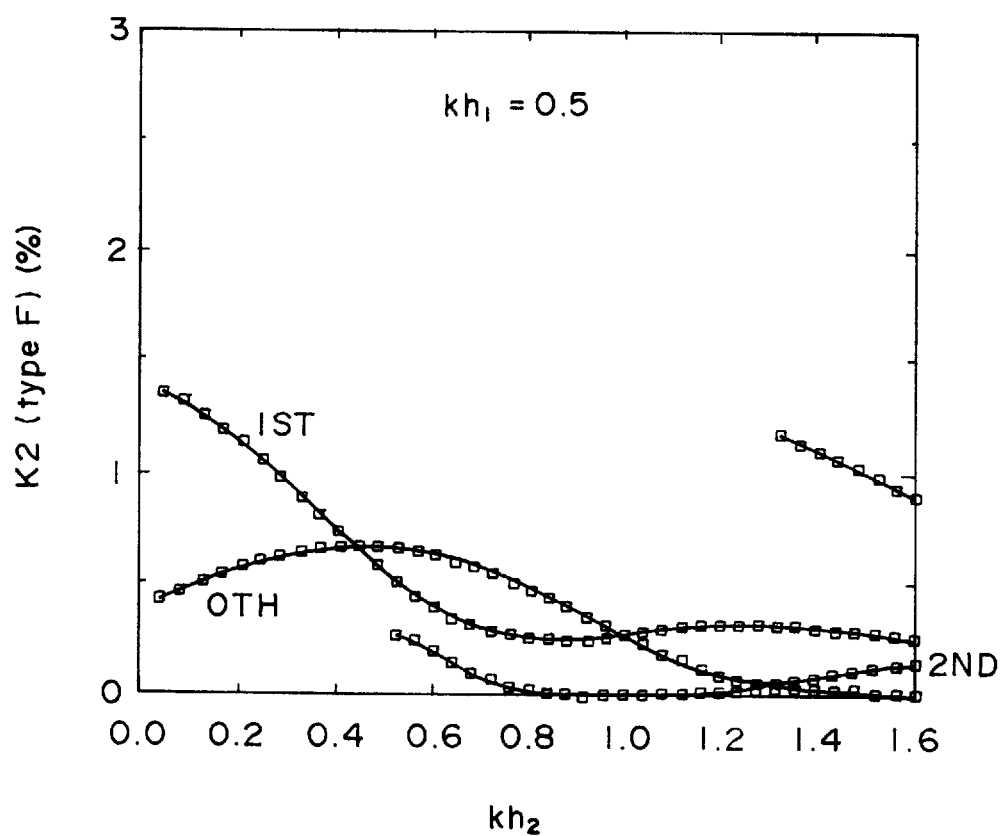
FIG. 55 is a graph showing the relationship between an SAW electromechanical coupling coefficient $K^2$ and the parameter $kh_1$ in an SAW device having the layer structure 2 and the electrode arrangement F (parameter $kh_1=0.5$).
Figure 56:
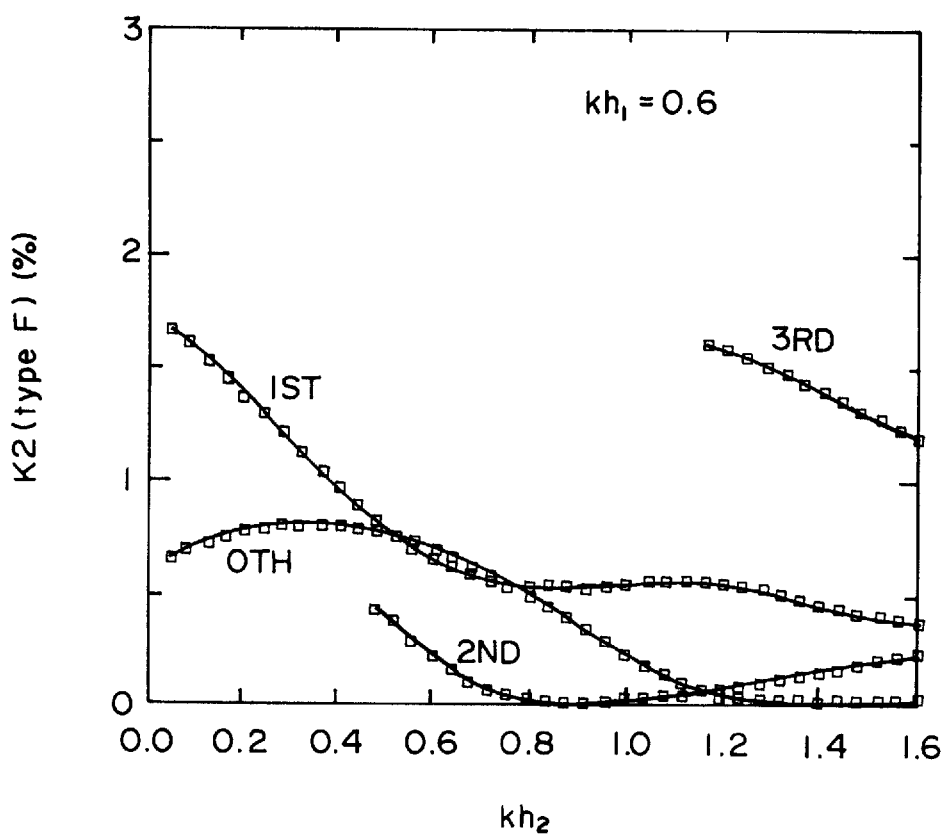
FIG. 56 is a graph showing the relationship between an SAW electromechanical coupling coefficient $K^2$ and the parameter $kh_2$ in an SAW device having the layer structure 2 and the electrode arrangement F (parameter $kh_1=0.6$).
Figure 57:
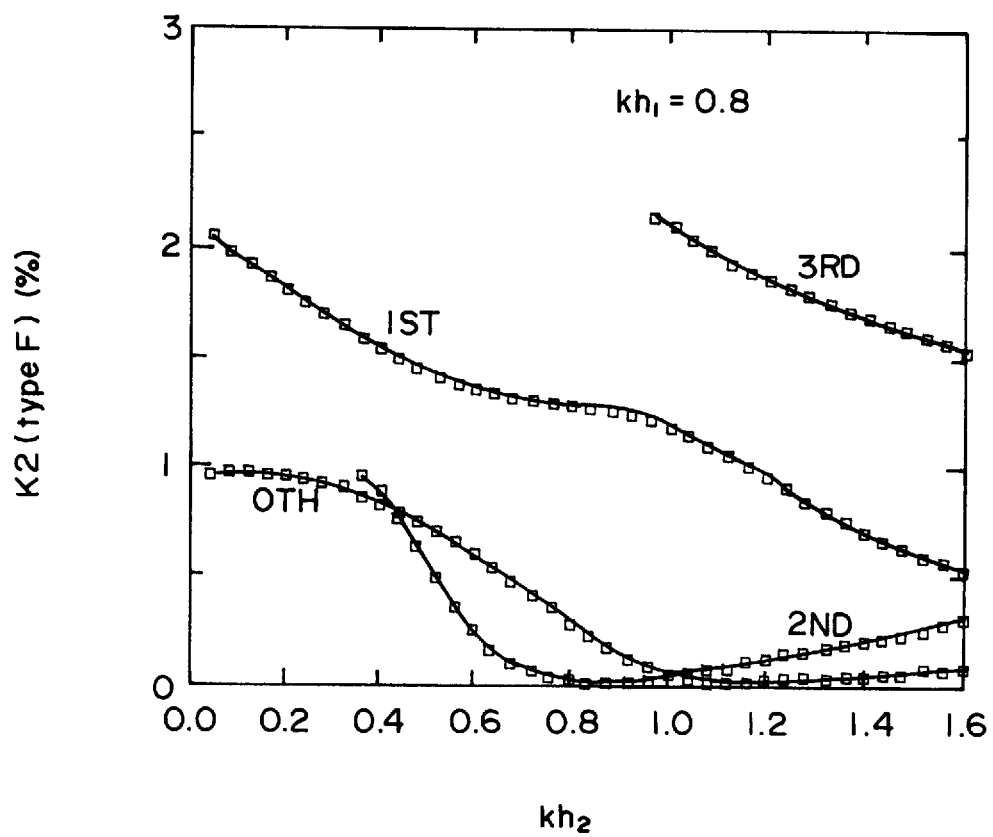
FIG. 57 is a graph showing the relationship between an SAW electromechanical coupling coefficient $K^2$ and the parameter $kh_2$ in an SAW device having the layer structure 2 and the electrode arrangement F (parameter $kh_1=0.8$).
Figure 58:
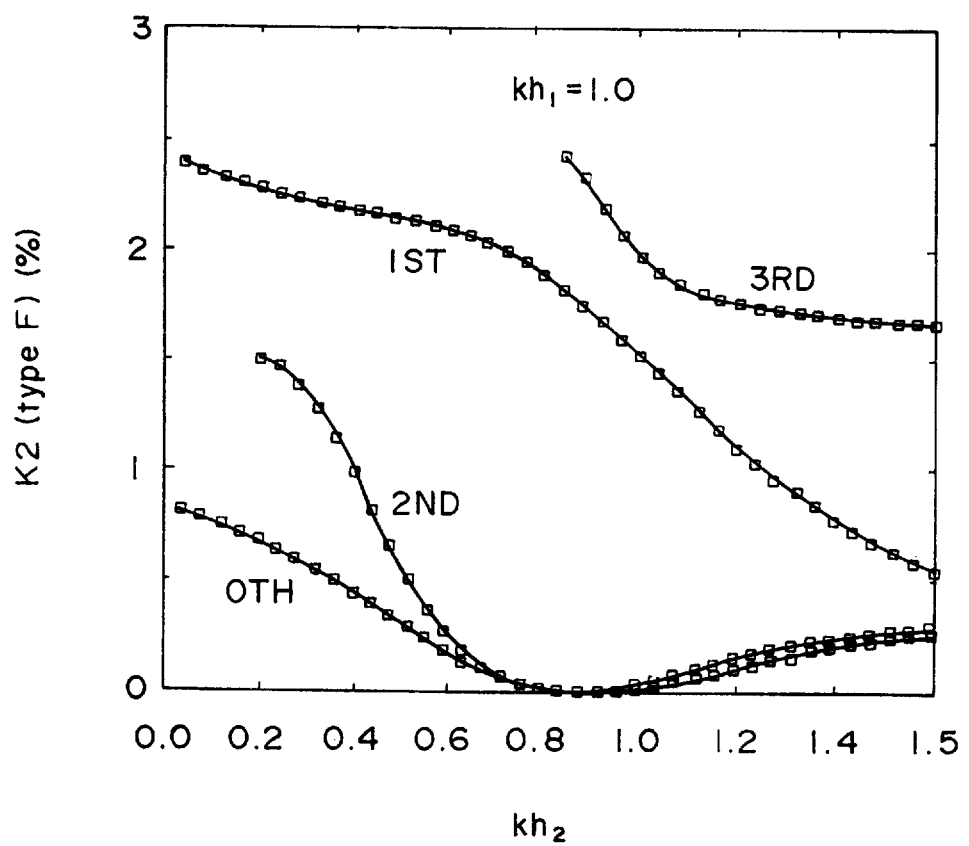
FIG. 58 is a graph showing the relationship between an SAW electromechanical coupling coefficient $K^2$ and the parameter $kh_2$ in an SAW device having the layer structure 2 and the electrode arrangement F (parameter $kh_1=1.0$).
Figure 59:
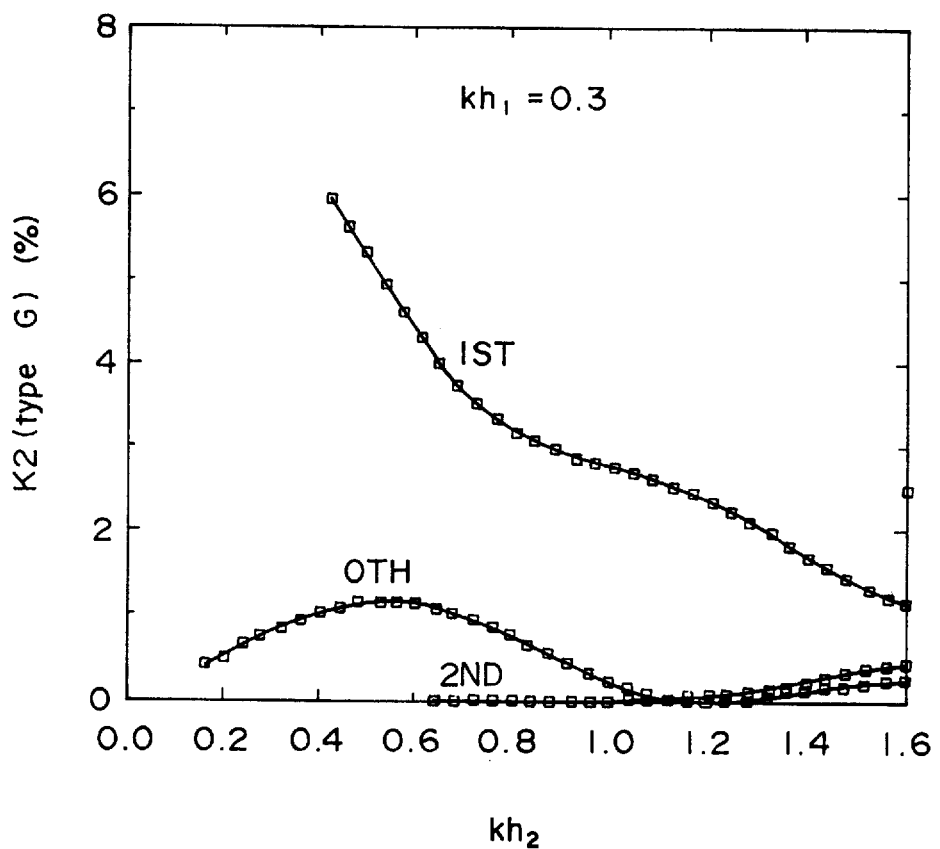
FIG. 59 is a graph showing the relationship between an SAW electromechanical coupling coefficient $K^2$ and the parameter $kh_2$ in an SAW device having the layer structure 2 and the electrode arrangement G (parameter $kh_1=0.3$).
Figure 60:
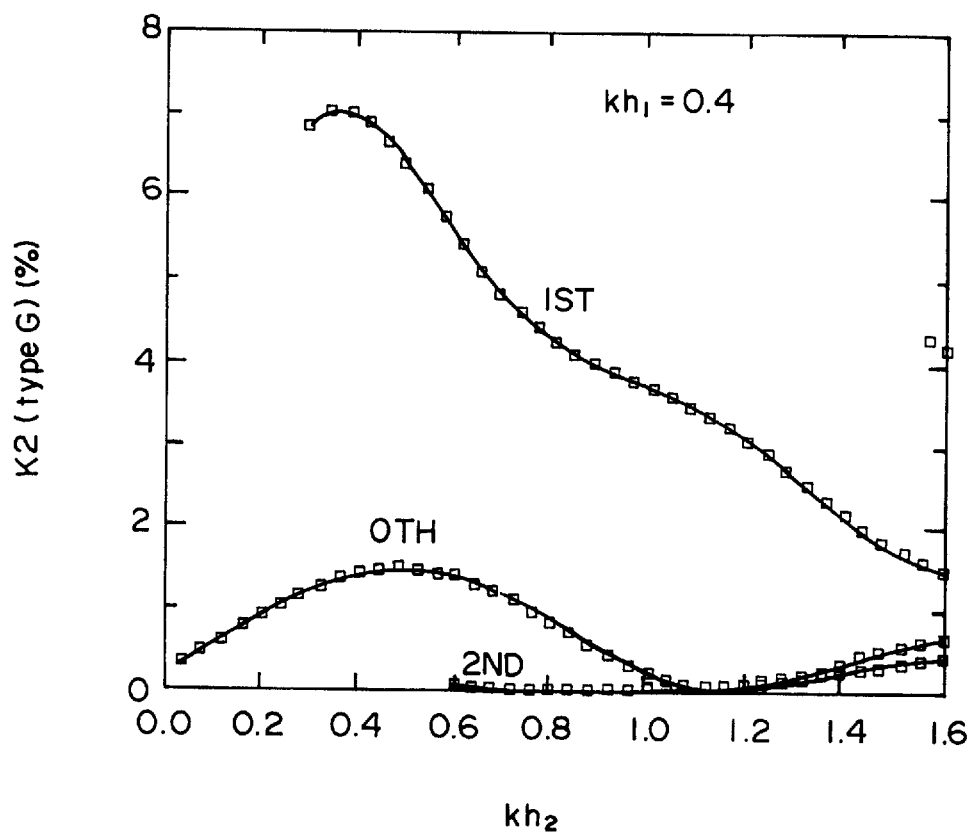
FIG. 60 is a graph showing the relationship between an SAW electromechanical coupling coefficient $K^2$ and the parameter $kh_2$ in an SAW device having the layer structure 2 and the electrode arrangement G (parameter $kh_1=0.4$).
Figure 61:
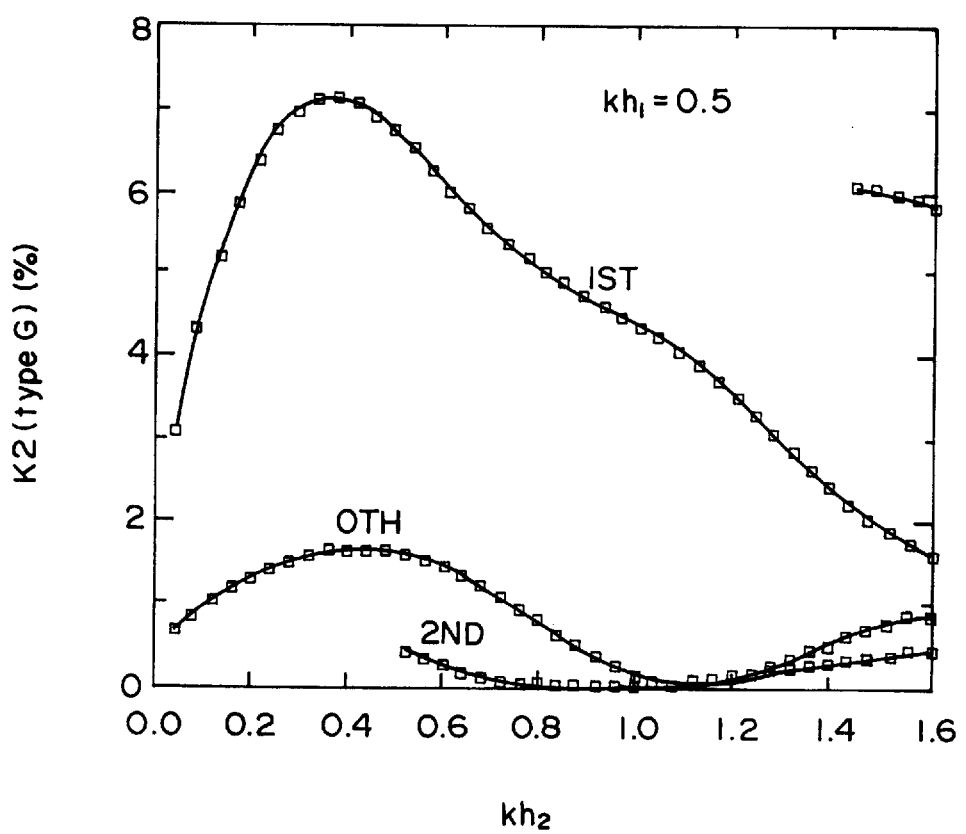
FIG. 61 is a graph showing the relationship between an SAW electromechanical coupling coefficient $K^2$ and the parameter $kh_2$ in an SAW device having the layer structure 2 and the electrode arrangement G (parameter $kh_1=0.5$).
Figure 62:
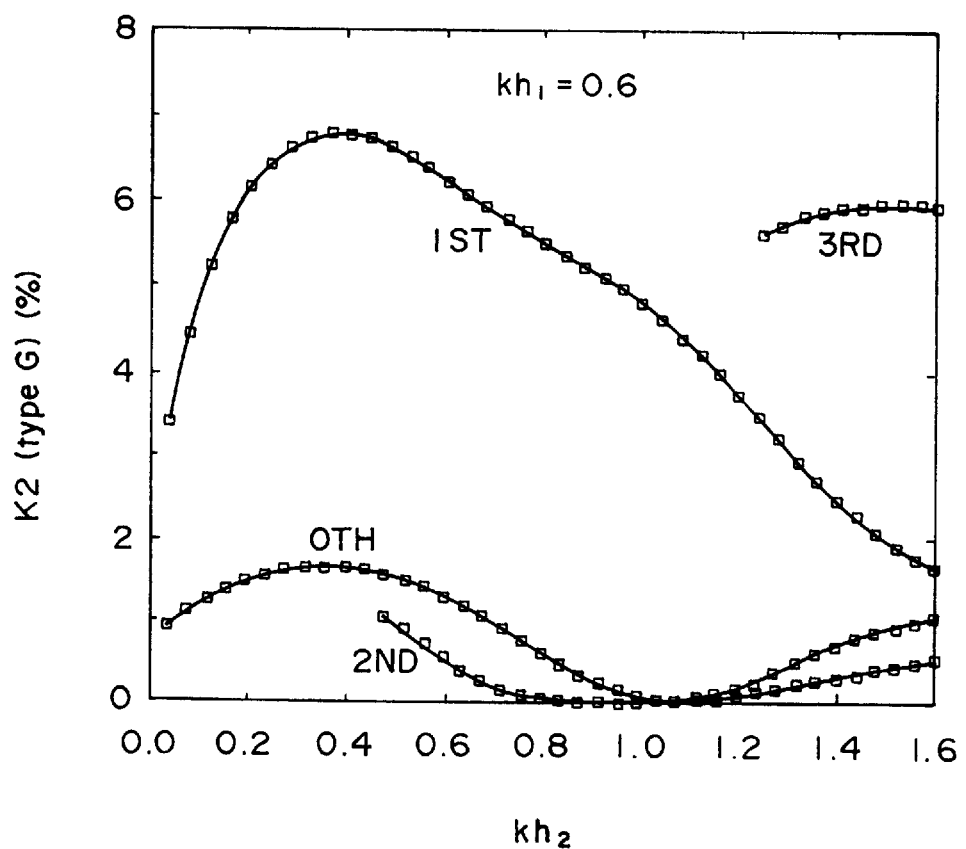
FIG. 62 is a graph showing the relationship between an SAW electro-mechanical coupling coefficient $K^2$ and the parameter $kh_1$ in an SAW device having the layer structure 2 and the electrode arrangement G (parameter $kh_1=0.6$).
Figure 63:
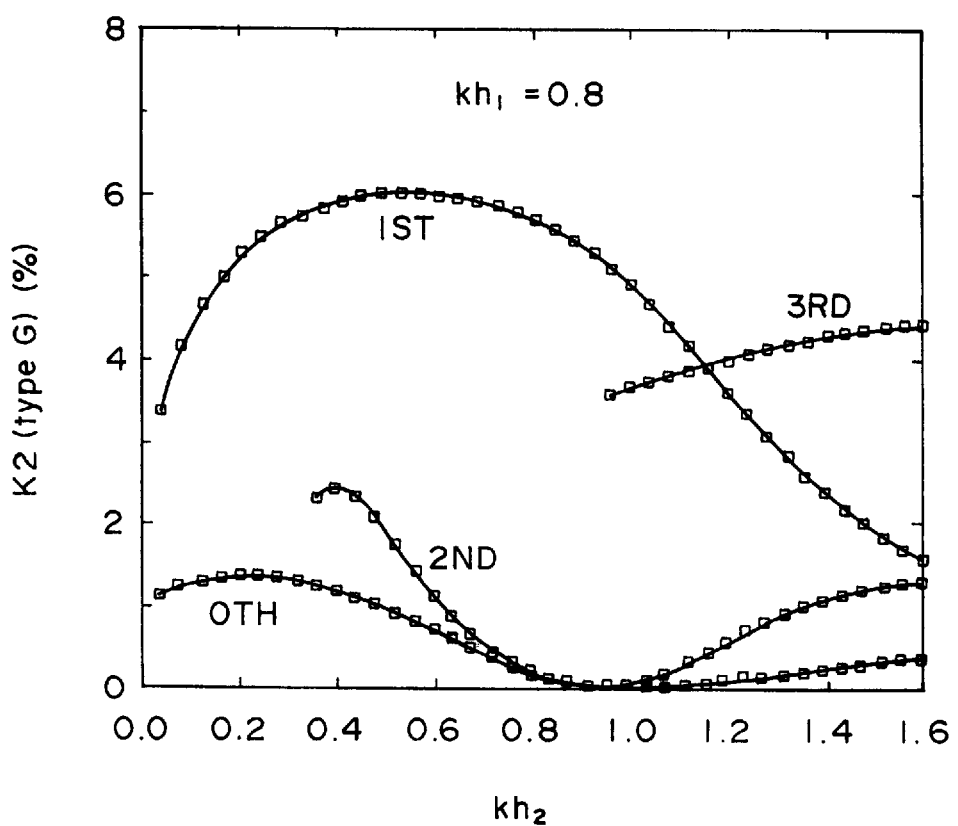
FIG. 63 is a graph showing the relationship between an SAW electromechanical coupling coefficient $K^2$ and the parameter $kh_2$ in an SAW device having the layer structure 2 and the electrode arrangement G parameter $kh_1=0.8$).
Figure 64:
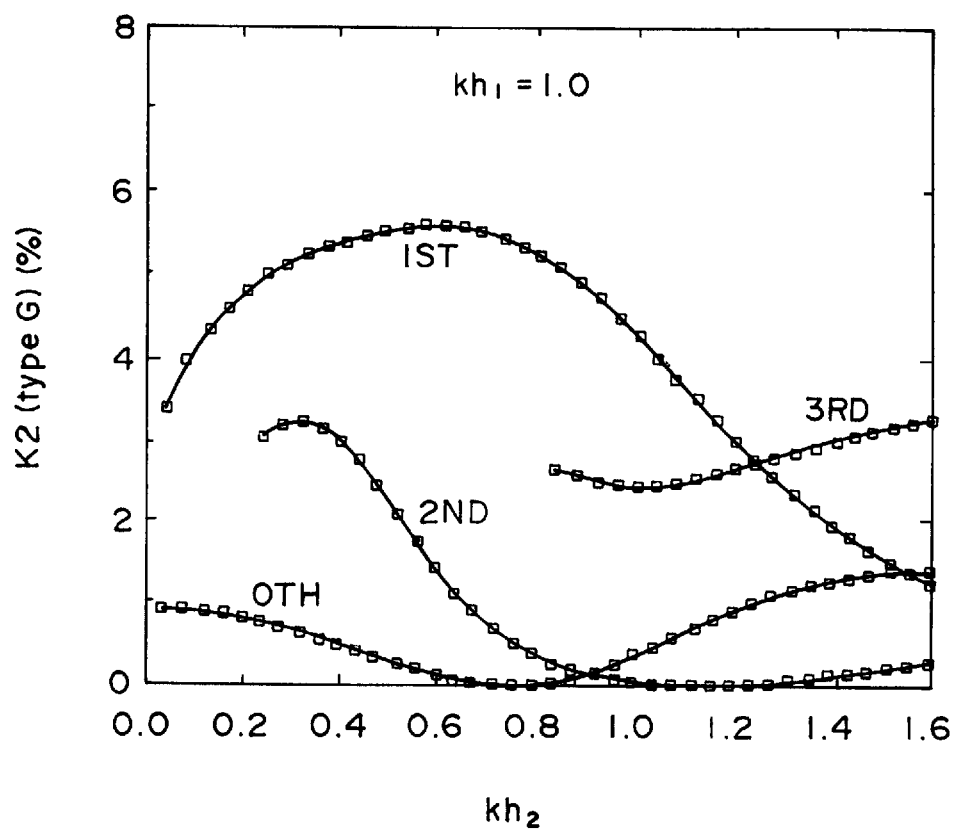
FIG. 64 is a graph showing the relationship between an SAW electro-mechanical coupling coefficient $K^2$ and the parameter $kh_2$ in an SAW device having the layer structure 2 and the electrode arrangement G (parameter $kh_1=1.0$).

For the SAW device obtained in the above manner (FIG. 4, electrode arrangement A), the relation (dependency) between the electromechanical coupling coefficient K$^2$, the parameter kh$_1$, and the parameter kh$_2$ is shown in a graph of FIG. 23 (kh$_1$=0.3), FIG. 24 (kh$_1$=0.4), FIG. 25 (kh$_1$=0.5), FIG. 26 (kh$_1$=0.6), FIG. 27 (kh$_1$=0.8), or FIG. 28 (kh$_1$=1.0).

Similarly, for each of the SAW devices obtained in the above manner (electrode arrangements B to G shown in FIGS. 5 to 10), the relation (dependency) between the electromechanical coupling coefficient K$^2$, the parameter kh$_1$, and the parameter kh$_2$ is shown in graphs of FIGS. 29 to 34 (electrode arrangement B), FIGS. 35 to 40 (electrode arrangement C), FIGS. 41 to 46 (electrode arrangement D), FIGS. 47 to 52 (electrode arrangement E), FIGS. 53 to 58 (electrode arrangement F), or FIGS. 59 to 64 (electrode arrangement G).

(Example 2)

An interdigital transducer (planar shape: double electrode shown in FIG. 2, electrode width d=1 μm, period: 8 μm) having a thickness of 400 Å was formed on the (100) plane of a single-crystal diamond (natural, type Ia). Each LiNbO$_3$ layer (thickness: 0.38 to 1.27 μm, six types) was formed on the interdigital transducer by RF magnetron sputtering.

All of the formed LiNbO$_3$ films were films having a c-axis orientation, and the values σ of X-ray rocking curves were 2° to 3°.

An SiO$_2$ film was formed on the LiNbO$_3$ layer by RF magnetron sputtering, thereby completing an SAW device having the layer structure (film thickness: thickness corresponding to a value obtained by equally dividing a thickness 0.13 to 1.62 μm into 40 portions) shown in FIG. 3A and the electrode arrangement (electrode arrangement E) shown in FIG. 8 (number of electrode pairs of input interdigital transducer: 30, number of electrode pairs of output interdigital transducer: 30, center-to-center distance between the input and output electrodes: 400 μm).

An SAW device having the electrode arrangement A shown in FIG. 4 was manufactured following the same procedures as in the above SAW device except that the order of layer formation was changed. A short-circuit electrode (thickness: 100 Å) was formed on the LiNbO$_3$ layer 2 of the SAW device (electrode arrangement E) by using Al, thereby completing an SAW device having the layer structure (layer structure 1) shown in FIG. 3A and the electrode arrangement F shown in FIG. 9.

SAW devices having the electrode arrangement B shown in FIG. 5, the electrode arrangement C shown in FIG. 6, and the electrode arrangement G shown in FIG. 10 were manufactured following the same procedures as in the above SAW device except that the order of layer formation was changed.

A short-circuit electrode (thickness: 100 Å) was formed on the SiO$_2$ layer of the electrode arrangement B shown in FIG. 5 by using Al, thereby completing an SAW device having the layer structure (layer structure 1) shown in FIG. 3A and the electrode arrangement D shown in FIG. 7.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No. 21598/1995 filed on Feb. 9, 1995 is hereby incorporated by reference.

What is claimed is:

1. A surface acoustic wave device operated at a wavelength of $\lambda$, comprising:
    a diamond,
    a c-axis oriented polycrystalline $LiNbO_3$ layer having a thickness of $t_1$ and being arranged on said diamond, said $LiNbO_3$ layer thickness being represented by $kh_1$, and $kh_1$ being defined as $2\pi(t_1/\lambda)$.
    an interdigital transducer arranged on said $LiNbo_3$ layer, and
    an $SiO_2$ layer having a thickness of $t_2$ and being arranged on said interdigital transducer, said $SiO_2$ layer thickness being represented by $kh_2$. and $kh_1$ being defined as $2\pi(_2/\lambda)$,
    wherein said surface acoustic wave device is used in the 1st mode.

2. The surface acoustic wave device according to claim 1, wherein said $kh_1$ and $kh_2$ of said surface acoustic wave device are within a range of $0.35 \leq kh_1 \leq 0.45$ and $0.3 \leq kh_2 \leq 0.5$ respectively, and said surface acoustic wave device has a propagation velocity of $11,000 \leq V \leq 12,500$ (m/s), an electromechanical coupling coefficient of $8.5 \leq K^2 \leq 10$ (%), and a temperature coefficient of delay time of $-10 \leq TCD \leq 10$ (ppm/°C.).

3. The surface acoustic wave device according to claim 1, wherein said $kh_1$ and $kh_2$ of said surface acoustic wave device are within a range of $0.45 \leq kh_1 \leq 0.55$ and $0.35 \leq kh_2 \leq 0.6$ respectively, and said surface acoustic wave device has a propagation velocity of $10,000 \leq V \leq 11,200$ (m/s), an electromechanical coupling coefficient of $8.8 \leq K^2 \leq 10.5$ (%), and a temperature coefficient of delay time of $-10 \leq TCD \leq 10$ (ppm/°C.).

4. The surface acoustic wave device according to claim 1, wherein said $kh_1$ and $kh_2$ of said surface acoustic wave device are within a range of $0.55 \leq kh_1 \leq 0.65$ and $0.47 \leq kh_2 \leq 0.73$ respectively, and said surface acoustic wave device has a propagation velocity of $9,000 \leq V \leq 10,000$ (m/s), an electro-mechanical coupling coefficient of $8.5 \leq K^2 \leq 9.8$ (%), and a temperature coefficient of delay time of $-10 \leq TCD \leq 10$ (ppm/°C.).

5. The surface acoustic wave device according to claim 1, wherein said $kh_1$ and $kh_2$ of said surface acoustic wave device are within a range of $0.65 \leq kh_1 \leq 0.8$ and $0.7 \leq kh_2 \leq 0.8$ respectively, and said surface acoustic wave device has a propagation velocity of $8,000 \leq V \leq 9,000$ (m/s), an electromechanical coupling coefficient of $8 \leq K^2 \leq 8.5$ (%), and a temperature coefficient of delay time of $-10 \leq TCD \leq 10$ (ppm/°C.).

6. A surface acoustic wave device operated at a wavelength of $\lambda$, comprising:
    a diamond,
    a c-axis oriented polycrystalline $LiNbO_3$ layer having a thickness of $t_1$ and being arranged on said diamond, said $LiNbO_3$ layer thickness being represented by $kh_1$, and $kh_1$ being defined as $2\pi(t_1/\lambda)$,
    an interdigital transducer arranged on said $LiNbO_3$ layer, and
    an $SiO_2$ layer having a thickness of $t_2$ and being arranged on said interdigital transducer, said $SiO_2$ layer thickness being represented bv $kh_2$, and $kh_2$ being defined as $2\pi(t_2/\lambda)$,
    wherein said surface acoustic wave device is used in the 2nd mode, said $kh_1$ and $kh_2$ of said surface acoustic wave device are within a range of $0.8 \leq kh^1 \leq 1.0$ and $0.35 \leq kh_2 \leq 0.55$ respectively, and said surface acoustic wave device has a propagation velocity of $11,200 \leq V \leq 12,500$ (m/s), an electromechanical coupling coefficient of $2 \leq K^2 \leq 4$ (%), and a temperature coefficient of delay time of $-10 \leq TCD \leq 10$ (ppm/°C.).

7. A surface acoustic wave device operated at a wavelength of $\lambda$, comprising:
    a diamond,
    a c-axis oriented polycrystalline $LiNbO_3$ layer having a thickness of $t_1$ and being arranged on said diamond, said $LiNbo_3$ layer thickness being represented by $kh_1$, and $kh_1$ being defined as $2\pi(t_1/\lambda)$,
    an interdigital transducer arranged on said $LiNbo_3$ layer,
    an $SiO_2$ layer having a thickness of $t_2$ and being arranged on said interdigital transducer, said $SiO_2$ layer thickness being represented by $kh_2$, and $kh_2$ being defined as $2\pi(t_2/\lambda)$, and
    a short circuit electrode arranged on said $SiO_2$ layer, wherein said surface acoustic wave device is used in the 1st mode.

8. The surface acoustic wave device according to claim 7, wherein said $kh_1$ and $kh_2$ of said surface acoustic wave device are within a range of $0.35 \leq kh, \leq 0.45$ and $0.3 \leq kh_2 \leq 0.5$ respectively, and said surface acoustic wave device has a propagation velocity of $11,000 \leq V \leq 12,500$ (m/s), an electromechanical coupling coefficient of $7.5 \leq K^2 \leq 8.0$ (%), and a temperature coefficient of delay time of $-10 \leq TCD \leq 10$ (ppm/°C.).

9. The surface acoustic wave device according to claim 7, wherein said $kh_1$ and $kh_2$ of said surface acoustic wave device are within a range of $0.45 \leq kh_1 \leq 0.55$ and $0.35 \leq kh_2 \leq 0.6$ respectively, and said surface acoustic wave device has a propagation velocity of $10,000 \leq V \leq 11,200$ (m/s), an electromechanical coupling coefficient of $7.8 \leq K^2 \leq 8.3$ (%), and a temperature coefficient of delay time of $-10 \leq TCD \leq 10$ (ppm/°C.).

10. The surface acoustic wave device according to claim 7, said $kh_1$ and $kh_2$ are within a range of $0.55 \leq kh_1 \leq 0.65$ and $0.47 \leq kh_2 \leq 0.73$ respectively, and said surface acoustic wave device has a propagation velocity of $9,000 \leq V \leq 10,000$ (m/s), an electromechanical coupling coefficient of $7.8 \leq K^2 \leq 8.3$ (%), and a temperature coefficient of delay time of $-10 \leq TCD \leq 10$ (ppm/°C.).

11. The surface acoustic wave device according to claim 7, wherein said $kh_1$ and $kh_2$ are within a range of $0.65 \leq kh_1 \leq 0.8$ and $0.7 \leq kh_2 \leq 0.8$ respectively, and said surface acoustic wave device has a propagation velocity of $8,000 \leq V \leq 9,000$ (m/s), an electromechanical coupling coefficient of $7.5 \leq K^2 \leq 8.0$ (%), and a temperature coefficient of delay time of $-10 \leq TCD \leq 10$ (ppm/°C.).

12. A surface acoustic wave device operated at a wavelength of $\lambda$, comprising:
    a diamond,
    an interdigital transducer arranged on said diamond,
    a c-axis oriented polycrystalline $LiNbO_3$ layer having a thickness of $t_1$ and being arranged on said interdigital transducer, said $LiNbO_3$ layer thickness being represented by $kh_1$, and $kh_1$ being defined as $2\pi(t_2/\lambda)$,
    an $SiO_2$ layer having a thickness of $t_2$ and being arranged on said $LiNbO_3$ layer, said $SiO_2$ layer thickness being represented by $kh_2$, and $kh_2$ being defined as $2\pi(t_2/\lambda)$,
    wherein said surface acoustic wave device is used in the 1st mode.

13. The surface acoustic wave device according to claim 12, wherein said $kh_1$ and $kh_2$ of said surface acoustic wave device are within a range of $0.35 \leq kh_1 \leq 0.45$ and $0.3 \leq kh_2 \leq 0.5$ respectively, and said surface acoustic wave device has a propagation velocity of $11,000 \leq V \leq 12,500$ (m/s), an electro-mechanical coupling coefficient of $7.5 \leq K^2 \leq 9.5$ (%), and a temperature coefficient of delay time of $-10 \leq TCD \leq 10$ (ppm/°C.).

14. The surface acoustic wave device according to claim 12, wherein said $kh_1$ and $kh_1$ of said surface acoustic wave device are within a range of $0.45 \leq kh_1 \leq 0.55$ and $0.35 \leq kh_2 \leq 0.6$ respectively, and said surface acoustic wave device has a propagation velocity of $10,000 \leq V \leq 11,200$ (m/s), an electro-mechanical coupling coefficient of $7 \leq K^2 \leq 9$ (%) and a temperature coefficient of delay time of $-10 \leq TCD \leq 10$ (ppm/°C.).

15. The surface acoustic wave device according to claim 12, wherein said $kh_1$ and $kh_1$ of said surface acoustic wave device are within a range of $0.55 \leq kh_1 \leq 0.65$ and $0.47 \leq kh_2 \leq 0.73$ respectively, and said surface acoustic wave device has a propagation velocity of $9,000 \leq V \leq 10,000$ (m/s), an electromechanical coupling coefficient of $6.2 \leq K^2 \leq 8$ (%), and a temperature coefficient of delay time of $-10 \leq TCD \leq 10$ (ppm/°C.).

16. The surface acoustic wave device according to claim 12, wherein said $kh_1$ and $kh_2$ of said surface acoustic wave device are within a range of $0.65 \leq kh_1 \leq 0.8$ and $0.7 \leq kh_2 \leq 0.8$ respectively, and said surface acoustic wave device has a propagation velocity of $8,000 \leq V \leq 9,000$ (m/s), an electromechanical coupling coefficient of $6 \leq K^2 \leq 6.3$ (%), and a temperature coefficient of delay time of $-10 \leq TCD \leq 10$ (ppm/°C.).

17. A surface acoustic wave device operated at a wavelength of $\lambda$, comprising:

a diamond, an interdigital transducer arranged on said diamond, a c-axis oriented polycrystalline $LiNbO_3$ layer having a thickness of $t_1$ and being arranged on said interdigital transducer, said $LiNbO_3$ layer thickness being represented by $kh_1$, and $kh_1$ being defined as $2\pi(t_1/\lambda)$, an $SiO_2$ layer having a thickness of $t_2$ and being arranged on said $LiNbO_3$, said $SiO_2$ layer thickness being represented by $kh_2$, and $kh_2$ being defined as $2\pi(t_2/\lambda)$, and a short circuit electrode arranged on said $SiO_2$ layer, wherein said surface acoustic wave device is used in the 1st mode.

18. The surface acoustic wave device according to claim 17, wherein said $kh_1$ and $kh_2$ of said surface acoustic wave device are within a range of $0.35 \leq kh_1 \leq 0.45$ and $0.3 \leq kh_2 \pm 0.5$ respectively, and said surface acoustic wave device has a propagation velocity of $11,000 \leq V \leq 12,500$ (m/s), an electromechanical coupling coefficient of $6.2 \leq K^2 \leq 7.0$ (%), and a temperature coefficient of delay time of $-10 \leq TCD \leq 10$ (ppm/°C.).

19. The surface acoustic wave device according to claim 17, wherein said $kh_1$ and $kh_2$ of said surface acoustic wave device are within a range of $0.45 \leq kh_1 \leq 0.55$ and $0.35 \leq kh_2 \leq 0.6$ respectively, and said surface acoustic wave device has a propagation velocity of $11,000 \leq V \leq 11,200$ (m/s), an electromechanical coupling coefficient of $6 \leq K^2 \leq 7.2$ (%), and a temperature coefficient of delay time of $-10 \leq TCD \leq 10$ (ppm/°C.).

20. The surface acoustic wave device according to claim 18, wherein said $kh_1$ and $kh_2$ of said surface acoustic wave device are within a range of $0.55 \leq kh_1 \leq 0.65$ and $0.47 \leq kh_2 \leq 0.73$ respectively, and said surface acoustic wave device has a propagation velocity of $9,000 \leq V \leq 10,000$ (m/s), an electromechanical coupling coefficient of $5.6 \leq K^2 \leq 6.6$ (%), and a temperature coefficient of delay time of $-10 \leq TCD \leq 10$ (ppm/°C.).

21. The surface acoustic wave device according to claim 17, wherein said $kh_1$ and $kh_2$ of said surface acoustic wave device are within a range of $0.65 \leq kh_1 \leq 0.8$ and $0.7 \leq kh_2 \leq 0.8$ respectively, and said surface acoustic wave device has a propagation velocity of $8,000 \leq V \leq 9,000$ (m/s), an electromechanical coupling coefficient of $5.6 \leq K^2 \leq 5.8$ (*), and a temperature coefficient of delay time of $-10 \leq TCL \leq 10$, (ppm/°C.).

* * * * *